US006747910B2

(12) United States Patent
Tsuji

(10) Patent No.: US 6,747,910 B2
(45) Date of Patent: Jun. 8, 2004

(54) THIN FILM MAGNETIC MEMORY DEVICE FOR SELECTIVELY SUPPLYING A DESIRED DATA WRITE CURRENT TO A PLURALITY OF MEMORY BLOCKS

(75) Inventor: Takaharu Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/334,713

(22) Filed: Jan. 2, 2003

(65) Prior Publication Data
US 2003/0147274 A1 Aug. 7, 2003

(30) Foreign Application Priority Data

Feb. 4, 2002 (JP) ........................ 2002-026945
Jul. 16, 2002 (JP) ........................ 2002-207044

(51) Int. Cl.$^7$ .............................................. G11C 8/00
(52) U.S. Cl. .............. 365/230.06; 365/177; 365/230.03
(58) Field of Search ........................... 365/171, 230.07, 365/230.06, 230.03, 243.5, 230.09

(56) References Cited

U.S. PATENT DOCUMENTS

| 6,272,041 | B1 | 8/2001 | Naji | 365/171 |
| 6,618,317 | B1 * | 9/2003 | Tsuji et al. | 365/230.07 |
| 6,646,911 | B2 * | 11/2003 | Hidaka | 365/173 |
| 6,671,213 | B2 * | 12/2003 | Ohtani | 365/200 |

OTHER PUBLICATIONS

"A 10ns Read and Write Non–Volatile Memory Array Using a Magnetic Tunnel Junction and FET Switch in Each Cell", Scheuerlein et al., ISSCC Digest of Technical Papers, TA7.2, Feb. 2000, pp. 94–95, 128–129, 409–410.
"Nonvolatile RAM based on Magnetic Tunnel Juction Elements", Durlam et al., ISSCC Digest of Technical Papers, TA 7.3, Feb. 2000, pp. 96–97, 130–131, 410–411.
"A 256kb 3.0V 1T1MTJ Nonvolatile Magnetoresistive RAM", Naji et al., ISSCC Digest of Technical Papers, TA 7.6, Feb. 2001, pp. 94–95, 122–123, 404–405, 438.

* cited by examiner

Primary Examiner—Richard Elms
Assistant Examiner—Hien Nguyen
(74) Attorney, Agent, or Firm—McDermott, Will & Emery

(57) ABSTRACT

Each of N memory blocks of first to $N^{th}$ stages includes a plurality of first and second driver units. The plurality of first and second driver units are respectively provided corresponding to one end and another end of a plurality of digit lines included in each memory block. Each of the first driver units in memory blocks before a selected memory block connects a corresponding digit line to a first voltage according to a voltage level on a digit line of the same row in a memory block of a previous stage. A second driver unit in the selected memory block connects a corresponding digit line to a second voltage in order to supply a data write current. In other words, digit lines in the memory blocks before the selected memory block are not used as current lines but as signal lines.

20 Claims, 47 Drawing Sheets

FIG.3

| SELECTED MEMORY BLOCK | DLBS | | | | | | DLDE | | | | | |
|---|---|---|---|---|---|---|---|---|---|---|---|---|
| | 0 | 1 | 2 | 3 | ... | n-1 | 1 | 2 | 3 | ... | n-1 | n |
| MB0 | H | L | L | L | ... | L | H | H | H | ... | H | H |
| MB1 | H | H | L | L | ... | L | L | H | H | ... | H | H |
| MB2 | H | H | H | L | ... | L | L | L | H | ... | H | H |
| MB3 | H | H | H | H | ... | L | L | L | L | ... | H | H |
| ... | | | | | | | | | | | | |
| MBn-1 | H | H | H | H | ... | H | L | L | L | ... | L | H |

FIG.6

| SELECTED MEMORY BLOCK | DLBS | | | | | | DLDE | | | | | |
|---|---|---|---|---|---|---|---|---|---|---|---|---|
| | 0 | 1 | 2 | 3 | ... | n-1 | 1 | 2 | 3 | ... | n-1 | n |
| MB0 | H | H | H | H | ... | H | L | L | L | ... | L | L |
| MB1 | H | H | H | H | ... | H | L | L | L | ... | L | L |
| MB2 | H | H | H | H | ... | H | L | L | L | ... | L | L |
| MB3 | H | H | H | H | ... | H | L | L | L | ... | L | L |
| ... | | | | | | | | | | | | |
| MBn-1 | H | H | H | H | ... | H | L | L | L | ... | L | L |

FIG.14

| SELECTED MEMORY BLOCK | DLBS | | | | | | DLDE | | | | | | WLBS | | | | | |
|---|---|---|---|---|---|---|---|---|---|---|---|---|---|---|---|---|---|---|
| | 0 | 1 | 2 | 3 | ... | n-1 | 1 | 2 | 3 | ... | n-1 | n | 0 | 1 | 2 | 3 | ... | n-1 |
| MB0 | L | L | L | L | ... | L | L | L | L | ... | L | L | H | L | L | L | ... | L |
| MB1 | H | H | L | L | ... | L | L | L | L | ... | L | L | L | H | L | L | ... | L |
| MB2 | H | H | H | L | ... | L | L | L | L | ... | L | L | L | L | H | L | ... | L |
| MB3 | H | H | H | H | ... | L | L | L | L | ... | L | L | L | L | L | H | ... | L |
| ... | | | | | | | | | | | | | | | | | | |
| MBn-1 | H | H | H | H | ... | H | L | L | L | ... | L | L | L | L | L | L | ... | H |

FIG.17

| TEST MODE | DLBS | | | | | DLDE | | | | |
|---|---|---|---|---|---|---|---|---|---|---|
| | 0 | 1 | 2 | 3 | ... | n-1 | 1 | 2 | 3 | ... | n-1 | n |
| | H | H | H | H | ... | H | L | L | L | ... | L | L |

US 6,747,910 B2

THIN FILM MAGNETIC MEMORY DEVICE FOR SELECTIVELY SUPPLYING A DESIRED DATA WRITE CURRENT TO A PLURALITY OF MEMORY BLOCKS

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of tunneling magneto-resistance elements (i.e., thin film magnetic elements having a magnetic tunnel junction (MTJ)) in memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 44 schematically shows the structure of a memory cell having a magnetic tunnel junction (hereinafter, sometimes simply referred to as "MTJ memory cell").

Referring to FIG. 44, the MTJ memory cell includes a tunneling magneto-resistance element TMR having an electric resistance varying according to the storage data level, and an access element ATR for forming a path of a sense current Is flowing through tunneling magneto-resistance element TMR in data read operation. Since a field effect transistor is typically used as access transistor ATR, access element ATR is hereinafter sometimes referred to as access transistor ATR. Access transistor ATR is connected in series with tunneling magneto-resistance element TMR.

A digit line DL for data write operation, a word line WL for data read operation, and a bit line BL are provided for the MTJ memory cell. Bit line BL is a data line for transmitting an electric signal corresponding to the storage data level in data read and write operations.

FIG. 45 is a conceptual diagram illustrating data read operation from the MTJ memory cell.

Referring to FIG. 45, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction according to an external magnetic field (hereinafter, sometimes simply referred to as "free magnetic layer"). A tunneling barrier (tunneling film) TB of an insulator film is interposed between fixed magnetic layer FL and free magnetic layer VL. Free magnetic layer VL is magnetized either in the same (parallel) direction as, or in the opposite (antiparallel) direction to, that of fixed magnetic layer FL according to the write data level. Fixed magnetic layer FL, tunneling barrier TB and free magnetic layer VL form a magnetic tunnel junction.

In data read operation, access transistor ATR is turned ON in response to activation of word line WL, and tunneling magneto-resistance element TMR is connected between bit line BL and ground voltage GND. As a result, a bias voltage according to a bit line voltage is applied across tunneling magneto-resistance element TMR, and a tunneling current is supplied to the tunneling film. The use of such a tunneling current enables a sense current to be supplied to a current path formed by bit line BL, tunneling magneto-resistance element TMR, access transistor ATR and ground voltage GND in data read operation.

The electric resistance of tunneling magneto-resistance element TMR varies according to the relation of the magnetization direction between fixed magnetic layer FL and free magnetic layer VL. More specifically, tunneling magneto-resistance element TMR has a minimum electric resistance value Rmin when fixed magnetic layer FL and free magnetic layer VL have parallel magnetization directions, and has a maximum electric resistance value Rmax when they have opposite (antiparallel) magnetization directions.

Accordingly, provided that free magnetic layer VL is magnetized in the direction according to the storage data level, a voltage change caused by sense current Is at tunneling magneto-resistance element TMR varies depending on the storage data level. For example, by supplying sense current Is to tunneling magneto-resistance element TMR after precharging bit line BL to a prescribed voltage, the storage data in the MTJ memory cell can be read by sensing a voltage on bit line BL.

FIG. 46 is a conceptual diagram illustrating data write operation to the MTJ memory cell.

Referring to FIG. 46, in data write operation, word line WL is inactivated and access transistor ATR is turned OFF. In this state, a data write current is applied to digit line DL and bit line BL in order to magnetize free magnetic layer VL in the direction according to the write data.

FIG. 47 is a conceptual diagram illustrating the relation between the data write current and the magnetization direction of the tunneling magneto-resistance element in data write operation.

Referring to FIG. 47, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic field H(EA) corresponds to one of two magnetic fields produced by the currents flowing through bit line BL and digit line DL, and magnetic field H(EA) corresponds to the other magnetic field.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing 1-bit data ("1" and "0") by using the two magnetization directions of free magnetic layer VL.

The magnetization direction of free magnetic layer VL is rewritable only when the sum of the applied magnetic fields H(EA), H(HA) reaches the region outside the asteroid characteristic line shown in the figure. In other words, the magnetization direction of free magnetic layer VL will not change if an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis.

When the operation point of the data write operation is designed as in the example of FIG. 47, a data write magnetic field of the easy-axis direction is designed to have strength $H_{WR}$ in the MTJ memory cell to be written. In other words, the data write current to be applied to bit line BL or digit line DL is designed to produce such a data write magnetic field $H_{WR}$. In general, data write magnetic field $H_{WR}$ is defined by the sum of a switching magnetic field $H_{SW}$ required to switch the magnetization direction and a margin $\Delta H$. Data write magnetic field $H_{WR}$ is thus defined by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both digit line DL and bit line BL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

The electric resistance of tunneling magneto-resistance element TMR thus varies according to the magnetization direction that is rewritable by an applied data write magnetic field. Therefore, non-volatile data storage can be conducted by correlating electric resistance values Rmax, Rmin of tunneling magneto-resistance element TMR with the storage data levels ("1" and "0").

FIG. 48 shows the overall structure of an MRAM device 10 integrating MTJ memory cells MC arranged in a matrix.

Referring to FIG. 48, MRAM device 10 has N memory blocks MB0 to MBn−1 (where n is a natural number). Hereinafter, memory blocks MB0 to MBn−1 are sometimes generally referred to as memory blocks MB.

Each memory block MB includes word lines WL and digit lines DL provided corresponding to memory cell rows, and bit lines BL provided corresponding to memory cell columns.

In the case of a large-capacity memory array, a memory array including MTJ memory cells MC arranged in a matrix is commonly divided into a plurality of memory blocks according to functions and applications.

In the case where a memory array is divided into a plurality of memory blocks, a DL/WL driver band for driving a digit line and the like must be provided for each memory block MB. Moreover, a row decoder 110 must be provided for each DL/WL driver band in order to control the respective DL/WL driver band.

FIG. 49 is a conceptual diagram of row selection circuitry having a row decoder 110 for each DL/WL driver band.

Memory blocks MB0, MB1 will be exemplarily described herein. Since the other memory blocks MB2 to MBn−1 have the same structure as that of memory blocks MB0, MB1, description thereof will not be repeated.

Referring to FIG. 49, DL/WL driver bands DWG0, DWG1 corresponding to memory blocks MB0, MB1 respectively include digit line drivers DLD0, DLD1 for controlling supply of a data write current to each digit line DL. Row decoder 110 is provided for each memory block MB.

Row decoder 110 outputs a signal indicating the row selection result based on a row address RA and a write enable WE. A digit line DL in memory block MB0 is selectively activated in response to the output signal of a corresponding row decoder 110 and a block selection signal DLBS0. Block selection signal DLBS0 is a signal for selecting memory block MB0. Similarly, a digit line DL in memory block MB1 is selectively activated in response to the output signal of a corresponding row decoder 110 and a block selection signal DLBS1.

In the above structure, row decoder 110 must be provided for each DL/WL driver band. Therefore, the above structure requires the area for the row decoders, thereby increasing the overall area of the MRAM device.

As described above, data write operation from MTJ memory cell MC is conducted according to two magnetic fields generated by currents flowing through bit line BL and digit line DL. In other words, in order to write data to a selected memory cell, a current is supplied to a selected digit line DL and a selected bit line BL. In this case, a leak magnetic field is applied to a digit line adjacent to selected digit line DL. Theoretically, a magnetic field corresponding to the region inside the asteroid characteristic line in FIG. 47 is applied to an adjacent memory cell corresponding to the adjacent digit line and selected bit line BL. Therefore, a normal memory cell having strong disturb characteristics is not subjected to erroneous writing, but a memory cell having weak disturb characteristics may possibly be subjected to erroneous writing. It is therefore necessary to remove defective memory cells having weak disturb characteristics in advance.

In order to remove such defective memory cells, the memory cells must be tested by supplying a current to the digit lines one by one. Hereinafter, such an operation test for evaluating anti-erroneous writing is referred to as "disturb test". It takes a long time to conduct the disturb test.

As described above, digit lines DL are provided corresponding to the memory cell rows. However, the line pitch of digit lines DL is approximately the same as the layout pitch of the memory cells. With reduction in memory cell size, the line pitch of digit lines DL is reduced. This causes reduction in manufacturing yield and reliability due to the defects between digit lines DL. Accordingly, a burn-in test of digit lines DL is required. However, since digit lines DL are current lines, a sufficient voltage difference cannot be provided between each of digit lines DL and between digit lines DL and signal lines and between digit lines DL and contacts of other wiring layers and the like. As a result, the burn-in test cannot be conducted in a satisfactory manner even if a voltage for driving a digit line is boosted.

SUMMARY OF THE INVENTION

It is an object of the present invention to provide a thin film magnetic memory device which enables reduction in area of a circuit band provided for each memory block, for driving a signal line and the like, in the case where a memory array is divided into a plurality of memory blocks.

It is another object of the present invention to provide a thin film magnetic memory device which enables reduction in time required for a disturb test for removing defective memory cells having weak disturb characteristics.

It is still another object of the present invention to provide a thin film magnetic memory device capable of conducting in a satisfactory manner a burn-in test of digit lines serving as current lines.

According to one aspect of the present invention, a thin film magnetic memory device includes a plurality of magnetic memory cells arranged in a matrix, a plurality of digit lines, and a plurality of first and second driver units. The plurality of magnetic memory cells are divided into N memory blocks of first to $N^{th}$ stages along a row direction so that the N memory block share memory cell rows (where N is a natural number). In each of the memory blocks, the plurality of digit lines are provided corresponding to the memory cell rows, respectively, for selectively supplying a data write current for generating a data write magnetic field to a magnetic memory cell selected for data write operation. The plurality of first driver units are provided corresponding to the plurality of digit lines, respectively, and each controls connection between one end of the corresponding digit line and a first voltage. The plurality of second driver units are provided corresponding to the plurality of digit lines, respectively, and each controls connection between another end of the corresponding digit line and a second voltage. In data write operation, each of the first driver units corresponding to the memory block of first stage connects one end of the corresponding digit line to the first voltage according to a row selection result. In data write operation, each of the second driver units corresponding to the memory block of $I^{th}$ stage including the selected magnetic memory cell (where I is a natural number satisfying I≦N) connects another end of the corresponding digit line to the second voltage according to a selection result of the plurality of memory blocks. When I≧2 in data write operation, each of the first driver units corresponding to each of the memory blocks of second to $I^{th}$ stages connects one end of the corresponding digit line to the first voltage according to a voltage level on the digit line of the same memory cell row in the memory block of a previous stage. When I≧2 in data write operation, each of the second driver units corresponding to each of the memory blocks of first to $(I-1)^{th}$ stages disconnects another end of the corresponding digit line from the second voltage according to the selection result of the plurality of memory blocks.

The thin film magnetic memory device of the present invention can transmit the row selection result to a memory block selected for data write operation by using digit lines provided independently in each memory block.

Accordingly, a main advantage of the present invention is that wiring resistance of each digit line can be suppressed, and a data write current can be selectively supplied to a selected memory block without providing additional row selection lines. This prevents increase in the number of wiring layers, whereby complication of the manufacturing process is avoided.

According to another aspect of the present invention, a thin film magnetic memory device includes a plurality of magnetic memory cells arranged in a matrix, a plurality of digit lines, a plurality of first and second driver units, a plurality of word lines provided corresponding to memory cell rows, and a plurality of driving sections. The plurality of digit lines are provided corresponding to the memory cell rows, respectively, for selectively supplying a data write current for generating a data write magnetic field to the magnetic memory cell selected for data write operation. The plurality of first driver units are provided corresponding to the plurality of digit lines, respectively, and each controls connection between one end of the corresponding digit line and a first voltage. The plurality of second driver units are provided corresponding to the plurality of digit lines, respectively, and each controls connection between another end of the corresponding digit line and a second voltage. The plurality of driving sections are provided corresponding to the plurality of word lines, respectively, and each activates the corresponding word line according to a voltage level of the digit line of the same row. In data write operation, each of the first driver units connects one end of the corresponding digit line to the first voltage according to a row selection result, and each of the second driver units connects another end of the corresponding digit line to the second voltage. In data read operation, each of the first driver units connects one end of the corresponding digit line to the first voltage according to the row selection result, and each of the second driver units disconnects another end of the corresponding digit line from the second voltage.

According to the thin film magnetic memory device of the present invention, in data read operation, each driving section activates a corresponding word line according to a voltage level on a digit line of the same row. In other words, in data read operation, a digit line serves as a signal line for providing an instruction to activate a word line.

An advantage of the present invention is that increase in the number of wiring layers is prevented, thereby avoiding complication of a manufacturing process.

According to still another aspect of the present invention, a thin film magnetic memory device includes a plurality of magnetic memory cells arranged in a matrix, a plurality of digit lines, a plurality of bit lines, and a plurality of current supply circuits. The plurality of digit lines are provided corresponding to the memory cell rows, respectively, for selectively supplying a first data write current to a magnetic memory cell selected for data write operation. The plurality of bit lines are provided corresponding to the memory cell columns, respectively, for selectively supplying a second data write current to the magnetic memory cell selected for data write operation. The plurality of current supply circuits are provided corresponding to the plurality of digit lines, respectively, and each controls supply of the first data write current to the corresponding digit line. In data write operation, each of the current supply circuits supplies the first data write current to the corresponding digit line according to a row selection result. In test operation, each of the current supply circuits supplies the first data write current which is smaller than that supplied in the data write operation. In test operation, at least one of the plurality of bit lines receives the second data write current.

The thin film magnetic memory device of the present invention includes a plurality of current supply circuits provided corresponding to a plurality of digit lines, for supplying a first data write current. In test operation, each current supply circuit supplies a data write current which is smaller than that supplied in data write current. In test operation, a second data write current is supplied to one of the plurality of bit lines. In other words, in test operation, the first data write current smaller than that supplied in normal operation is supplied to a digit line, and the second data write current is supplied to a bit line.

Accordingly, an advantage of the present invention is that a so-called disturb test can be conducted in the memory cell columns in parallel by using a magnetic field generated by the first and second data write currents. This enables reduction in time required for the test.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a truth table showing correspondence between a block selection signal and a digit line pull-down signal.

FIG. 6 is a truth table showing correspondence between a block selection signal and a digit line pull-down signal.

FIG. 14 is a truth table showing correspondence among a block selection signal, a digit line pull-down signal and a word block selection signal.

FIG. 17 is a truth table showing correspondence between a block selection signal and a digit line pull-down signal.

DESCRIPTION OF THE PREFERRED EMBODIMENTS

Figure 1:
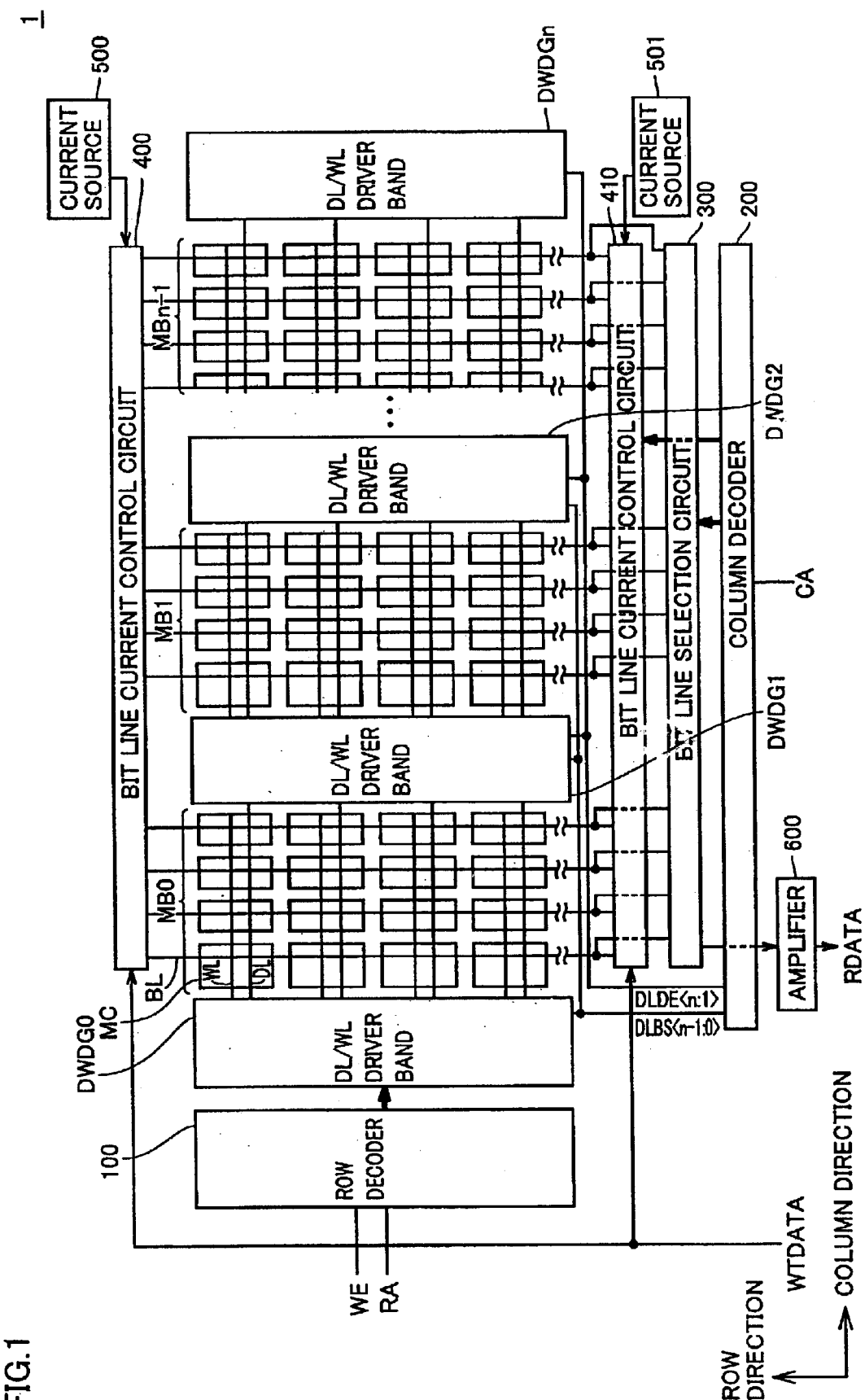
FIG. 1 shows the overall structure of an MRAM device according to a first embodiment of the present invention.

Hereinafter, embodiments of the present invention will be described in detail with reference to the accompanying drawings. Note that the same or corresponding portions are denoted with the same reference numerals and characters throughout the figures, and description thereof will not be repeated.

(First Embodiment)

Referring to FIG. 1, an MRAM device 1 includes memory blocks MB0 to MBn-1 each having MTJ memory cells MC arranged in a matrix. In each memory block MB, a plurality of word lines WL and a plurality of digit lines DL are provided corresponding to the MTJ memory cell rows. Moreover, a plurality of bit lines BL are provided corresponding to the MTJ memory cell columns.

MRAM device 1 further includes a row decoder 100, a column decoder 200, a bit line selection circuit 300 and an amplifier 600.

Row decoder 100 conducts row selection according to a row address RA of an address signal. Column decoder 200 conducts column selection in each memory block MB according to a column address CA of the address signal.

In data read operation, bit line selection circuit 300 selects a bit line in each memory block MB according to the column selection instruction from the column decoder 200, and outputs a read signal to amplifier 600. Amplifier 600 amplifies the output signal of bit line selection circuit 300 for output as read data RDATA.

MRAM device 1 further includes bit line current control circuits 400, 410 and current sources 500, 501. In data write operation, bit line current control circuits 400, 410 supply a current according to write data WTDATA to a bit line BL in each memory block MB according to the column selection instruction of column decoder 200. In other words, a data write current to be supplied to the bit line BL in data write operation is supplied from current sources 500, 501 to bit line current control circuits 400, 410, respectively.

MRAM device 1 further includes DL/WL driver bands DWDG0 to DWDGn (hereinafter, sometimes generally referred to as DL/WL driver bands DWDG). DL/WL driver band DWDG0 is provided adjacent to memory block MB0. DL/WL driver bands DWDG1 to DWDGn-1 are provided in the regions between memory blocks MB0 to MBn-1, respectively. DL/WL driver band DWDGn is provided adjacent to memory block MBn-1.

More specifically, each DL/WL driver band DWDG is activated based on a block selection signal DLBS<n-1:0> and a digit line pull-down signal DLDE<n:1> which reflect the row selection result of row decoder 100 and the column selection result of column decoder 200. Note that block selection signal DLBS<n-1:0> collectively refers to block selection signal DLBS0 to DLBSn-1, and digit line pull-down signal DLDE<n:1> collectively refers to digit line pull-down signals DLDE1 to DLDEn.

Figure 2:
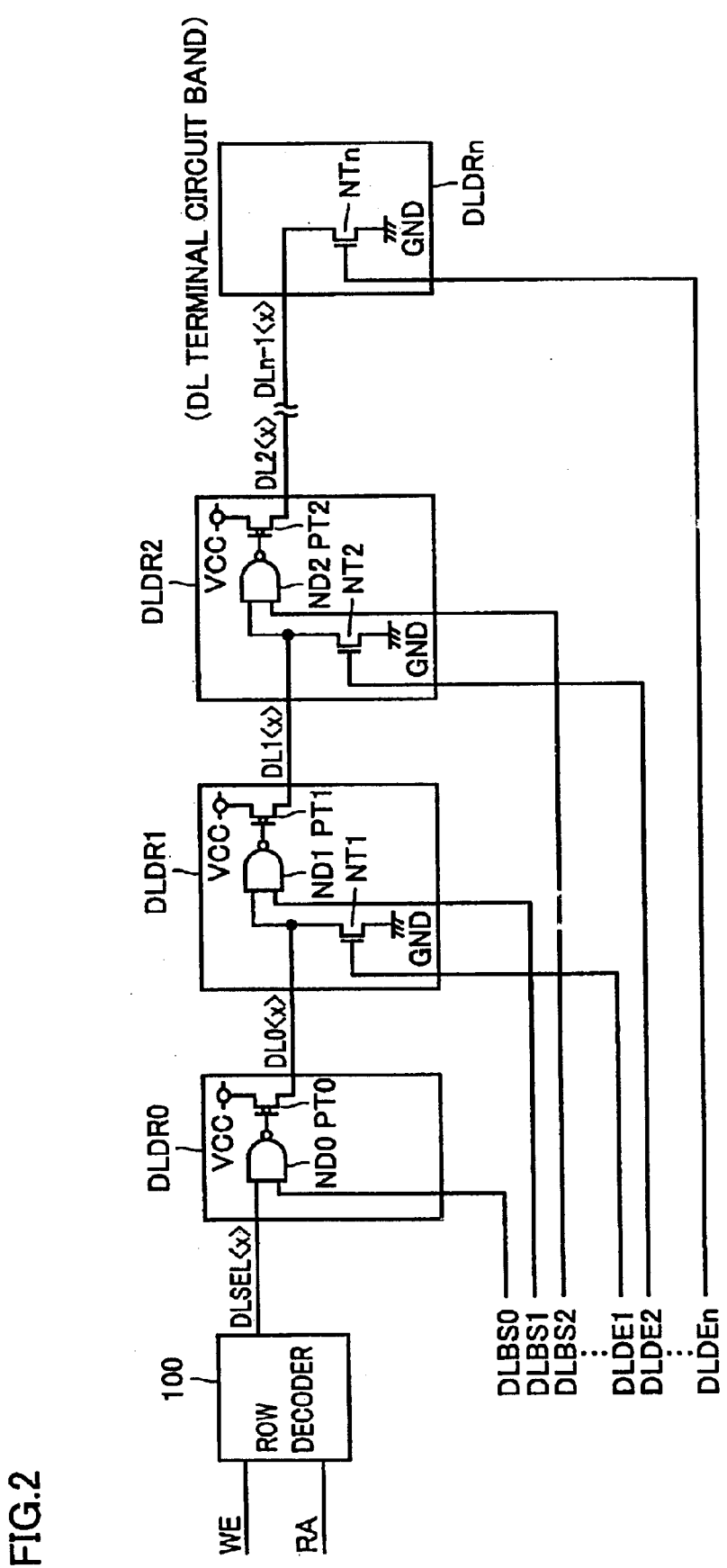
FIG. 2 is a conceptual diagram of row selection circuitry provided on both sides of each memory block according to the first embodiment of the present invention.

Referring to FIG. 2, in row selection circuitry of the first embodiment, digit line drivers DLDR0 to DLDRn for driving a digit line of the $x^{th}$ row in a corresponding memory block MB are connected in series with each other through digit lines DL0<x> to DLn-1<x> (where x is a natural number). Note that "<x>" of digit line DL0<x> indicates a row number in a corresponding memory block MB. In this case, "<x>" indicates the $x^{th}$ row. Hereinafter, digit lines DL0<x> to DLn-1<x> are sometimes simply referred to as digit lines DL0 to DLn-1, and sometimes generally referred to as digit lines DL.

Row decoder 100 conducts row selection according to write enable WE and row address RA, and activates a row selection line DLSEL<x> of the $x^{th}$ row to "H" level according to the row selection result. Note that row selection line DLSEL<x> is sometimes simply referred to as row selection line DLSEL.

Digit line drivers DLDR0 to DLDRn are activated in response to block selection signals DLBS0 to DLBSn-1 and digit line pull-down signals DLDE1 to DLDEn, respectively. Hereinafter, block selection signals DLBS0 to DLBSn-1 and digit line pull-down signals DLDE1 to DLDEn are sometimes generally referred to as block selection signals DLBS and digit line pull-down signals DLDE, respectively. Note that the numerals at the end of DLBS0 to DLBSn-1 and DLDE1 to DLDEn correspond to the numerals at the end of DLDR0 to DLDRn. For example, DLBS2 indicates a block selection signal to be applied to digit line driver DLDR2.

Digit line driver DLDR0 at the starting end has a NAND circuit ND0 and a P-channel MOS (metal oxide semiconductor) transistor PT0. NAND circuit ND0 receives a signal transmitted to row selection line DLSEL and a block selection signal DLBS0 and outputs the NAND logic operation result thereof to the gate of P-channel MOS transistor PT0. P-channel MOS transistor PT0 electrically couples a power supply voltage VCC to digit line DL0 according to the logic operation result of NAND circuit ND0.

Since digit line drivers DLDR1 to DLDRn-1 have the same circuit structure, digit line driver DLDR1 is exemplarily described herein.

Digit line driver DLDR1 has a NAND circuit ND1, a P-channel MOS transistor PT1 and an N-channel MOS transistor NT1. NAND circuit ND1 outputs the NAND logic operation result of a voltage level signal on digit line DL0 of the previous stage and a block selection signal DLBS1. P-channel MOS transistor PT1 electrically couples power supply voltage VCC to digit line DL1 according to the logic operation result of NAND circuit ND1. N-channel MOS transistor NT1 pulls down digit line DL0 of the previous stage to a ground voltage GND in response to a digit line pull-down signal DLDE1. Since the remaining digit line drivers DLDR2 to DLDRn-1 have the same structure as that of digit line driver DLDR1, detailed description thereof will not be repeated. Note that P-channel MOS transistors PT0 to PTn-1 are sometimes referred to as driver transistors for electrically coupling power supply voltage VCC to respective digit lines DL0 to DLn-1.

Digit line driver DLDRn at the terminal end has an N-channel MOS transistor NTn for pulling down digit line DNn-1 in memory block MBn-1 of the previous stage to ground voltage GND in response to a digit line pull-down signal DLDEn.

FIG. 3 shows combinations of block selection signal DLBS and digit line pull-down signal DLDE which are produced by column decoder 200 in response to selection of memory block MB0 to MBn-1. More specifically, block selection signal DLBS and digit line pull-down signal DLDE are signals for controlling a voltage to be connected to a corresponding digit line. Accordingly, each digit line driver DLDR0 to DLDRn sets a voltage to be connected to a corresponding digit line, in response to either activated block selection signal DLBS or digit line pull-down signal DLDE.

An example of this will now be described. It is now assumed that column decoder 200 selects memory block MB1 and a data write current is to be supplied to digit line DL1.

Figure 4:
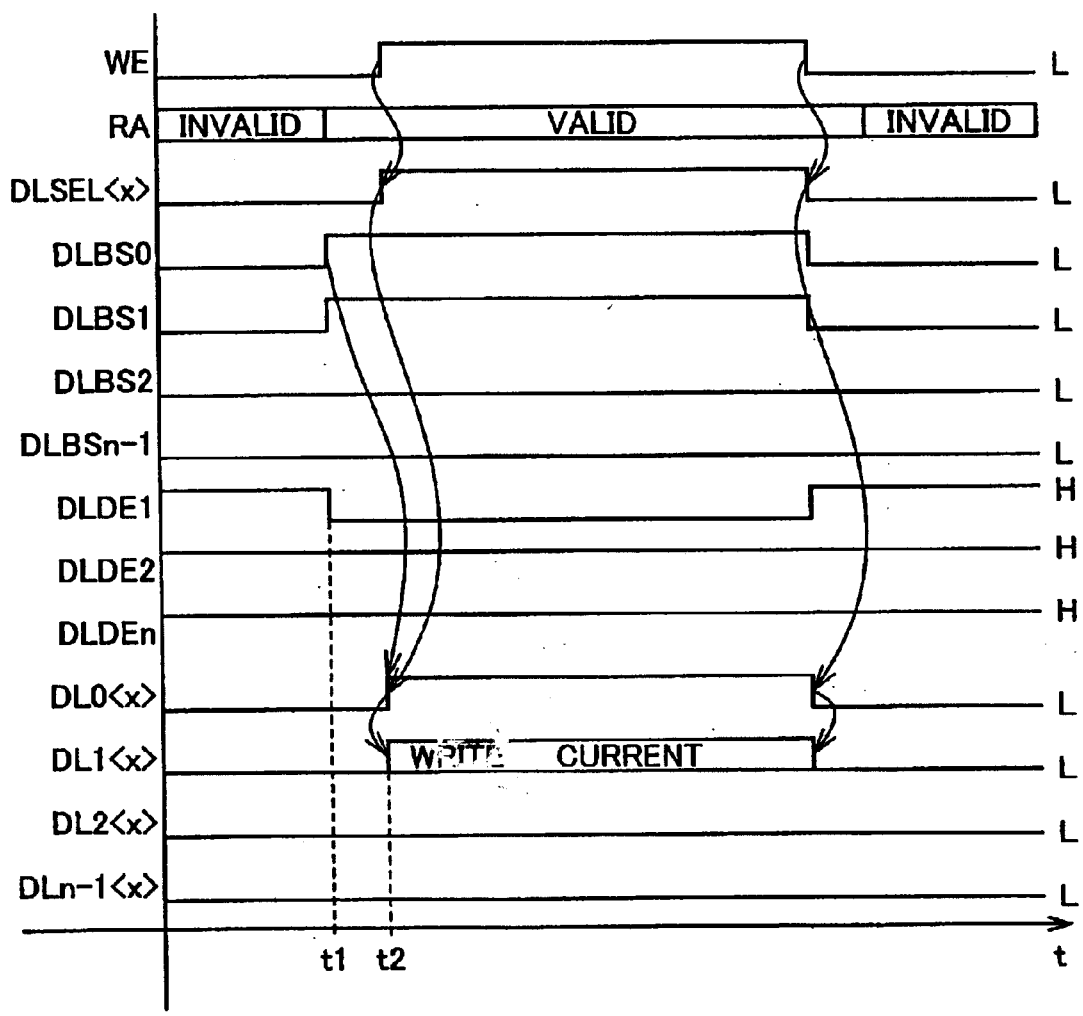
FIG. 4 is a timing chart of the case where a data write current is supplied to a digit line of a selected memory block.

Referring to FIGS. 3 and 4, in a standby period (i.e., until time t1), write enable WE (i.e., write instruction signal) and row address RA are both at "L" level, and therefore row selection line DLSEL connected to row decoder 100 is set to "L" level. Accordingly, row selection is not conducted in this stage. Moreover, each block selection signal DLBS is set to "L" level. Accordingly, P-channel MOS transistors PT0 to PTn−1 in the respective drivers DLDR are in the OFF state. Each digit line pull-down signal DLDE is at "H" level and N-channel MOS transistors NT1 to NTn in the respective drivers DLDR are in the ON state. Therefore, each digit line DL is electrically coupled to ground voltage GND ("L" level).

Provided that memory block MB1 is selected at time t1, column decoder 200 sets block selection signals DLBS0, DLBS1 to "H" level and block selection signals DLBS2 to DLBSn−1 to "L" level. Moreover, column decoder 200 sets digit line pull-down signal DLDE1 to "L" level and digit line pull-down signals DLDE2 to DLDEn to "H" level.

At time t2, row decoder 100 activates row selection line DLSEL to "H" level based on the row selection result of write enable WE and row address RA. Since block selection signals DLBS0, DLBS1 are at "H" level, digit lines DL0, DL1 are activated to be electrically coupled to power supply voltage VCC. Digit lines DL0, DL1 are thus charged to "H" level.

Since digit line pull-down signal DLDE2 is at "H" level, N-channel MOS transistor NT2 in digit line driver DLDR2 pulls down digit line DL1 to ground voltage GND. In digit line DL1, a current path is thus formed between power supply voltage VCC and ground voltage GND, whereby a data write current flows through digit line DL1. In other words, write operation is thus conducted in memory block MB1.

Note that digit line pull-down signals DLDE3 to DLDEn are at "H" level and digit lines DL3 to DLn are electrically coupled to ground voltage GND, i.e., "L" level. In the first embodiment of the present invention, a digit line DL supposed to receive a data write current is used as a signal for transmitting the row selection result of row decoder 100.

The above structure enables a data write current to be supplied only to a digit line DL corresponding to a selected memory block MB without providing an address decoder and providing common row selection lines DLSEL for memory blocks MB for transmitting the row selection result.

The above structure prevents increase in area caused by the address decoder and increase in the number of wiring layers caused by the row selection lines, thereby avoiding complication of the manufacturing process. Moreover, the above structure enables a data write current required for write operation to be sufficiently supplied to a selected magnetic memory cell even when the MRAM device having a large memory array size is divided into memory blocks.

Note that, in the above description, digit line driver DLDR includes a P-channel MOS transistor for electrically connecting power supply voltage VCC to digit line DL according to the logic operation result of the NAND circuit, and an N-channel MOS transistor for electrically connecting ground voltage GND to digit line DL. However, operation of the present invention can be realized in the same manner even when the polarities of these transistors are reversed, the NAND circuit is replaced with a NOR circuit and the logical relation between the voltage levels of block selection signal DLBS and digit line pull-down signal DLDE is reversed. In this case, row selection line DLSEL is activated at "L" level.

(Second Embodiment)

The second embodiment of the present invention is intended to activate a word line in each memory block MB without providing common row selection lines for memory blocks MB.

Figure 5:
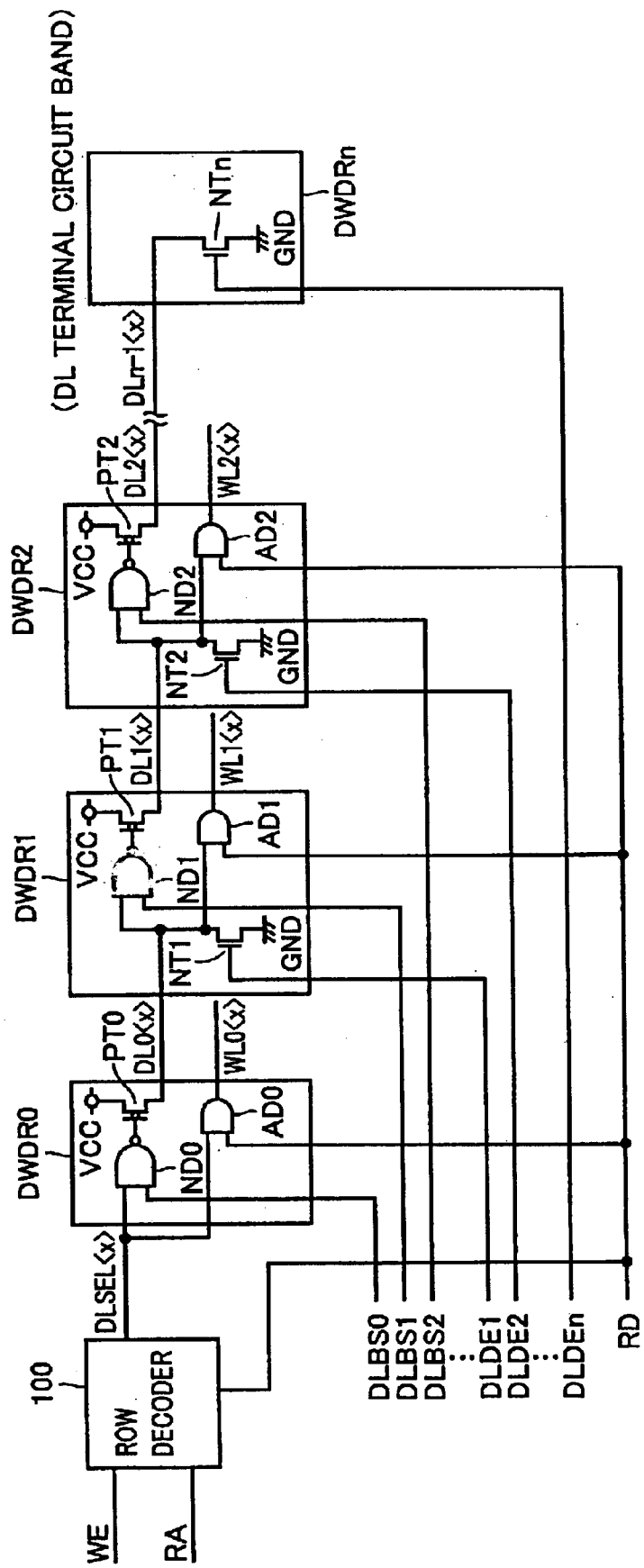
FIG. 5 is a conceptual diagram of row selection circuitry included in an MRAM device according to a second embodiment of the present invention.

Referring to FIG. 5, in row selection circuitry of the second embodiment, digit word line drivers DWDR0 to DWDRn for driving a digit line and word line of the $x^{th}$ row in a corresponding memory block MB are connected in series with each other through digit lines DL0<x> to DLn−1<x> (where x is a natural number). Hereinafter, digit word line drivers DWDR0 to DWDRn are sometimes generally referred to as digit word line drivers DWDR.

Digit word line driver DWDR is different from digit line driver DLDR in that digit word line driver DWDR further includes an AND circuit.

More specifically, digit word line driver DWDR0 is different from digit line driver DLDR0 in that digit word line driver DWDR0 further includes an AND circuit AD0. AND circuit AD0 receives a signal transmitted to row selection line DLSEL and a read signal RD (i.e., a read instruction signal), and activates a word line WL0 according to the AND logic operation result thereof. Since digit word line drivers DWDR1 to DWDRn−1 have the same structure, digit word line driver DWDR1 is exemplarily described herein. Digit word line driver DWDR1 is different from digit line driver DLDR1 in that digit word line driver DWDR1 further includes an AND circuit AD1. AND circuit AD1 receives a signal transmitted to a digit line DL0 in memory block MB0 of the previous stage and a read signal RD (read instruction signal), and activates a word line WL1 according to the AND logic operation result thereof.

Row decoder 100 further receives a read signal RD (i.e., a read instruction signal).

Referring to FIG. 6, in data read operation, each block selection signal DLBS and each digit line pull-down signal DLDE which are produced by column decoder 200 are respectively set to "H" level and "L" level whichever memory block MB0 to MBn−1 is selected.

An example of this will now be described. It is now assumed that memory block MB1 is selected for data read operation.

Figure 7:
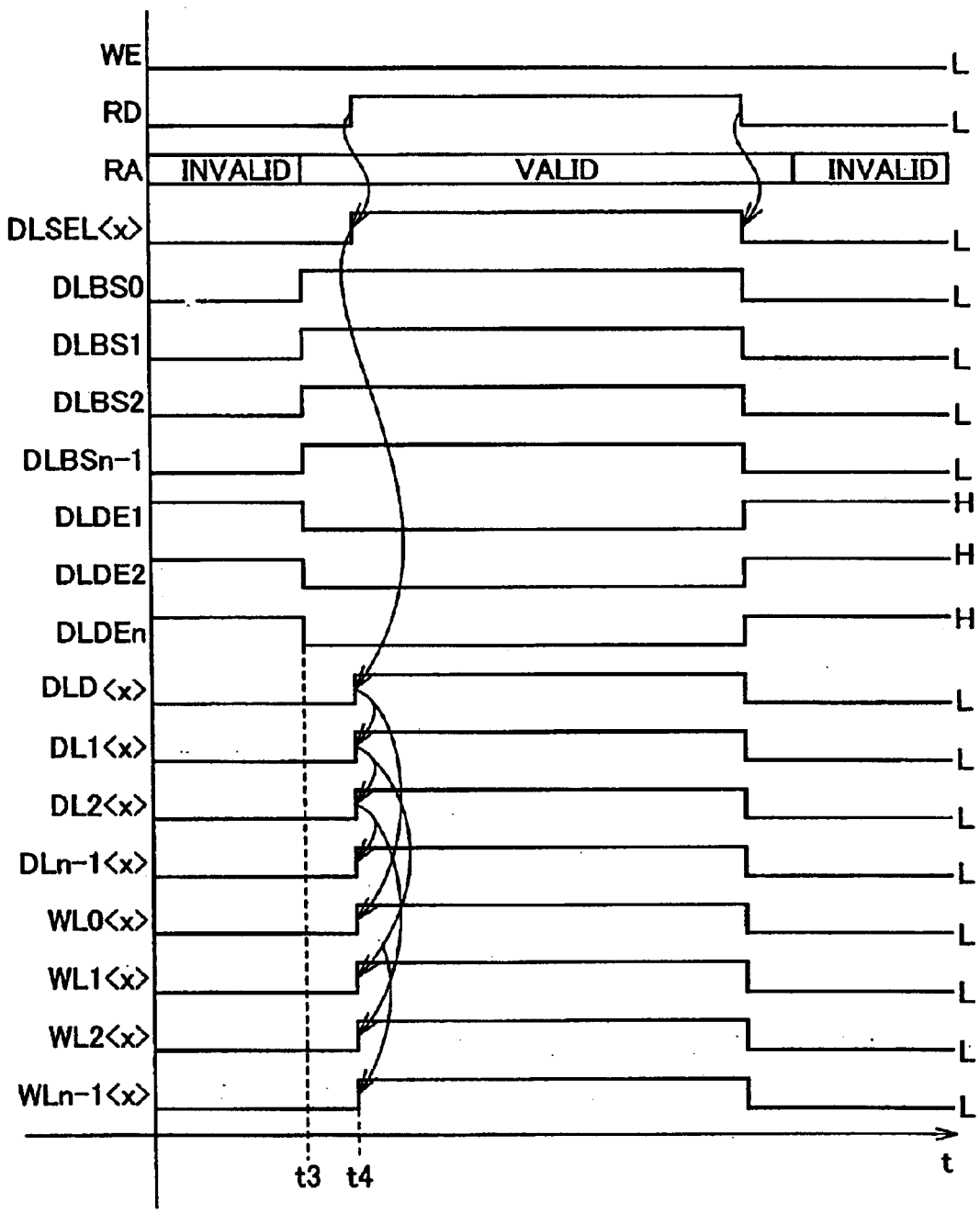
FIG. 7 is a timing chart of the case where a memory block is selected in data read operation.

Referring to FIGS. 6 and 7, in a standby period (i.e., until time t3), read signal RD (read instruction signal) and row address RA are both at "L" level, and therefore row selection line DLSEL connected to row decoder 100 is set to "L" level. Accordingly, row selection is not conducted in this stage. Moreover, each block selection signal DLBS is set to "L" level. Therefore, P-channel MOS transistors PT0 to PTn−1 in the respective drivers DLDR are in the OFF state. Note that, in data read operation, write enable WE to be applied in data write operation is at "L" level. Each digit line pull-down signal DLDE is at "H" level and N-channel MOS transistors NT1 to NTn in the respective drivers DLDR are in the ON state. Accordingly, each digit line DL is electrically coupled to ground voltage GND ("L" level).

Provided that memory block MB1 is selected at time t3, column decoder 200 sets block selection signals DLBS0 to DLBSn-1 to "H" level and digit line pull-down signals DLDE1 to DLDEn to "L" level.

At time t4, row decoder 100 activates row selection line DLSEL to "H" level based on the row selection result of read signal RD and row address RA. Since block selection signals DLBS0 to DLBSn-1 are at "H" level, digit lines DL0 to DLn-1 are activated to be electrically coupled to power supply voltage VCC. Digit lines DL0 to DLn-1 are thus charged to "H" level.

AND circuits AD0 to ADn-1 in the respective digit word line drivers DWDR0 to DWDRn-1 activate corresponding word lines WL0 to WLn-1 to "H" level according to the AND logic operation result of a signal transmitted to a corresponding digit line DL ("H level") and a read signal RD ("H" level). In response to activation of every word line WL, data read operation is conducted in the selected memory block MB1.

Note that all digit line pull-down signals DLDE1 to DLDEn are at "L" level and all digit lines DL0 to DLn-1 are used as signal lines for transmitting the row selection result in data read operation.

According to the above structure, not only the effects of the first embodiment are obtained, but also increase in the number of wiring layers caused by row selection lines for selecting a word line WL in each memory block is suppressed, whereby complication of the manufacturing process can be avoided.

(Modification of Second Embodiment)

A modification of the second embodiment of the present invention is intended to reduce power consumption in the data read operation described in the second embodiment.

Figure 8:
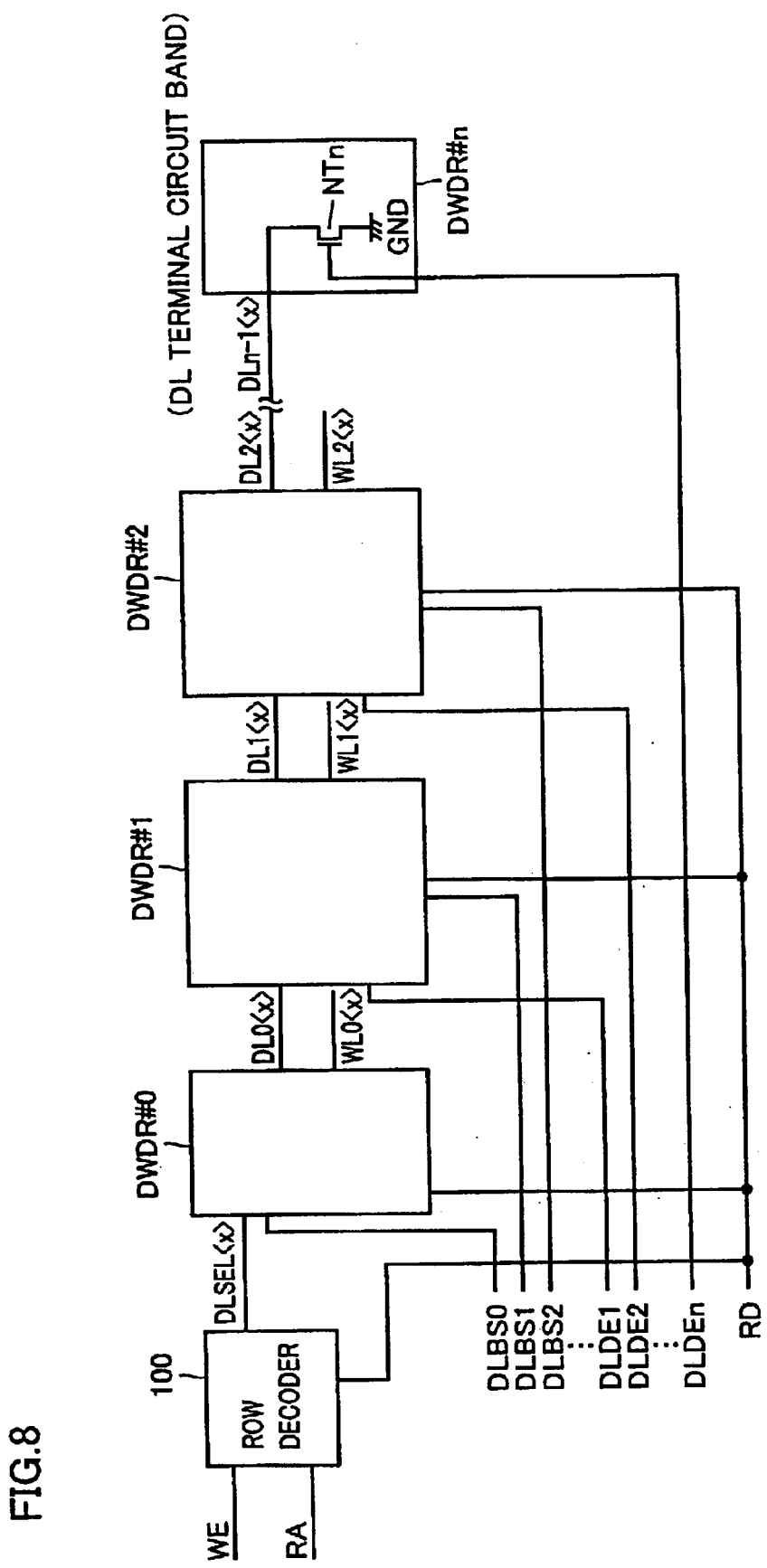
FIG. 8 is a conceptual diagram of row selection circuitry included in an MRAM device according to a modification of the second embodiment of the present invention.

Referring to FIG. 8, row selection circuitry of the modification of the second embodiment is different from that of the second embodiment in FIG. 5 in that digit word line drivers DWDR0 to DWDRn are replaced with digit word line drivers DWDR#0 to DWDR#n (hereinafter, sometimes generally referred to as digit word line drivers DWDR#). Since the row selection circuitry of the modification of the second embodiment is otherwise the same as that of the second embodiment, detailed description thereof will not be repeated. Note that digit word line driver DWDRn and digit word line driver DWDR#n have the same structure.

Figure 9B:
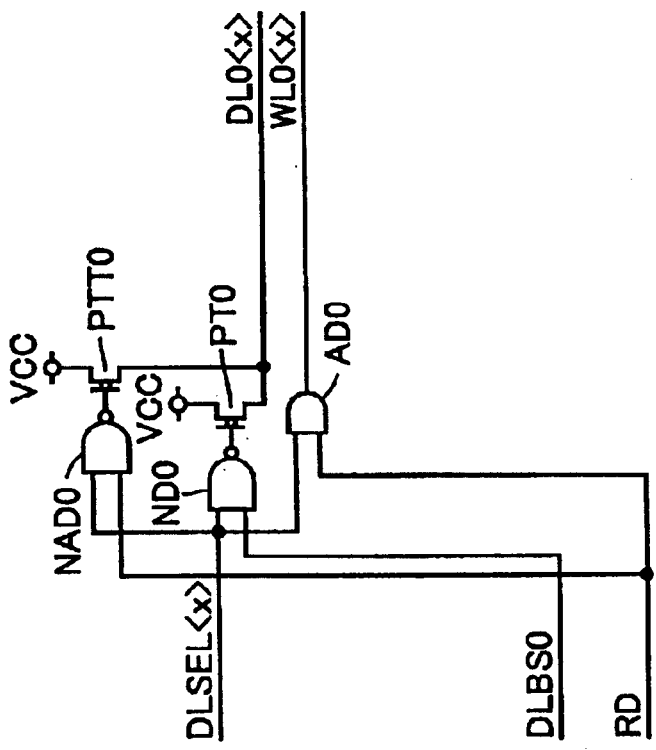
FIGS. 9A and 9B are circuit diagrams of a digit word line driver.
Figure 9A:
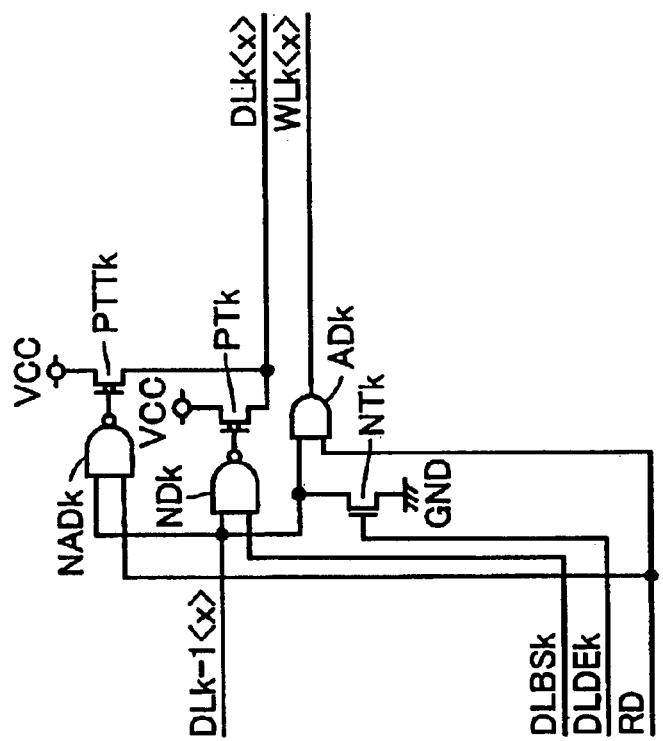

Referring to FIG. 9A, digit word line driver DWDR#0 is different from digit word line driver DWR0 of the second embodiment in that digit word line driver DWDR#0 further has a NAND circuit NAD0 and a P-channel MOS transistor PTT0.

NAND circuit NAD0 receives a signal transmitted to row selection line DLSEL and a read signal RD and transmits the NAND logic operation result thereof to the gate of P-channel MOS transistor PTT0. P-channel MOS transistor PTT0 is activated according to the NAND logic operation result of NAND circuit NAD0 and electrically couples power supply voltage VCC to digit line DL0.

Referring to FIG. 9B, as described in connection with FIG. 9A, digit word line driver DWDR#k (where k is a natural number satisfying 1≦k≦n-1) is different from digit word line driver DWDRk of the second embodiment in that digit word line driver DWDR#k further has a NAND circuit NADk and a P-channel MOS transistor PTTk. In digit word line driver DWDR#k, NAND circuit NADk activates P-channel MOS transistor PTTk according to the NAND logic operation result of a signal transmitted to digit line DLk-1 in memory block MB of the previous stage and a read signal RD, and electrically couples power supply voltage VCC to digit line DLk.

P-channel MOS transistors PTT0, PTTk are transistors having less current driving capability, that is, a smaller channel width, than that of P-channel MOS transistors PT0, PTk.

Although not shown in the figure, every block selection signal DLBS and every digit line pull-down signal DLDE which are produced by column decoder 200 are set to "L" level in data read operation.

Data read operation will now be described. It is herein assumed that memory block MB1 is selected for data read operation.

Referring to FIGS. 8, 9A and 9B, row decoder 100 activates row selection line DLSEL to "H" level in response to read signal RD ("H" level).

Since a signal transmitted to row selection line DLSEL and read signal RD are both at "H" level, AND circuit AD0 in digit word line driver DWDR#0 activates word line WL0. Moreover, NAND circuit NAD0 activates P-channel MOS transistor PTT0 in response to the signal transmitted to row selection line DLSEL and read signal RD. The row selection result transmitted to row selection line DLSEL is transmitted to digit line DL0 in response to activation of P-channel MOS transistor PTT0.

Similarly, digit word line driver DWDR#1 activates word line WL and P-channel MOS transistor PTT1 in response to a signal ("H" level) transmitted to digit line DL0 and read signal RD ("H" level), and transmits the row selection result ("H" level) to digit line DL2 in response to activation of P-channel MOS transistor PTT1. The other digit word line drivers DWDR# similarly activate a corresponding word line WL and sequentially transmit the row selection result to a corresponding digit line.

Note that, since every block selection signal DLBS is at "L" level, the NAND logic operation result of each NAND circuit NDk in each digit word line driver DWDR#k is "H" level. Therefore, no P-channel MOS transistor PTk is activated.

According to the present invention, each digit word line driver DWDR# has two driver transistors for electrically coupling power supply voltage VCC to digit line DL, and selectively activates the driver transistors in data read and write operations. Accordingly, in data read operation, a P-channel MOS transistor having a smaller channel width is driven instead of a P-channel MOS transistor having a larger channel width for supplying a data write current required for data write operation. As a result, power consumption can be reduced in addition to the effects of the second embodiment.

(Third Embodiment)

In the structure of the third embodiment of the present invention, the number of digit lines DL in each memory block MB is different from that of word lines WL in each memory block MB.

Hereinafter, an example in which each word line WL in each memory block is divided into two word lines will be described.

Figure 10:
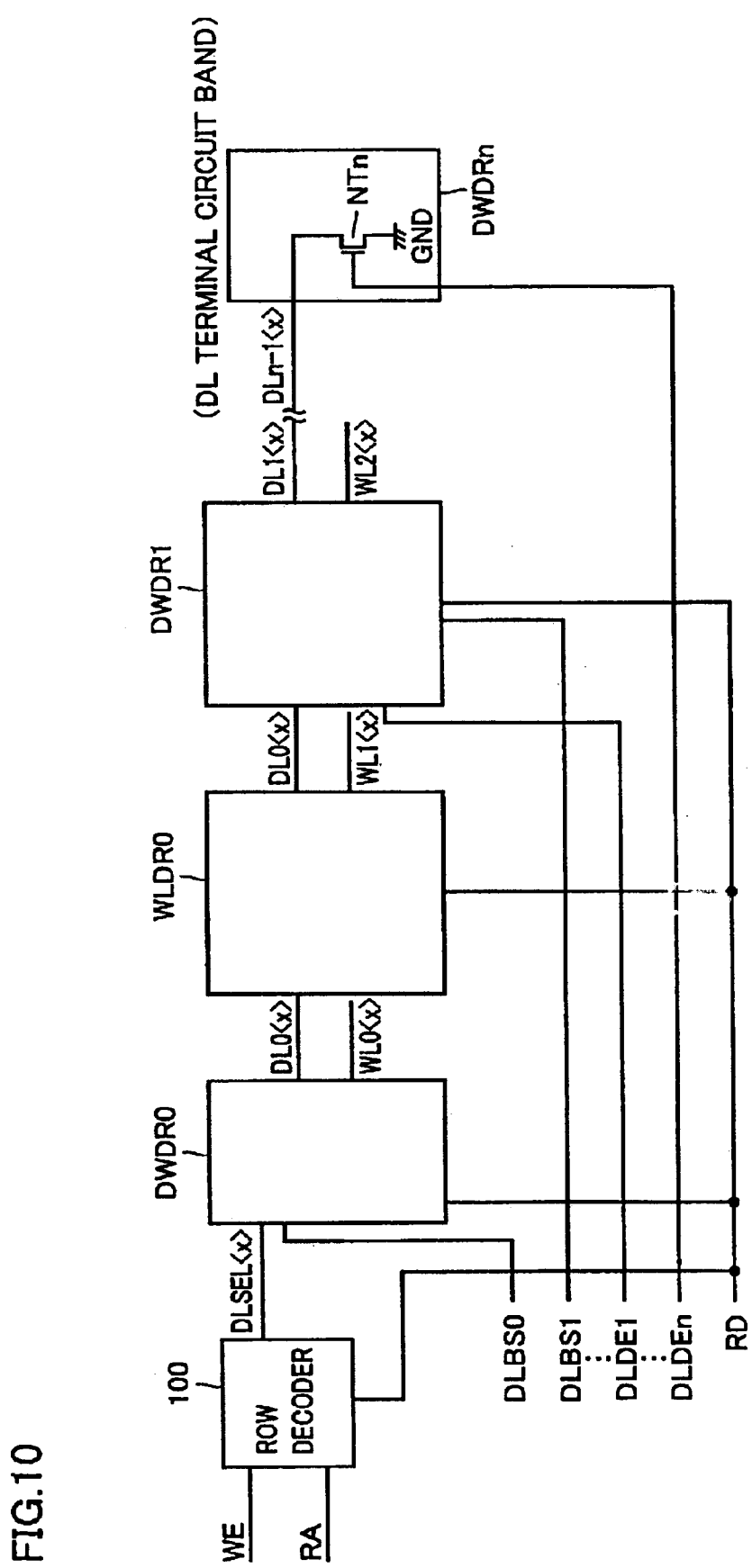
FIG. 10 is a conceptual diagram of row selection circuitry included in an MRAM device according to a third embodiment of the present invention.

Referring to FIG. 10, row selection circuitry of the third embodiment is different from that of the modification of the second embodiment in FIG. 8 in that the row selection circuitry of the third embodiment further includes word line drivers WLDR.

More specifically, each word line driver WLDR0 to WLDRn-1 is provided between corresponding two of the above digit word line drivers DWDR0 to DWDRn so as to divide each word line WL in a corresponding memory block. Note that word line drivers WLDR collectively refer to word line driver WLDR0 to WLDRn-1.

Word line driver WLDR0 will now be described by way of example. Word line driver WLDR0 is provided between digit word line drivers DWDR0 and DWDR1 so as to divide each word line WL in memory block MB0.

Figure 11:
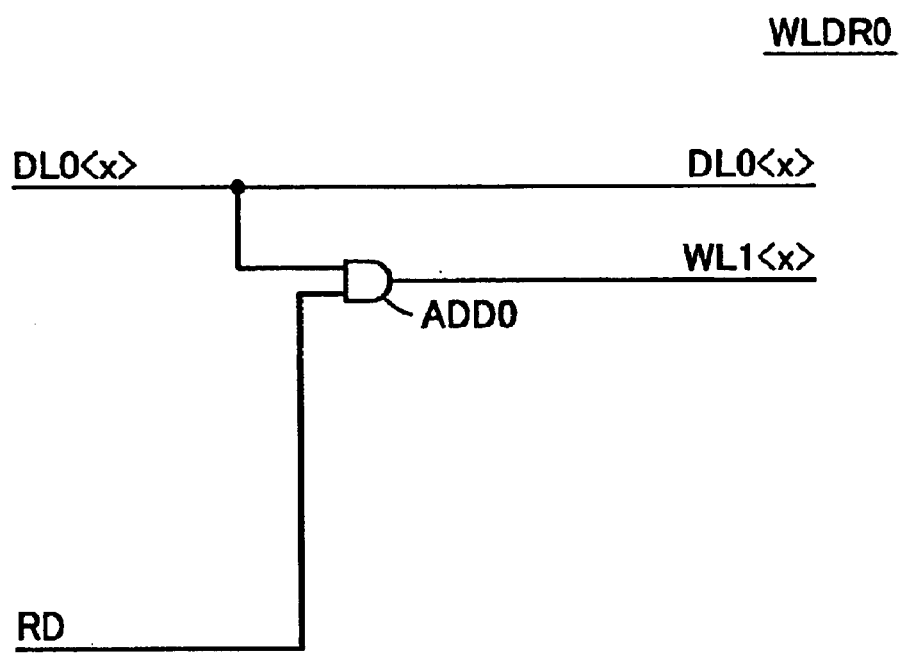
FIG. 11 is a circuit diagram of a word line driver.

Referring to FIG. 11, word line driver WLDR0 includes an AND circuit ADD0. AND circuit ADD0 receives a signal transmitted from digit line DL0 and a read signal RD, and activates word line WL1 according to the AND logic operation result thereof. Such circuit arrangement enables the word lines to be divided, whereby the number of word lines can be easily made different from that of digit lines.

The same effects as those of the second embodiment can be obtained by the above structure. Moreover, since the wiring length of each word line is reduced, the rise time thereof is reduced, enabling high-speed data read operation to be implemented.

The third embodiment of the present invention is also applicable to the second embodiment and the modification thereof.

(Fourth Embodiment)

Unlike the second embodiment, the fourth embodiment of the present invention is intended to reduce power consumption by activating only a word line WL included in a selected memory block MB in data read operation.

Figure 12:
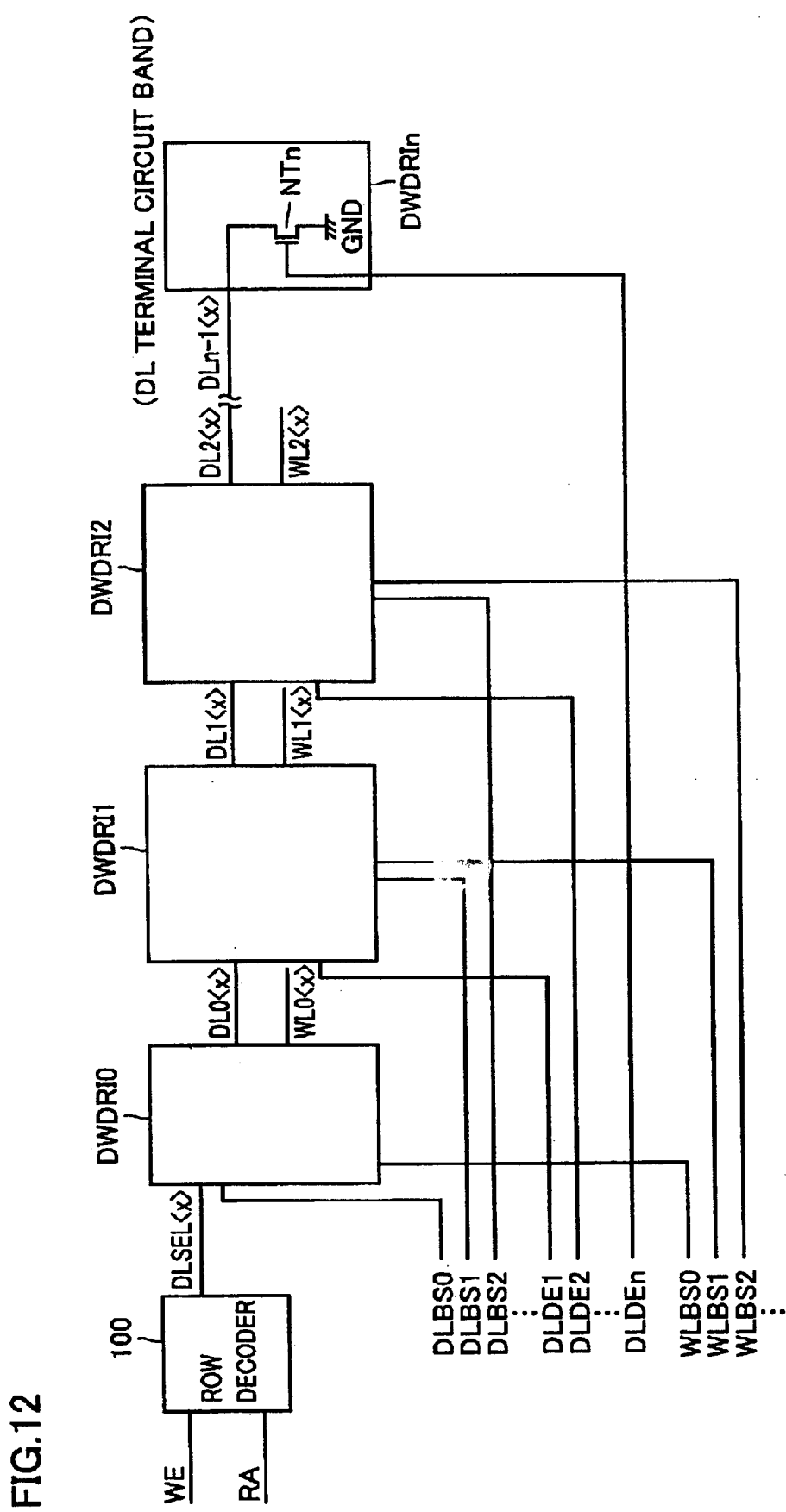
FIG. 12 is a conceptual diagram of row selection circuitry included in an MRAM device according to a fourth embodiment of the present invention.

Referring to FIG. 12, row selection circuitry of the fourth embodiment is different from that of the second embodiment in FIG. 5 in that digit word line drivers DWDR0 to DWDRn are replaced with digit word line drivers DWDRI0 to DWDRIn. Since the row selection circuitry of the fourth embodiment is otherwise the same as that of the second embodiment, detailed description thereof will not be repeated. Note that digit word line drivers DWDRn, DWDRIn have the same structure.

Figure 13A:
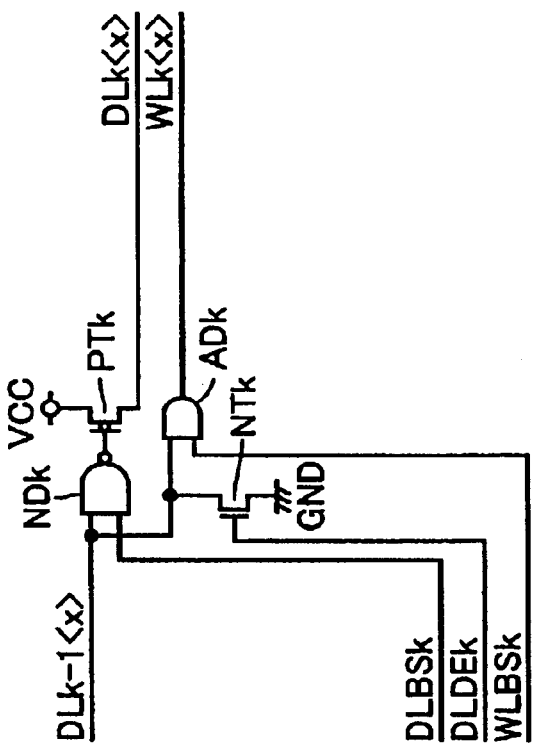
FIGS. 13A and 13B are circuit diagrams of a digit word line driver.

Referring to FIG. 13A, digit word line driver DWDRI0 is different from digit word line driver DWDR0 in that AND circuit AD0 receives a word block selection signal WLBS0 instead of read signal RD. In other words, word line WL0 is activated according to word block selection signal WLBS0.

Figure 13B:
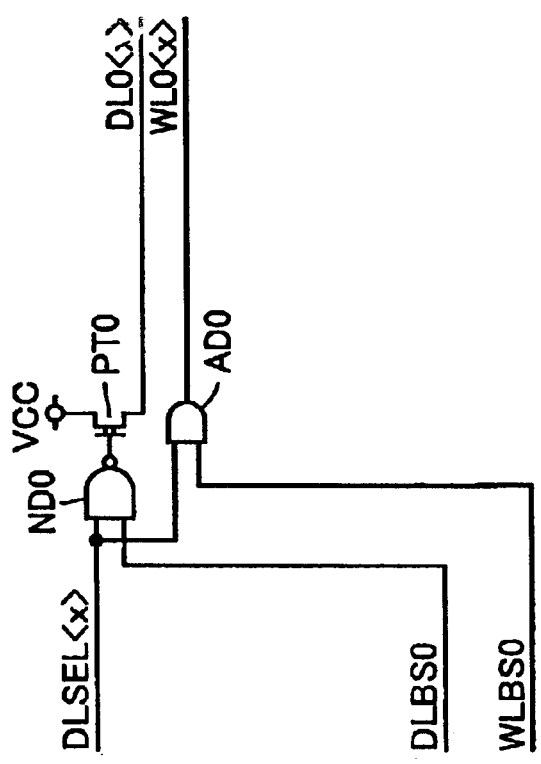

Referring to FIG. 13B, digit word line driver DWDRIk activates word line WLk according to a word block selection signal WLBSk.

Note that word block selection signals WLBS0, WLBSk are sometimes generally referred to as word block selection signals WLBS.

In the following description, it is assumed that word line WL1 is activated when memory block MB1 is selected.

Figure 15:
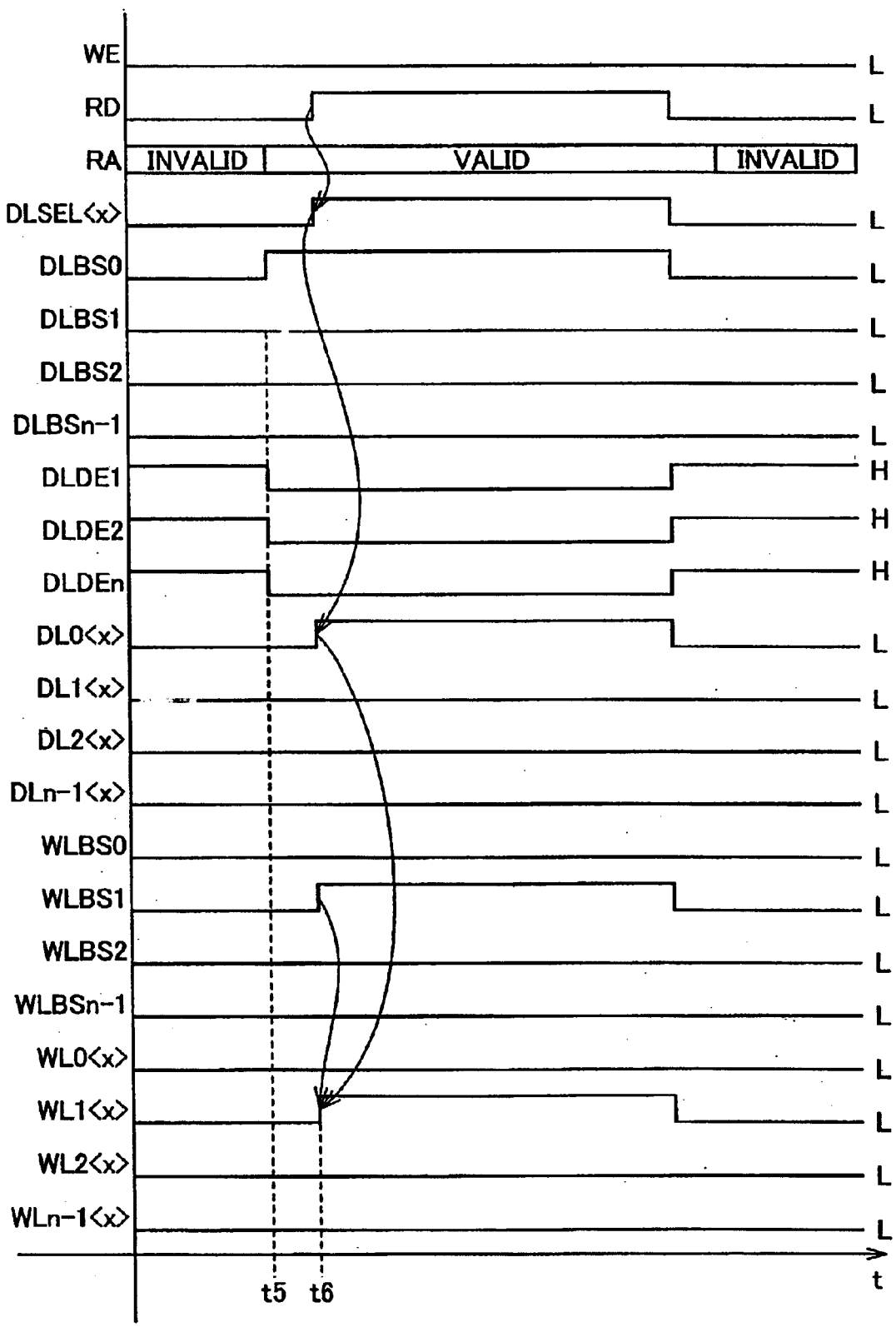
FIG. 15 is a timing chart of the case where a word line of a selected memory block MB is activated.

Referring to FIGS. 14 and 15, in a standby period (i.e., until time t5), read signal RD (read instruction signal) and row address RA are both at "L" level, and therefore row selection line DLSEL connected to row decoder 100 is set to "L" level. Accordingly, row selection is not conducted in this period. Moreover, each block selection signal DLBS is set to "L" level. Accordingly, P-channel MOS transistors PT0 to PTn−1 in the respective digit line drivers DLDR are in the OFF state. Note that write enable WE is activated in data write operation. Therefore, write enable WE is at "L" level in data read operation. Each digit line pull-down signal DLDE is at "H" level and N-channel MOS transistors NT1 to NTn in the respective digit line drivers DLDR are in the ON state. Therefore, each digit line DL is electrically coupled to ground voltage GND ("L" level). Each word block selection signal WLBS is set to "L" level.

Provided that memory block MB1 is selected at time t5, column decoder 200 sets block selection signal DLBS0 to "H" level, and sets block selection signals DLBS1 to DLBSn−1 to "L" level. Moreover, column decoder 200 sets digit line pull-down signals DLDE1 to DLDEn to "L" level.

At time t6, row decoder 100 activates row selection line DLSEL to "H" level based on read signal RD and the row selection result of row address RA. Word block selection signal WLBS1 is set to "H" level. Since block selection signal DLBS0 is at "H" level, digit line DL0 is activated and electrically coupled to power supply voltage VCC. Digit line DL0 is thus charged to "H" level.

AND circuit AD1 in digit word line driver DWDR1 activates a corresponding word line WL1 to "H" level according to the AND operation result of a signal ("H" level) transmitted to digit line DL0 electrically coupled to AND circuit AD1 and a word block selection signal WLBS1 ("H" level).

With the above circuit structure, only a word line included in a selected memory block MB is activated in data read operation, whereby power consumption can further be reduced.

(Fifth Embodiment)

The fifth embodiment of the present invention is intended to conduct operations such as detection of process defects or the like between wirings such as digit lines in the test mode.

Figure 16:
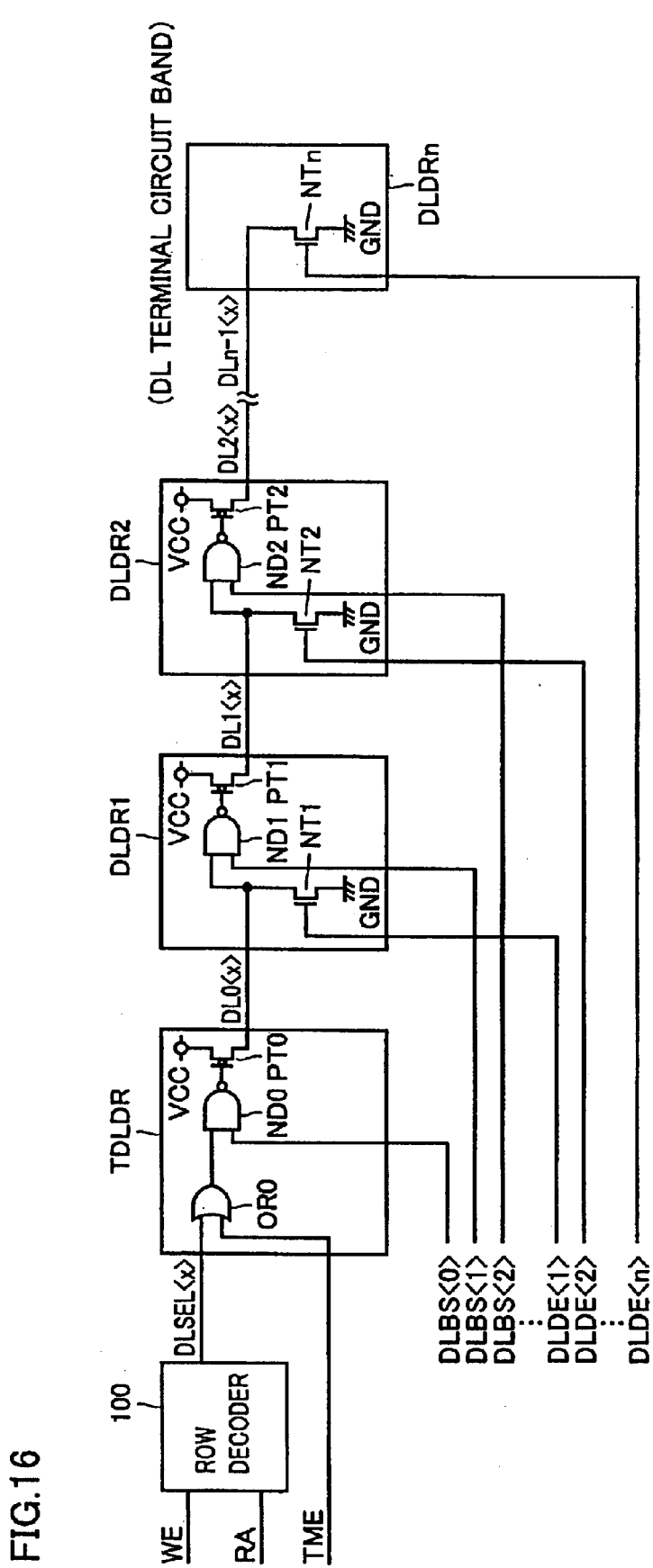
FIG. 16 is a conceptual diagram of row selection circuitry included in an MRAM device according to a fifth embodiment of the present invention.

Referring to FIG. 16, row selection circuitry of the fifth embodiment is different from that of the first embodiment in FIG. 2 in that digit line driver DLDR0 is replaced with a digit line driver TDLDR. Digit line driver TDLDR is different from digit line driver DLDR0 in that digit line driver TDLDR further includes an OR circuit OR0.

OR circuit OR0 receives a signal transmitted to row selection line DLSEL and a test mode enable signal TME and outputs the OR logic operation result thereof to one input of NAND circuit ND0.

The above structure enables a digit line DL to be activated in response to test mode enable signal TME regardless of the row selection result of row decoder 100.

Referring to FIG. 17, in the test mode, each block selection signal DLBS and each digit line pull-down signal DLDE are set to "H" level and "L" level, respectively.

Hereinafter, the test mode for detecting process defects will be described.

Figure 18:
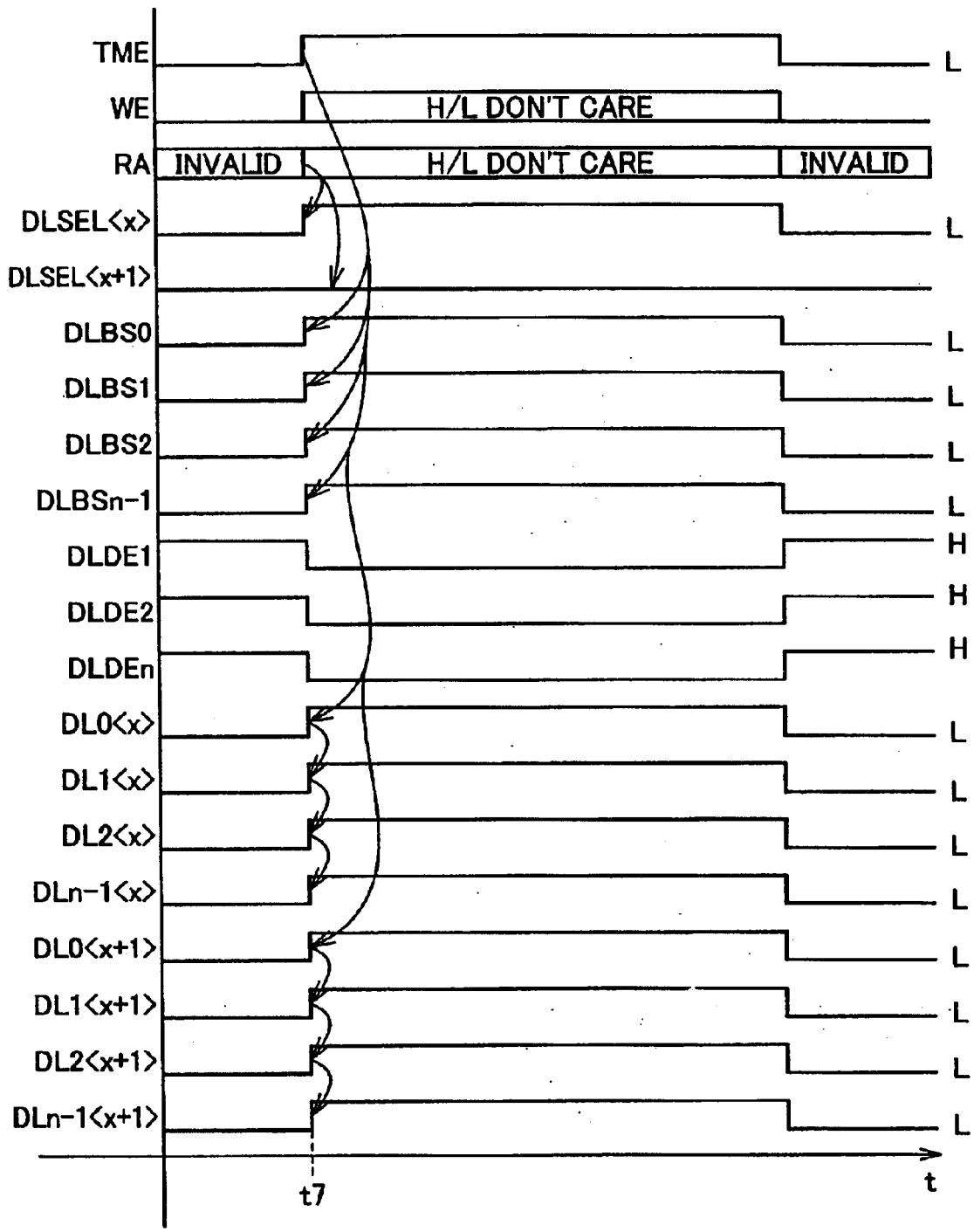
FIG. 18 is a timing chart of the case where process defects are detected in a test mode.

Referring to FIGS. 17 and 18, in a standby period (until time t7), test mode enable signal TME, write enable WE and row address RA are set to "L" level. Each block selection signal DLBS is at "L" level and each digit line pull-down signal DLDE is at "H" level. Therefore, N-channel MOS transistors NT1 to NTn in the respective drivers DLDR are in the ON state. Each digit line DL is thus electrically coupled to ground voltage GND ("L" level).

Provided that test mode enable signal TME for the test mode is applied at time t7, column decoder 200 sets block selection signals DLBS0 to DLBSn−1 to "L" level and digit line pull-down signals DLDE1 to DLDEn to "L" level.

In the test mode, row selection line DLSEL is activated to "H" level in response to test mode enable signal TME and block selection signal DLBS. In other words, in the test mode, every row selection line DLSEL in each row is activated in response to test mode enable signal TME regardless of row address RA.

Since every row selection line DLSEL is activated and block selection signals DLBS0 to DLBSn−1 are at "H" level, every digit line DL electrically coupled to row selection line DLSEL in each row is activated to "H" level.

With the above structure, detection of process defects between wirings (i.e., between a digit line DL and a signal line other than digit line DL, or the like) and voltage test of the P-channel and N-channel MOS transistors connected to digit line DL can be conducted at a time in each row.

Note that, although OR circuit OR0 is herein added to digit line driver DLDR0 in the row selection circuitry of the first embodiment, such a structure is also applicable to the second, third and fourth embodiments.

(Modification of Fifth Embodiment)

A modification of the fifth embodiment is intended to detect process defects between digit lines of each row.

Figure 19:
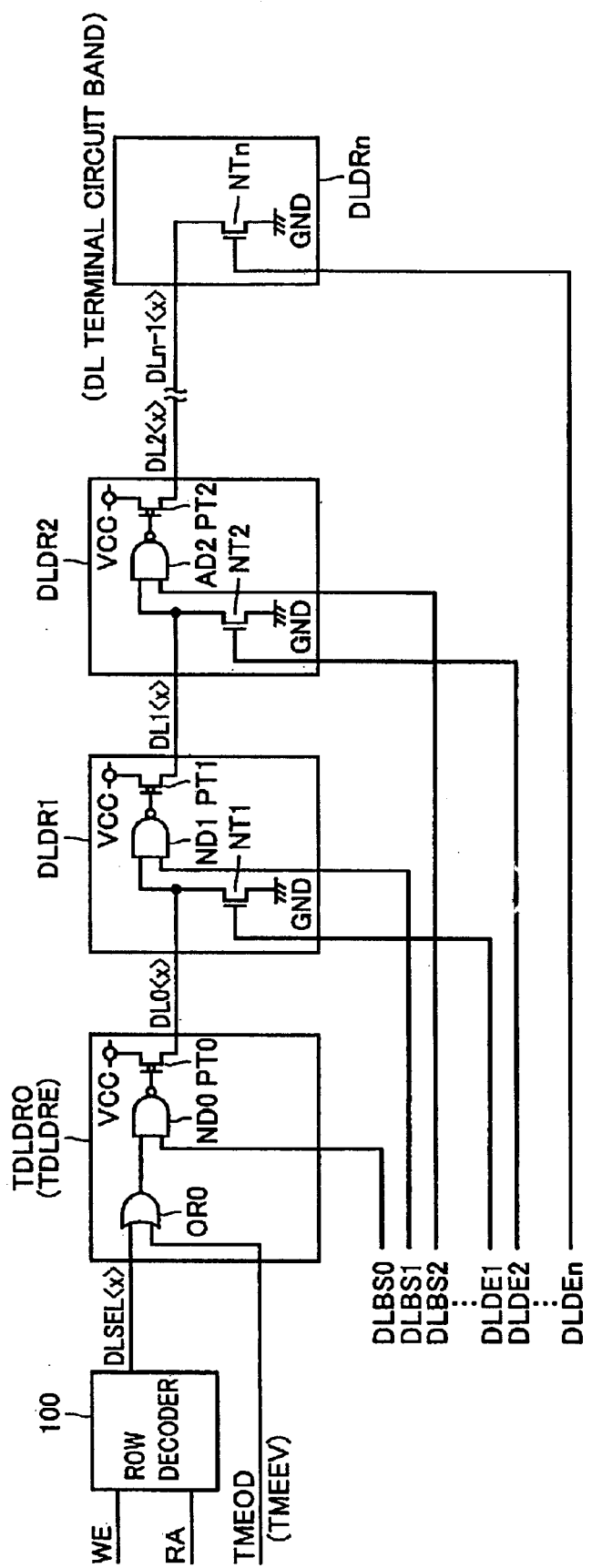
FIG. 19 is a conceptual diagram of row selection circuitry included in an MRAM device according to a modification of the fifth embodiment of the present invention.

As shown in FIG. 19, exemplarily a digit line driver group is provided corresponding to an odd row in row selection circuitry of the modification of fifth embodiment.

Row selection circuitry of the modification of the fifth embodiment is different from that of the fifth embodiment in FIG. 16 in that digit line driver TDLDR is replaced with digit line driver TDLDRO. Digit line driver TDLDRO is activated in response to a test mode enable signal TMEOD in the test mode. In other words, every digit line driver group corresponding to the odd rows is activated.

Digit line drivers corresponding to the even rows are different from those corresponding to the odd rows in that digit line driver TDLDRO is replaced with a digit line driver TDLDRE, as shown in parentheses. Digit line driver TDLDRE is activated in response to a test mode enable signal TMEEV in the test mode. In other words, every digit line driver group corresponding to the even rows is activated.

By applying either test mode enable signal TMEOD or TMEEV corresponding to the odd rows and even rows, digit lines of the odd rows and digit lines of the even rows can be independently subjected to stress. As a result, detection of process defects between digit lines of each row can be conducted at a time.

Note that, although OR circuit OR0 is herein added to digit line driver DLDR0 in the row selection circuitry of the first embodiment, such a structure is also applicable to the second, third and fourth embodiments.

(Sixth Embodiment)

In MRAM device 1 of the first to fifth embodiments, digit lines are independently provided in each memory block in order to ensure a sufficient data write current for each digit line of each memory block in a large-capacity memory array. Moreover, a driver is provided for each digit line.

In the following embodiments, a memory array is divided into a plurality of memory blocks, and digit lines are shared while ensuring a sufficient data write current.

Figure 20:
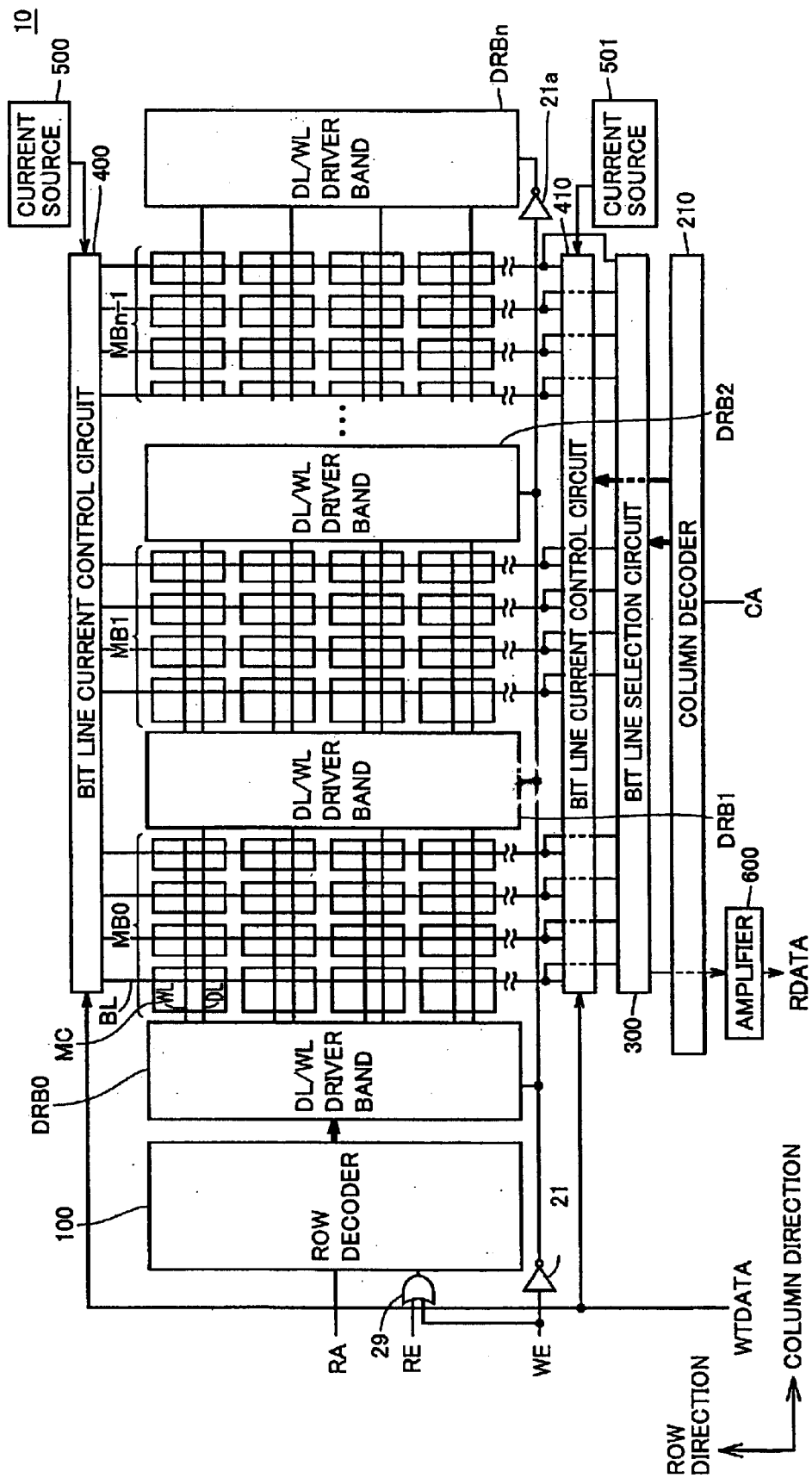
FIG. 20 shows the overall structure of an MRAM device according to a sixth embodiment of the present invention.

Referring to FIG. 20, an MRAM device 10 of the sixth embodiment is different from MRAM device 1 of FIG. 1 in that DL/WL driver bands DWDG0 to DWDGn are replaced with driver bands DRB0 to DRBn. Each driver band DRB0 to DRBn−1 is controlled according to an inverted signal /WE of a write enable WE applied through an inverter 21. Driver band DRBn of the last stage is controlled according to write enable WE applied through inverters 21, 21a. Row decoder 100 outputs the row selection result in response to the OR operation result of an OR circuit 29 receiving a write enable WE and a read enable RE. Since the structure of MRAM device 10 is otherwise the same as that of MRAM device 1 of FIG. 1, description thereof will not be repeated.

Figure 21:
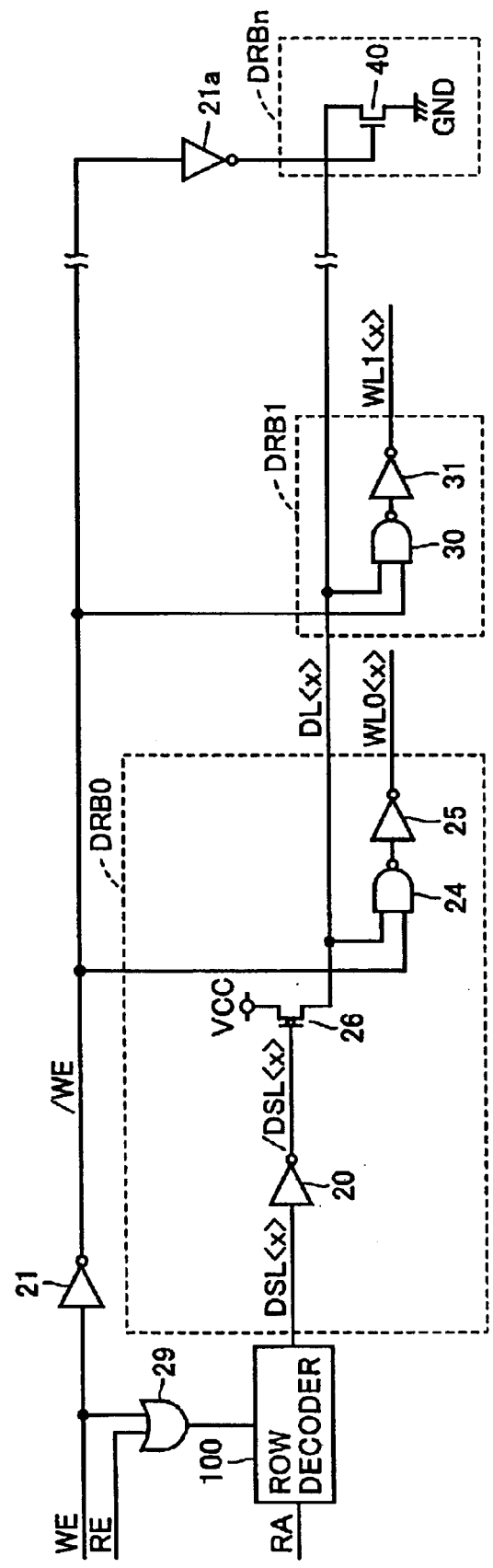
FIG. 21 is a conceptual diagram of row selection circuitry according to the sixth embodiment of the present invention.

Referring to FIG. 21, in row selection circuitry of the sixth embodiment, a digit line DL<x> is shared by memory blocks MB. Driver band DRB0 of the first stage drives the shared digit line DL<x>. Word lines WL in each memory block MB are respectively driven by driver bands DRB0 to DRBn−1 provided corresponding to memory blocks MB0 to MBn−1.

Driver band DRB0 includes inverters 20, 25, a transistor 26 and a NAND circuit 24.

Transistor 26 is provided between power supply voltage VCC and digit line DL<x>. Transistor 26 receives an inverted signal /DSL<x> of a row selection signal DSL<x> through an inverter 20, and electrically connects power supply voltage VCC to digit line DL<x>. NAND circuit 24 receives an inverted signal /WE of write enable WE through inverter 21 and a voltage signal on digit line DL<x>, and outputs the NAND operation result of the received signals to inverter 25. Inverter 25 activates a word line WL0<x> in response to the output signal of NAND circuit 24. Note that a P-channel MOS transistor is herein exemplarily used as transistor 26.

Driver bands DRB1 to DRBn−1 each drives a word line WL in a corresponding memory block. Since driver bands DRB1 to DRBn−1 have the same structure, driver band DRB1 will be described below.

Driver band DRB1 includes a NAND circuit 30 and an inverter 31.

NAND circuit 30 receives an inverted signal /WE of write enable WE through inverter 21 and a voltage signal on digit line DL<x>, and outputs the NAND operation result of the received signals to inverter 31. Inverter 31 activates a word line WL1<x> in response to the output signal of NAND circuit 30.

Driver band DRBn includes a transistor 40. Transistor 40 is provided between digit line DL<x> and ground voltage GND, and receives write enable WE through inverters 21, 21a at its gate. Note that an N-channel MOS transistor is herein exemplarily used as transistor 40.

Figure 22:
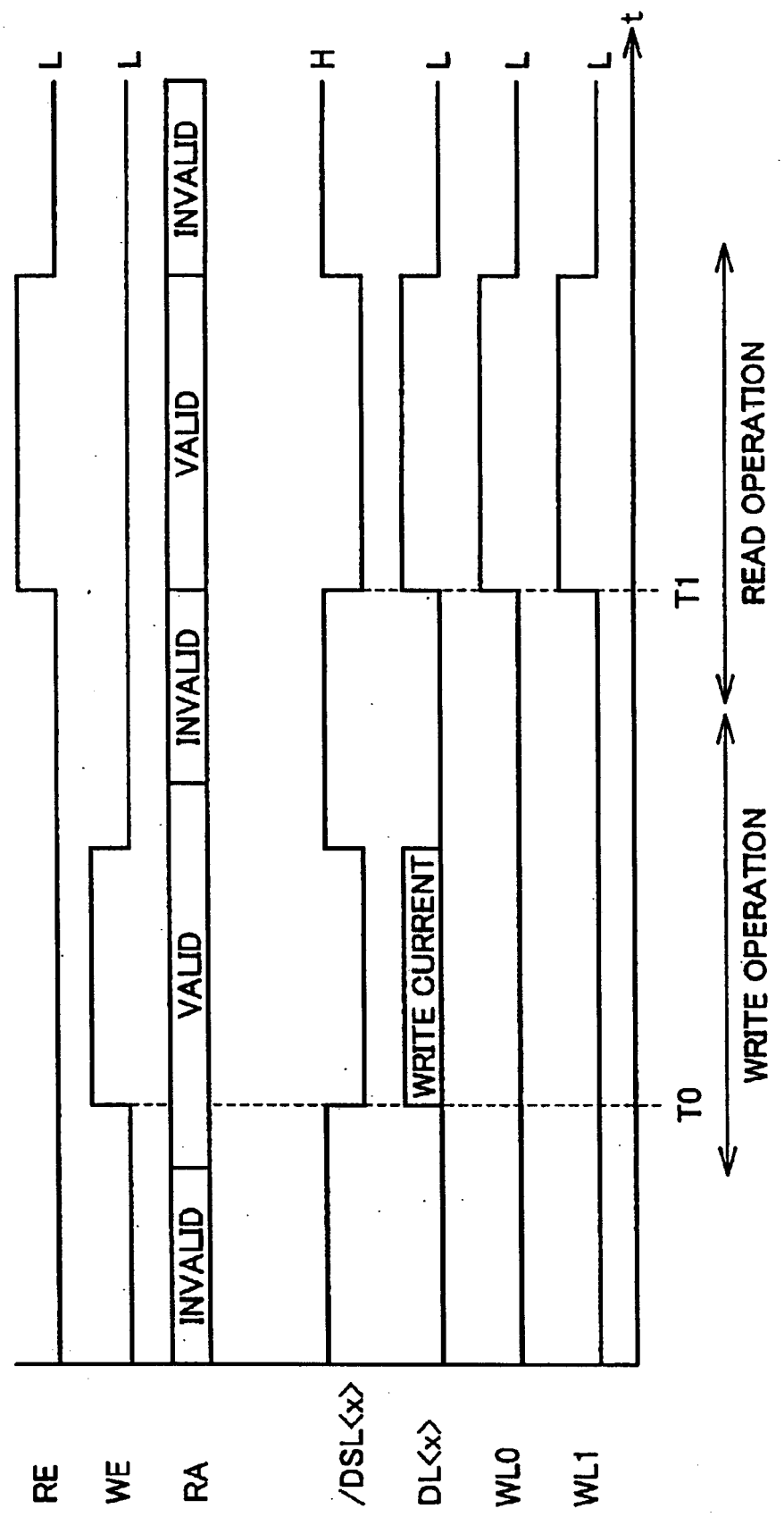
FIG. 22 is a timing chart illustration operation of the row selection circuitry according to the sixth embodiment of the present invention.

Hereinafter, operation of the row selection circuitry according to the sixth embodiment will be described with reference to the timing chart of FIG. 22.

First, data write operation will be described. In data write operation, a valid row address RA is applied to row decoder 100. At time T0, write enable WE is set to "H" level. Row decoder 100 sets a row selection signal DSL<x> to "H" level based on the OR operation result ("H" level) of OR circuit 29 and valid address RA. Accordingly, an inverted signal /DSL<x> of row selection signal DSL<x> applied through inverter 20 is set to "L" level.

In response to this, transistor 26 is turned ON, and power supply voltage VCC is electrically coupled to one end of digit line DL<x>. Transistor 40 in driver band DRBn is turned ON in response to write enable WE ("H" level) received through inverters 21, 21a, whereby ground voltage GND is electrically coupled to the other end of digit line DL<x>. As a result, a data write current is supplied to digit line DL<x>, whereby data write operation is conducted.

Hereinafter, data read operation will be described. At time T1 in data read operation, read enable RE is set to "H" level. On the other hand, write enable WE is set to "L" level. Accordingly, transistor 40 included in driver band DRBn, a terminal circuit, is turned OFF, whereby the other end of digit line DL<x> is electrically disconnected from ground voltage GND (this state is also referred to as "open state").

If a valid row address RA is applied to row decoder 100 at time T1, row decoder 100 sets a row selection signal DSL<x> to "H" level based on the OR operation result ("H" level) of OR circuit 29 and valid row address RA. As a result, an inverted signal /DSL<x> of row selection signal DSL<x> applied through inverter 20 is set to "H" level. Accordingly, transistor 26 is turned ON, whereby one end of digit line DL<x> is electrically connected to power supply voltage VCC. Since the other end of digit line DL<x> is in the open state, the voltage level of digit line DL<x> is set to "H" level.

NAND circuit 24 receives inverted signal /WE ("H" level) of write enable WE through inverter 21 and the voltage level ("H" level) of digit line DL<x>, and outputs the NAND operation result of the received signals as "L" level. In response to this, inverter 25 activates word line WL0<x> ("H" level).

In the row selection circuitry of the sixth embodiment, the digit lines are shared by each memory block. This enables reduction in the number of circuits for driving the digit lines.

A digit line DL is used as a current line in data write operation. In data read operation, however, a digit line DL is used as a signal line in order to activate a word line WL. This eliminates the need to provide signal lines for providing an instruction to activate a word line WL. In other words, this structure suppresses increase in layout caused by increase in the number of wiring layers corresponding to the signal lines. As a result, the area of the MRAM device can be reduced.

Note that, in the above description, the memory array is divided into a plurality of memory blocks and a digit line DL is used as a signal line for providing an instruction to activate a word line WL. However, the sixth embodiment is also applicable to the structure in which the memory array is not divided.

(Seventh Embodiment)

The structure for reducing power consumption in data read operation will be described in the seventh embodiment of the present invention.

Figure 23:
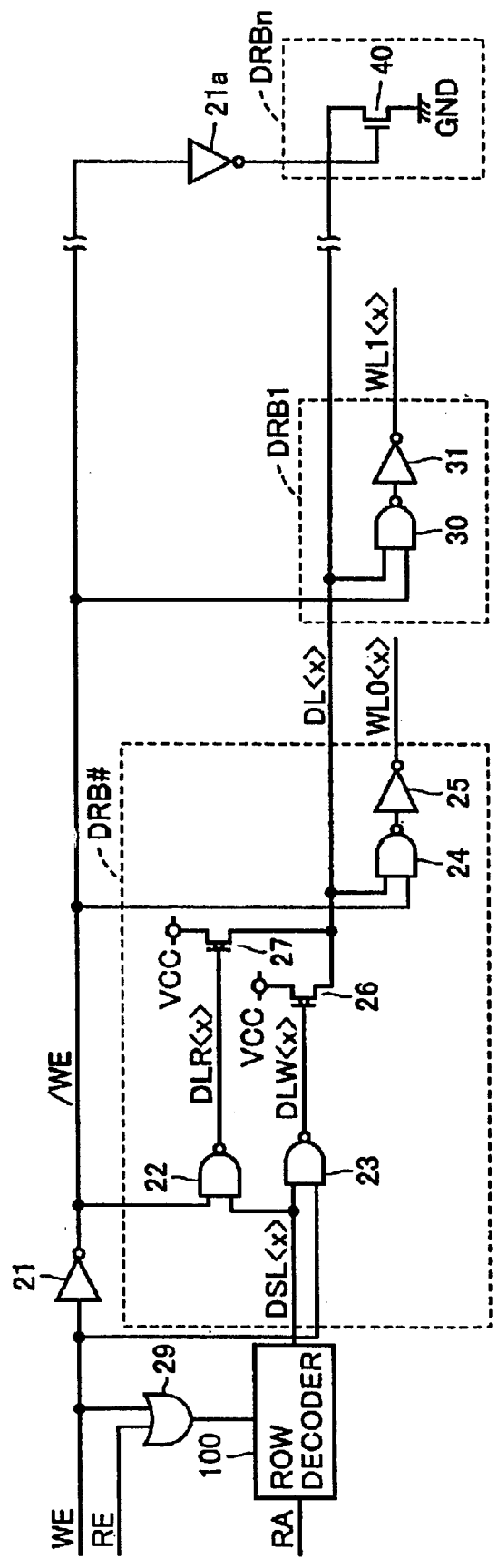
FIG. 23 is a conceptual diagram of row selection circuitry according to a seventh embodiment of the present invention.

Referring to FIG. 23, row selection circuitry of the seventh embodiment is different from that of the sixth embodiment in FIG. 21 in that driver band DRB0 is replaced with a driver band DRB#. Since the row selection circuitry of the seventh embodiment is otherwise the same as the sixth embodiment, description thereof will not be repeated.

Driver band DRB# includes NAND circuits 22, 23, 24, an inverter 25, and transistors 26, 27.

NAND circuit 22 receives a row selection signal DSL<x> and an inverted signal /WE of a write enable WE through inverter 21, and outputs the NAND operation result of the received signals as a read selection signal DLR<x>. Transistor 27 is provided between power supply voltage VCC and digit line DL<x>, and receives read selection signal DLR<x> at its gate. NAND circuit 23 receives write enable WE and row selection signal DSL<x>, and outputs the NAND operation result of the received signals as a write selection signal DLW<x>. Transistor 26 is provided between power supply voltage VCC and digit line DL<x>, and receives write selection signal DLW<x> at its gate. Since NAND circuit 24 and inverter 25 for driving word line WL are connected in the same manner as that shown in FIG. 21, description thereof will not be repeated. Note that P-channel MOS transistors are herein exemplarily used as transistors 26, 27. Transistor 27 has a smaller channel width, that is, lower current driving capability, than that of transistor 26.

Figure 24:
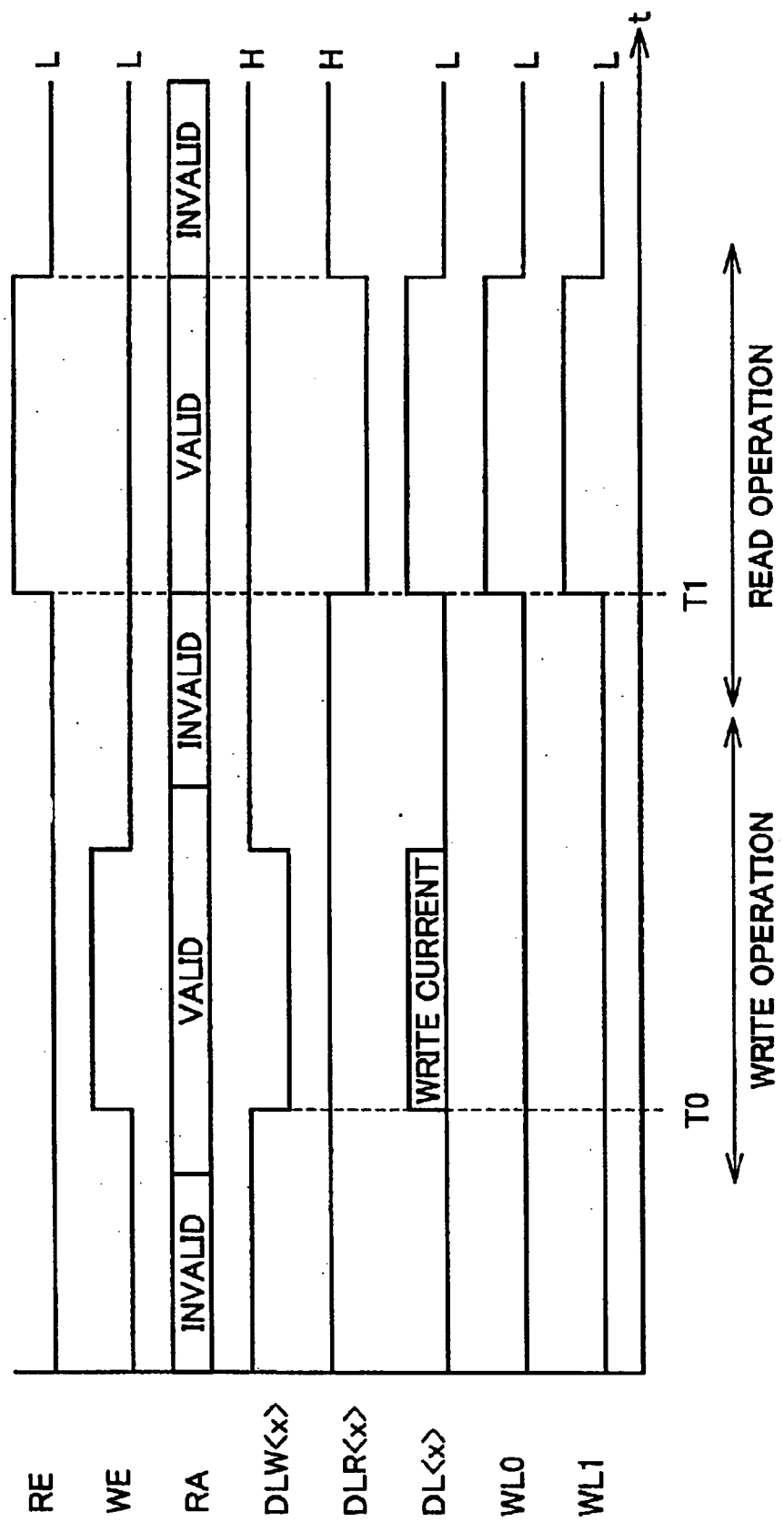
FIG. 24 is a timing chart illustration operation of the row selection circuitry according to the seventh embodiment of the present invention.

Hereinafter, operation of the row selection circuitry of the seventh embodiment will be described with reference to the timing chart of FIG. 24.

First, data write operation will be described. In data write operation, a valid row address RA is applied to row decoder 100. At time T0, write enable WE is set to "H" level. Row decoder 100 sets row selection signal DSL<x> to "H" level based on the OR operation result ("H" level) of OR circuit 29 and valid row address RA. Accordingly, NAND circuit 23 sets its output signal, i.e., write selection signal DLW<x>, to "L" level. The other NAND circuit 22 sets read selection signal DLR<x> to "H" level. Accordingly, transistor 26 is turned ON, and transistor 27 is turned OFF. As a result, transistor 26 electrically couples one end of digit line DL<x> to power supply voltage VCC.

Driver band DRBn, a terminal circuit, turns ON transistor 40 in response to write enable WE, whereby the other end of digit line DL<x> is electrically coupled to ground voltage GND. As a result, a data write current is supplied to digit line DL<x>.

Hereinafter, data read operation will be described. In data read operation, read enable RE is set to "H" level, and write enable "WE" is set to "L" level. In response to write enable WE, driver band DRBn, a terminal circuit, sets a digit line DL to the open state, as described above. In other words, digit line DL serves as a signal line, as described above. If a valid row address RA is applied to row decoder 100 at time T1, row decoder 100 sets a row selection signal DSL<x> to "H" level based on the OR operation result ("H" level) of OR circuit 29 and valid row address RA. Accordingly, NAND circuit 22 sets a read selection signal DLR<x> to "L" level. As a result, transistor 27 is turned ON, whereby digit line DL<x> is electrically coupled to power supply voltage VCC.

NAND circuit 24 included in driver band DRB# of the first stage receives an inverted signal /WE of write enable WE and a voltage signal on digit line DL<x>, and outputs the NAND operation result of the received signals to inverter 25. Inverter 25 inverts the output signal of NAND circuit 24 and activates word line WL0<x>.

In this case, the output signal of NAND circuit 24 is at "L" level, and inverter 25 activates word line WL0<x>. Similarly, driver bands DRB1 to DRBn−1 corresponding to memory blocks WL1<x> to WLn−1<x> activate corresponding word lines WL1<x> to WLn−1<x> to "H" level, respectively.

A driver transistor to be driven is thus switched between data write operation and data read operation. More specifically, in data write operation, transistor 26 having higher current driving capability is turned ON to supply a sufficient data write current to a digit line. In data read operation, however, digit line DL does not serve as a current line but as a signal line. Therefore, driver transistor 27 having lower current driving capability is turned ON.

With this structure, a transistor to be operated is switched between data write operation and data read operation, whereby power consumption is reduced. As a result, the overall power consumption of the MRAM device can be reduced.

(First Modification of Seventh Embodiment)

Figure 25:
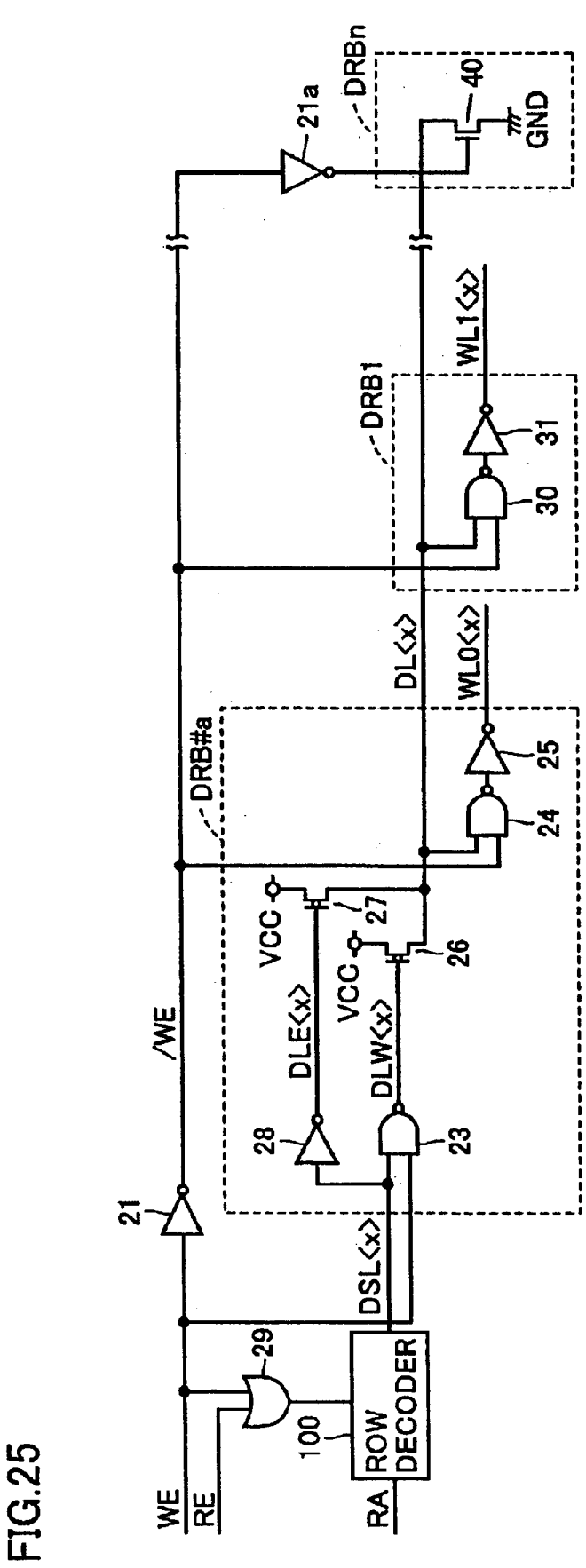
FIG. 25 is a conceptual diagram of row selection circuitry according to a first modification of the seventh embodiment of the present invention.

Referring to FIG. 25, row selection circuitry according to the first modification of the seventh embodiment is different from the row selection circuitry of FIG. 23 in that driver band DRB# is replaced with a driver band DRB#a.

Driver band DRB#a includes NAND circuits 23, 24, inverters 25, 28 and transistors 26, 27.

Driver band DRB#a is different from driver band DRB# in that the gate of transistor 27 does not receive the output signal of the NAND circuit but receives an inverted signal DLE<x> of a row selection signal through inverter 28. Since driver band DRB#a is otherwise the same as driver band DRB#, description thereof will not be repeated.

Figure 26:
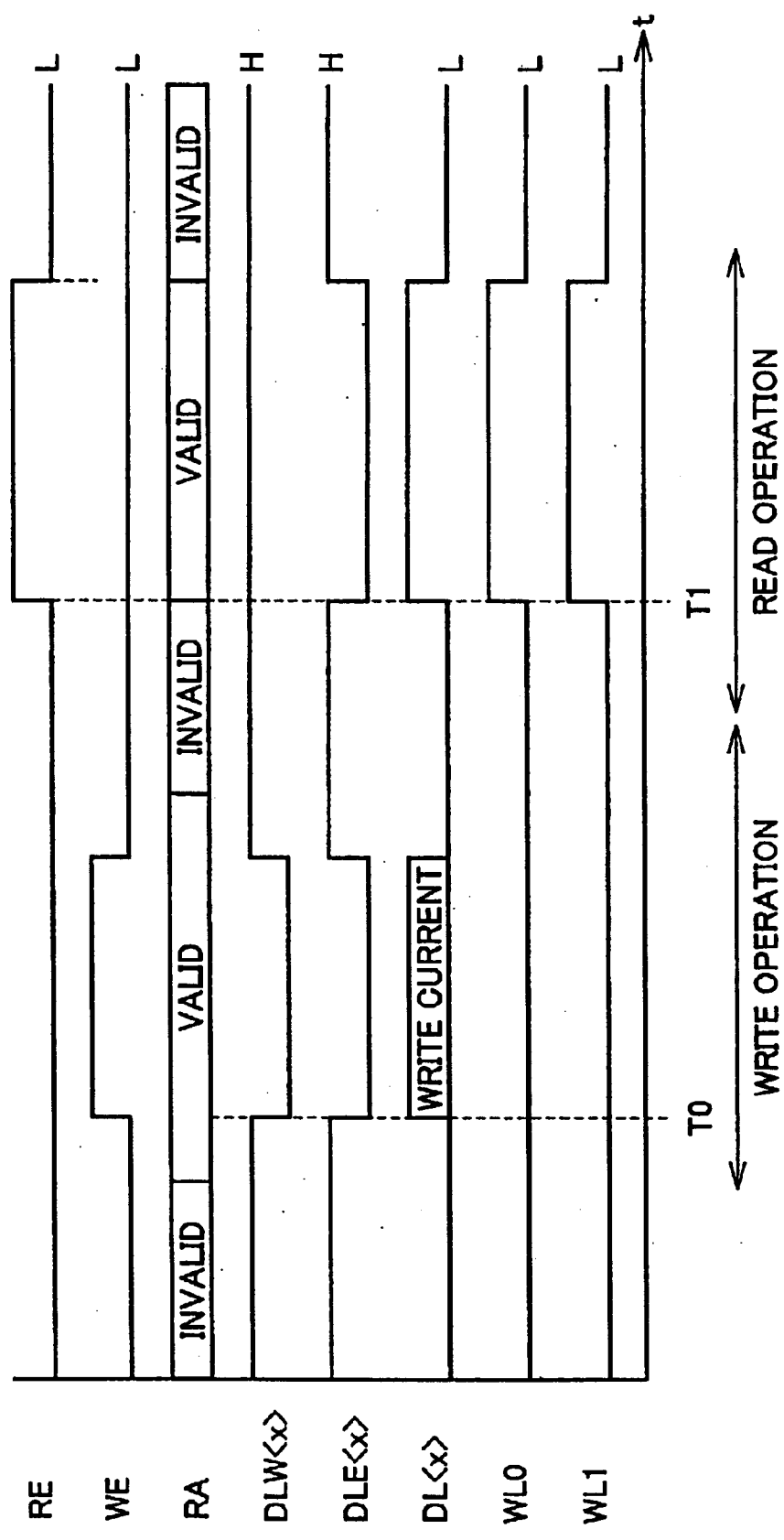
FIG. 26 is a timing chart illustration operation of the row selection circuitry according to the first modification of the seventh embodiment of the present invention.

Hereinafter, operation of the row selection circuitry according to the first modification of the seventh embodiment will be described with reference to the timing chart of FIG. 26.

First, data write operation will be described.

In data write operation, a valid row address RA is applied to row decoder 100. At time T0, write enable WE is set to "H" level. Row decoder 100 sets a row selection signal DSL<x> to "H" level based on the OR operation result ("H" level) of OR circuit 29 and valid row address RA. If write enable WE is activated to "H" level at time T0, NAND circuit 23 activates its NAND operation result, that is, a write selection signal DLW<x> to "L" level. In response to this, transistor 26 electrically couples power supply voltage VCC to digit line DL<x>. Transistor 27 is turned ON in response to an inverted signal DLE<x> ("L" level) of row selection signal DSL<x> received through inverter 28. As a result, transistor 27 electrically couples power supply voltage VCC to digit line DL<x>. As described above, transistor 40 is turned ON in response to write enable WE, whereby the other end of digit line DL<x> is electrically coupled to ground voltage GND. Since two driver transistors 26, 27 are both turned ON in data write operation, a sufficient write current can be supplied to digit line DL<x>.

Hereinafter, data read operation will be described.

In data read operation, a valid row address RA is applied to row decoder 100. At time T1, read enable RE is set to "H" level. Row decoder 100 sets a row selection signal DSL<x> to "H" level based on the OR operation result ("H" level) of OR circuit 29 and valid row address RA. Since write enable WE is set to "L" level, the output signal of NAND circuit 23, that is, a write selection signal DLW<x>, is set to "H" level. Inverter 28 sets an inverted signal DLE<x> of row selection signal DSL<x> to "L" level.

Accordingly, in data read operation, only transistor 27 is turned ON, and power supply voltage VCC is electrically coupled to digit line DL<x>. As a result, the output signals of NAND circuits 24, 30 and the like are set to "L" level as described above, whereby corresponding word lines WL are activated. Data read operation is thus conducted.

According to the row selection circuitry of the first modification of the seventh embodiment, two transistors are both turned ON in data write operation. This enables a sufficient write current to be supplied to a digit line. In data read operation, only a transistor having lower current driving capability is turned ON. This enables reduction in power consumption.

(Second Modification of Seventh Embodiment)

Figure 27:
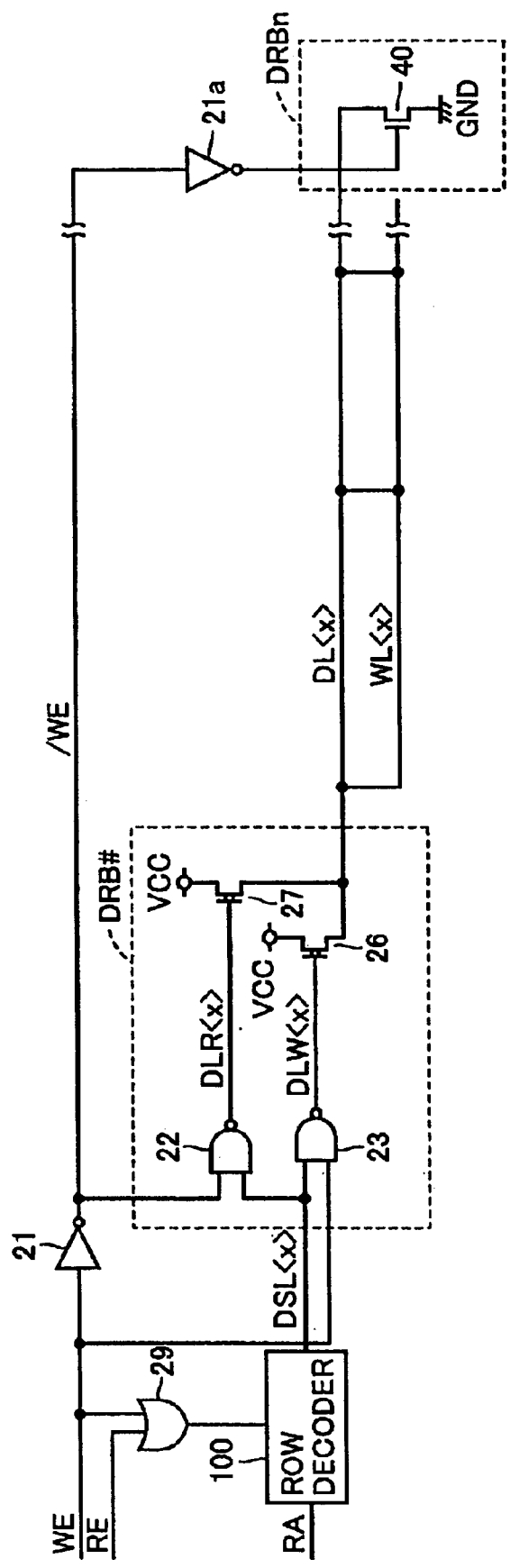
FIG. 27 is a conceptual diagram of row selection circuitry according to a second modification of the seventh embodiment of the present invention.

Referring to FIG. 27, row selection circuitry according to the second modification of the seventh embodiment is different from the row selection circuitry of FIG. 23 in that drivers for driving a word line WL, which are provided corresponding to memory blocks MB, are eliminated, and each word line WL is shared by the memory blocks and electrically coupled to a corresponding shared digit line by using a wiring.

Figure 28:
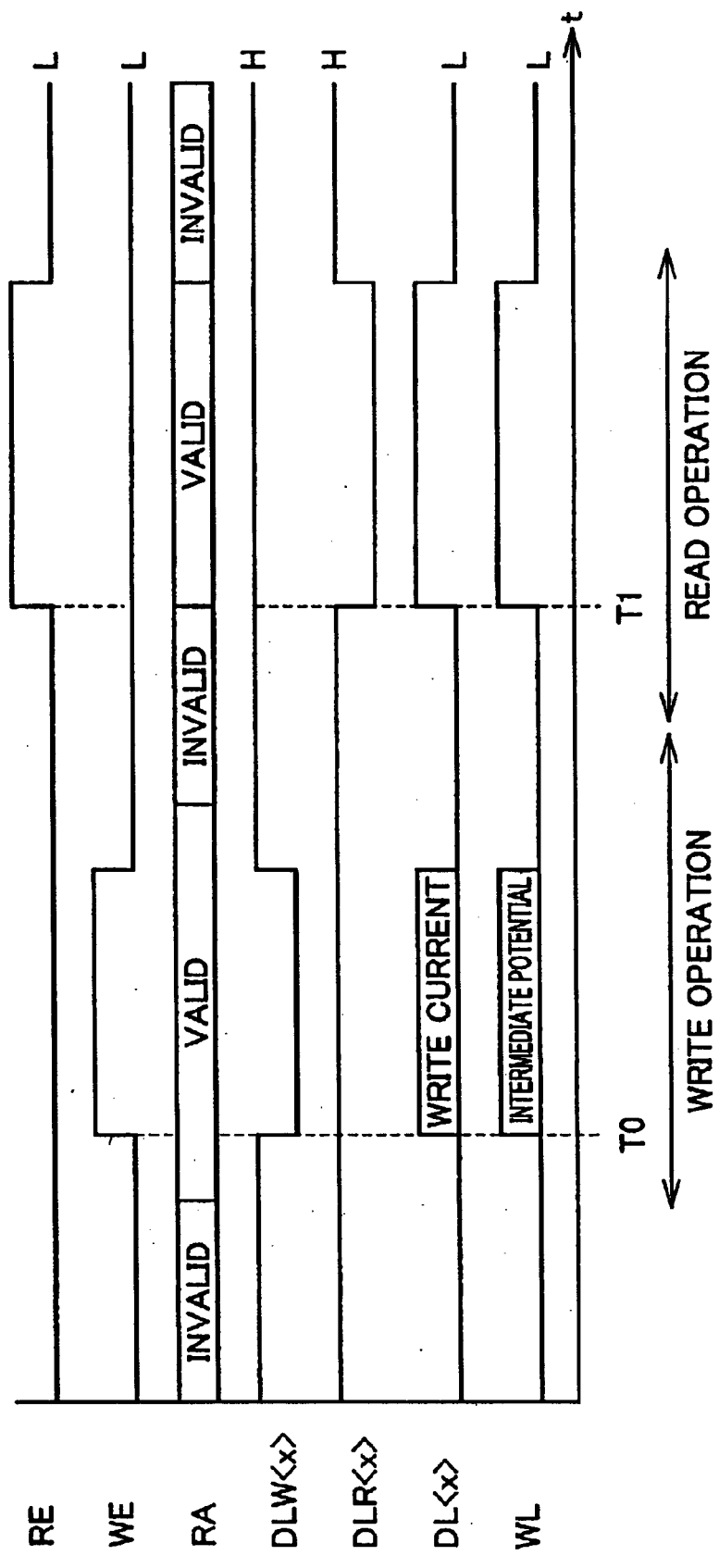
FIG. 28 is a timing chart illustration operation of the row selection circuitry according to the second modification of the seventh embodiment of the present invention.

Hereinafter, operation of the row selection circuitry according to the second modification of the seventh embodiment will be described with reference to the timing chart of FIG. 28.

First, data write operation will be described. In data write operation, a valid row address RA is applied to row decoder 100. At time T0, write enable WE is set to "H" level. Row decoder 100 sets a row selection signal DSL<x> to "H" level based on the OR operation result ("H" level) of OR circuit 29 and valid row address RA. NAND circuit 23 sets a write selection signal DLW<x> to "L" level. Accordingly, as described above, transistor 26 is turned ON, whereby power supply voltage VCC is electrically coupled to digit line DL<x>. As a result, a data write current is supplied to digit line DL<x>.

Word line WL<x> is electrically coupled to digit line DL<x>, and has an intermediate potential level. Accordingly, a transistor of each memory cell MC electrically coupled to word line WL<x> is not turned ON, and data read operation is not conducted.

Hereinafter, data read operation will be described. A valid row address RA is applied to row decoder 100. At time T1, read enable RE is set to "H" level. Row decoder 100 sets a row selection signal DSL<x> to "H" level based on the OR operation result ("H" level) of OR circuit 29 and valid row address RA. As described above, since write enable WE is at "L" level, the other end of digit line DL<x> is rendered in the open state. In other words, digit line DL<x> serves a signal line. NAND circuit 22 sets a read selection signal DLR<x> to "L" level in response to row selection signal DSL<x> ("H" level) and inverted signal /WE ("H" level) of write enable WE. As a result, driver transistor 27 is turned ON, whereby digit line DL<x> is electrically coupled to power supply voltage VCC. Accordingly, word line WL<x> electrically coupled to digit line DL<x> is activated to "H" level. As a result, data is read from a selected memory cell.

In the second modification of the seventh embodiment, a digit line is electrically coupled directly to a word line by using a wiring. This enables reduction in the number of elements in the circuitry for driving a word line, and thus enables reduction in layout area.

(Eighth Embodiment)

The structure for reducing the number of elements in the circuitry for driving a digit line and a word line is described in the sixth and seventh embodiments and the modifications thereof.

In the eighth embodiment, the structure for efficiently testing anti-erroneous writing of each MTJ memory cell will be described. Hereinafter, an operation test for evaluating the resistance to erroneous writing is referred to as "disturb test".

Figure 29:
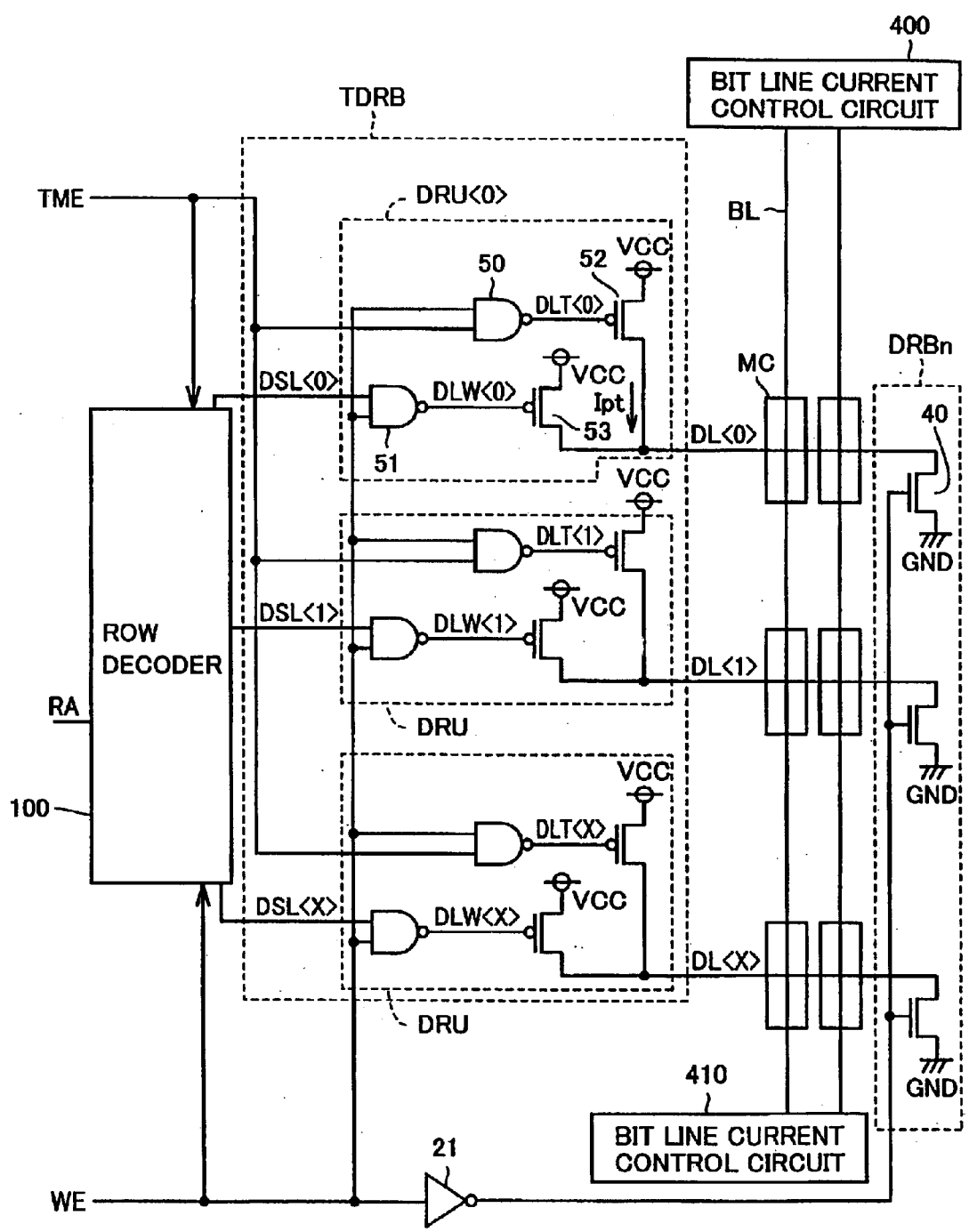
FIG. 29 is a conceptual diagram of row selection circuitry according to an eighth embodiment of the present invention.

Referring to FIG. 29, row selection circuitry of the eighth embodiment includes a row decoder 100, a driver band TDRB for driving digit lines DL<x> to DL<x> provided corresponding to the memory cell rows, and a driver band DRBn. In the row selection circuitry of the eighth embodiment, driver band DRB0 in FIG. 20 is replaced with driver band TDRB. Bit lines BL are provided corresponding to the memory cell columns. Bit line current control circuits 400, 410 control bit lines BL.

Note that the circuitry for driving a word line WL has the same structure as that described in FIG. 21, but is not shown in the present embodiment.

Driver band TDRB includes driver units DRU<0> to DRU<x> (hereinafter, sometimes generally referred to as driver units DRU). Driver units DRU<0> to DRU<x> are provided corresponding to digit lines DL<0> to DL<x>.

Since driver units DRU<0> to DRU<x> have the same structure, driver unit DRU<0> will be described below.

Driver unit DRU<0> includes NAND circuits 50, 51 and transistors 52, 53.

NAND circuit 51 receives a row selection signal DSL<0> and a write enable WE, and outputs the NAND operation result of the received signals to the gate of transistor 53. NAND circuit 50 receives a write enable WE and a test mode enable TME, and outputs the NAND operation result of the received signals to the gate of transistor 52. Transistor 52 is provided between power supply voltage VCC and digit line DL<0>, and receives a control signal DLT<0>, the output signal of NAND circuit 50, at its gate. Transistor 53 is provided between power supply voltage VCC and digit line DL<0>, and receives a write selection signal DLW<0>, the output signal of NAND circuit 51, at its gate. P-channel MOS transistors are herein exemplarily used as transistors 52, 53. Transistor 52 has lower current driving capability than that of transistor 53.

Figure 30:
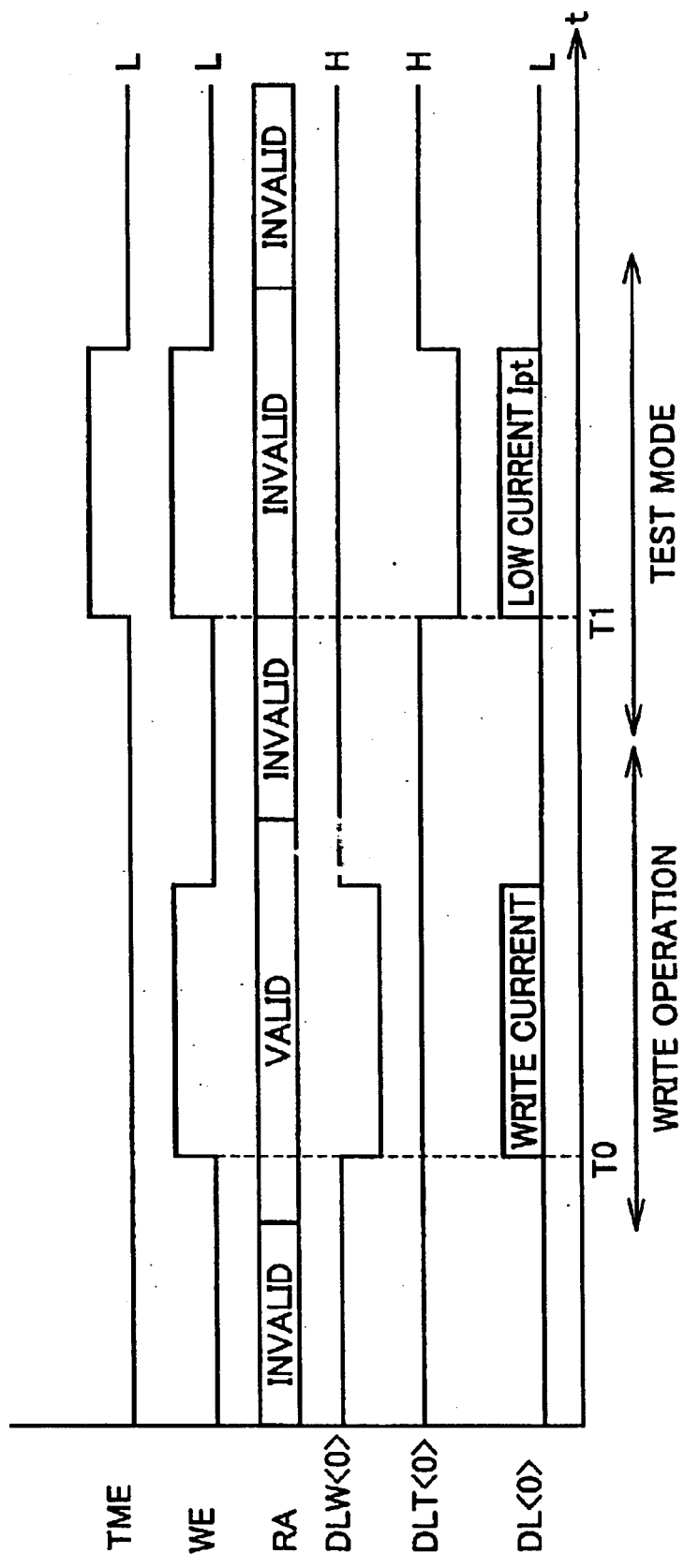
FIG. 30 is a timing chart illustration operation of the row selection circuitry according to the eighth embodiment of the present invention.

Hereinafter, data write operation of the row selection circuitry according to the eighth embodiment will be described with reference to the timing chart of FIG. 30.

In normal operation, test mode enable TME is set to "L" level. In data write operation, row decoder 100 sets a row selection signal DSL<x> to "H" level in response to a row address RA. At time T0, write enable WE is set to "H" level, and a driver unit DRU is selectively activated. For example, it is herein assumed that a row selection signal DSL<0> is set to "H" level according to row address RA. In this case, NAND circuit 51 sets a write selection signal DLW<0> to "L" level according to write enable WE and row selection signal DSL<0>. As a result, transistor 53 is turned ON, whereby digit line DL<0> is electrically coupled to power supply voltage VCC.

As described above, driver band DRBn of the last stage electrically couples the other end of each digit line DL to ground voltage GND in response to write enable WE. As a result, a write current is supplied to selected digit line DL<0>.

Hereinafter, a test mode will be described. At time T1, test mode enable TME is set to "H" level, and write enable WE is set to "H" level. As a result, NAND circuit 50 in, e.g., driver unit DRU<0> sets a control signal DLT<0> to "L" level according to test mode enable TME ("H" level) and write enable WE ("H" level). As a result, transistor 52 is turned ON, whereby digit line DL<0> is electrically coupled to power supply voltage VCC. In the other driver units DRU as well, digit line DL<x> is electrically coupled to power supply voltage VCC. Since a transistor which is turned ON in the test mode has a smaller size than that of a normal driver transistor, a data write current Ipt supplied to each digit line DL is lower than a data write current supplied in normal operation.

In this state, a data write current is supplied to a selected bit line BL by using bit line current control circuits 400, 410.

Figure 47:
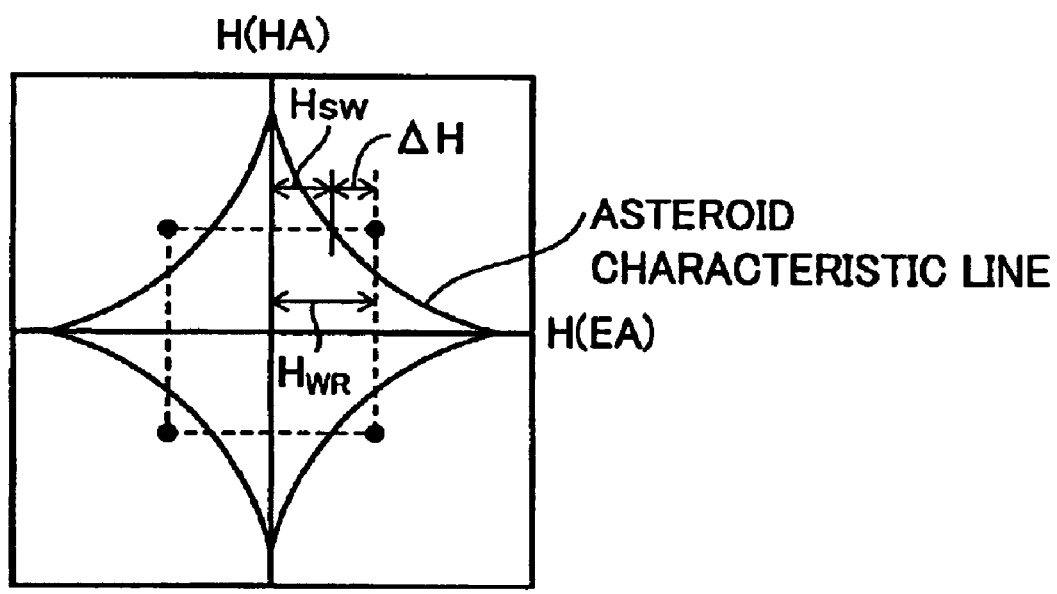
FIG. 47 is a conceptual diagram illustrating the relation between a data write current and a magnetization direction of a tunneling magneto-resistance element in data write operation.
Figure 48:
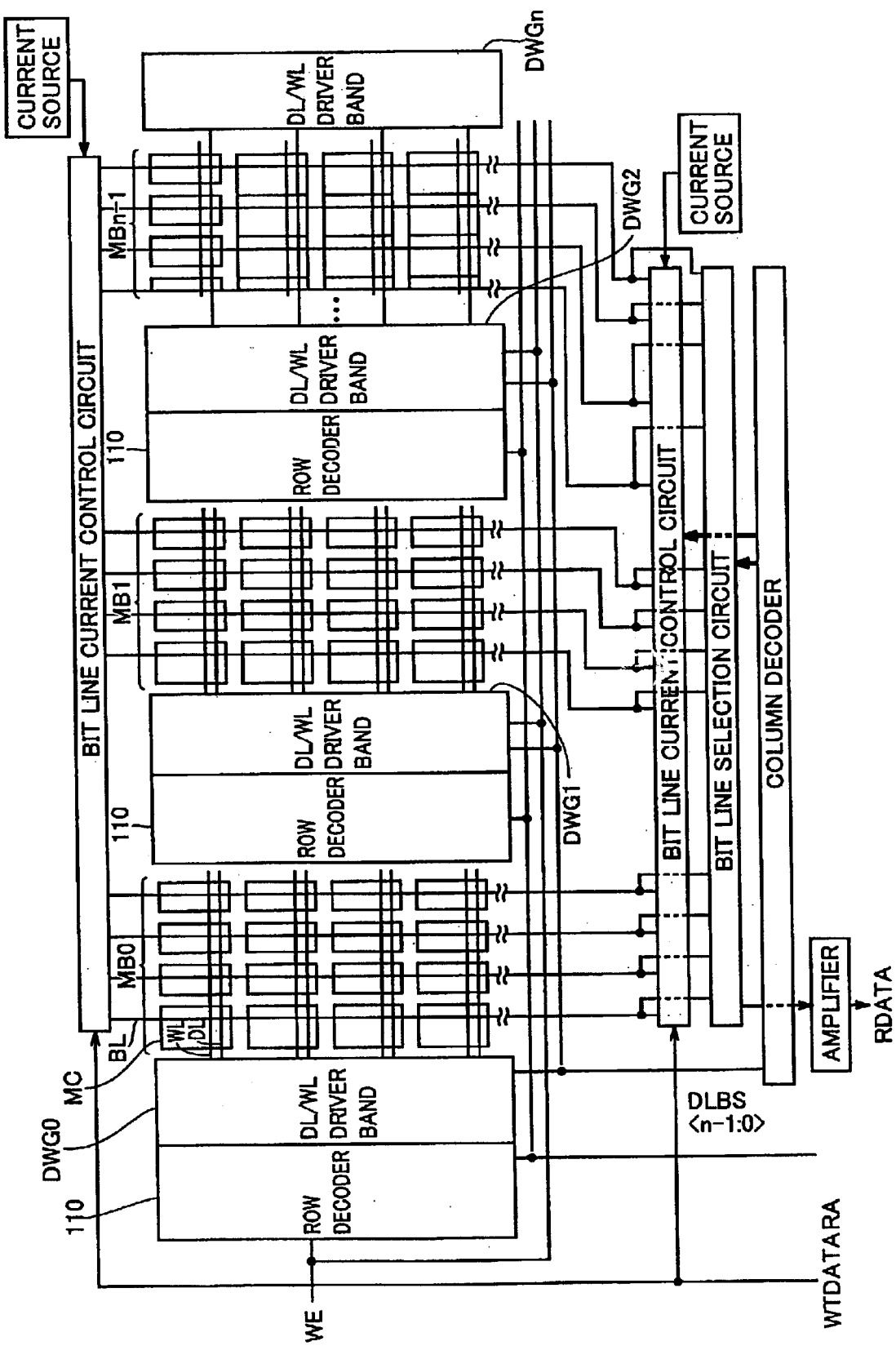
FIG. 48 shows the overall structure of an MRAM device 1 integrating MTJ memory cells arranged in a matrix.
Figure 49:
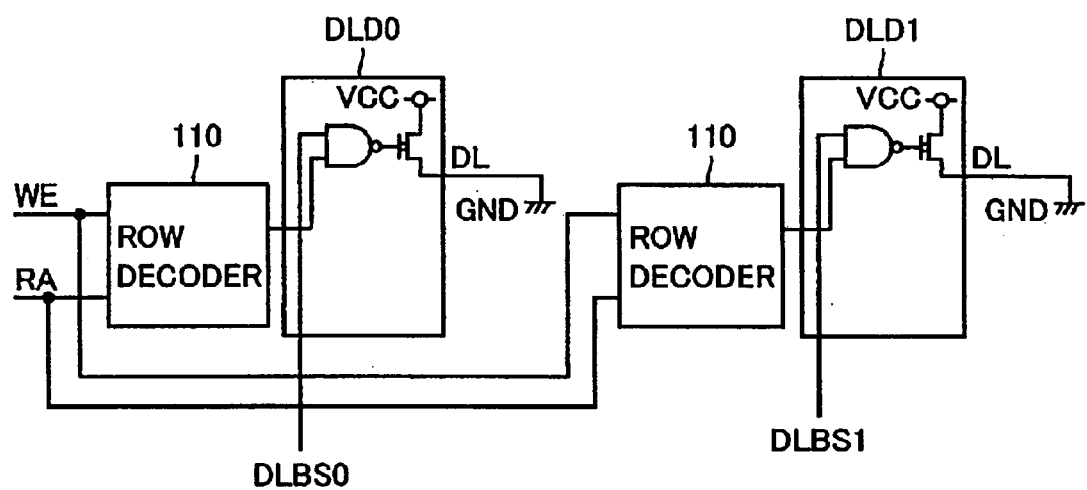
FIG. 49 is a conceptual diagram of row selection circuitry having a row decoder 110 provided for each DL/WL driver band.

A regular data write current supplied to each digit line is set to the level capable of applying, in combination with a data write current flowing through a bit line, a data write magnetic field corresponding the region outside the asteroid characteristic line of FIG. 47 to a magnetic tunnel junction MTJ. On the other hand, the level of a data write current Ipt in the test mode is adjusted so that a data write magnetic field which is applied to a magnetic tunnel junction MTJ by combination of an intermediate data write current Ipt in the test mode and a regular data write current flowing through a bit line corresponds to the region inside the asteroid characteristic line.

In the disturb test, anti-erroneous writing of each MTJ memory cell is tested by supplying an intermediate data write current Ipt having a level at which data write operation is theoretically impossible, and checking if storage data in each MTJ memory cell is updated in response to intermediate data write current Ipt. In other words, the strength of disturb characteristics of each memory cell is tested in the disturb test.

A memory cell having weak disturb characteristics inverts storage data as a result of the disturb test. Defective memory cells having weak disturb characteristics can thus be detected.

In the eighth embodiment, the disturb test of each MTJ memory cell can be conducted by supplying a data write current Ipt to the memory cells of the same column in parallel. This enables reduction in time required for the disturb test.

(Modification of Eighth Embodiment)

Figure 31:
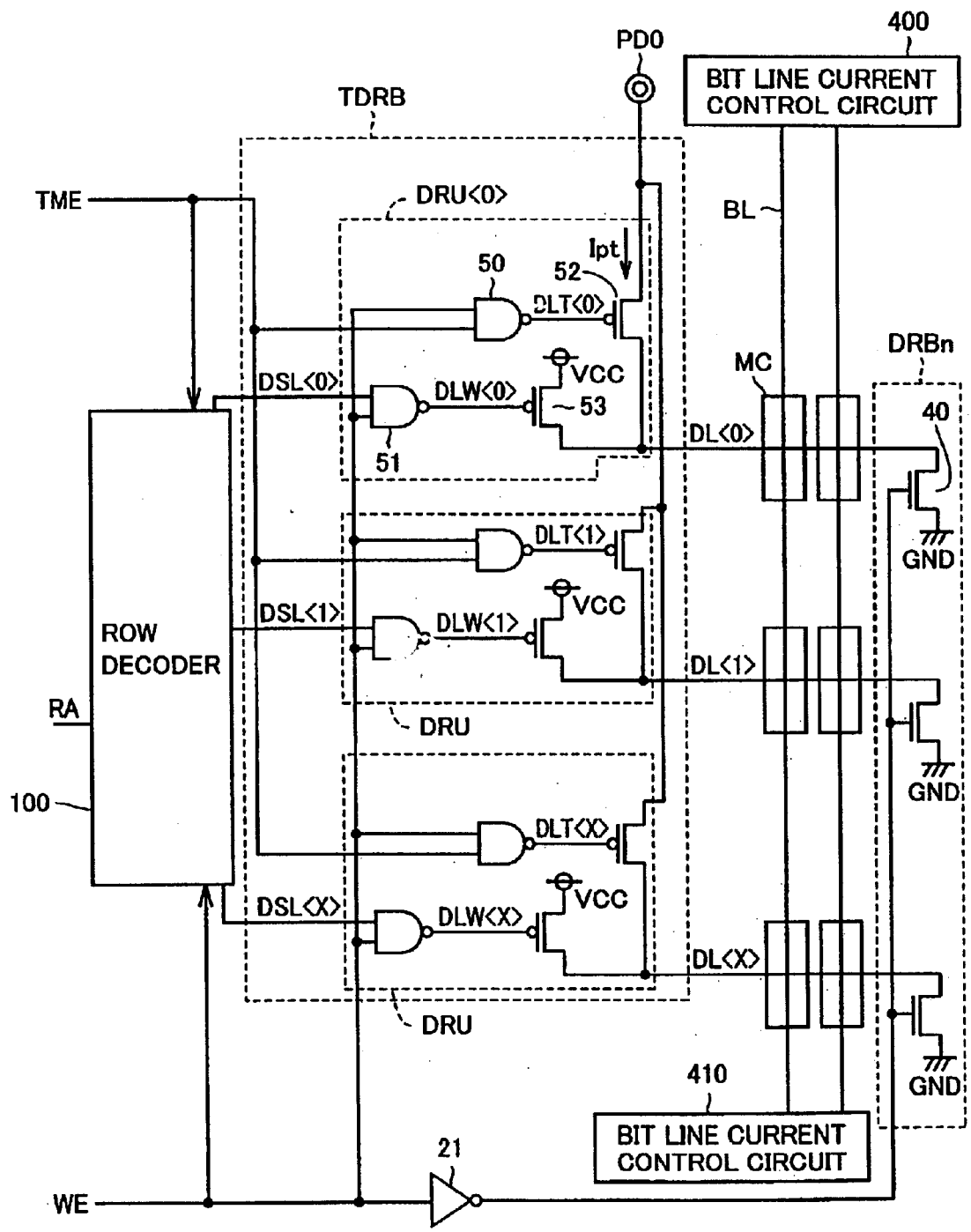
FIG. 31 is a conceptual diagram of row selection circuitry according to a modification of the eighth embodiment of the present invention.

Referring to FIG. 31, row selection circuitry according to the modification of the eighth embodiment is different from the row selection circuitry of FIG. 29 in that an external pad PD0 for receiving an external power supply voltage is further provided.

For example, driver unit DRU0 included in driver band TDRB electrically couples external pad PD0 to digit line DL<x> in test operation. External pad PD0 receives a voltage which is adjustable from the outside. The same applies to the other driver units.

According to the row selection circuitry of the modification of the eighth embodiment, a power supply voltage for testing is supplied from the external pad in the test operation, whereby the amount of data write current Ipt supplied to each digit line DL can be adjusted.

By finely adjusting data write current Ipt, the disturb test can be conducted with further improved accuracy.

(Ninth Embodiment)

In the ninth embodiment, the circuit structure capable of being used in a burn-in test for efficiently testing for defective digit lines DL and defective wirings between digit lines DL will be described.

Figure 32:
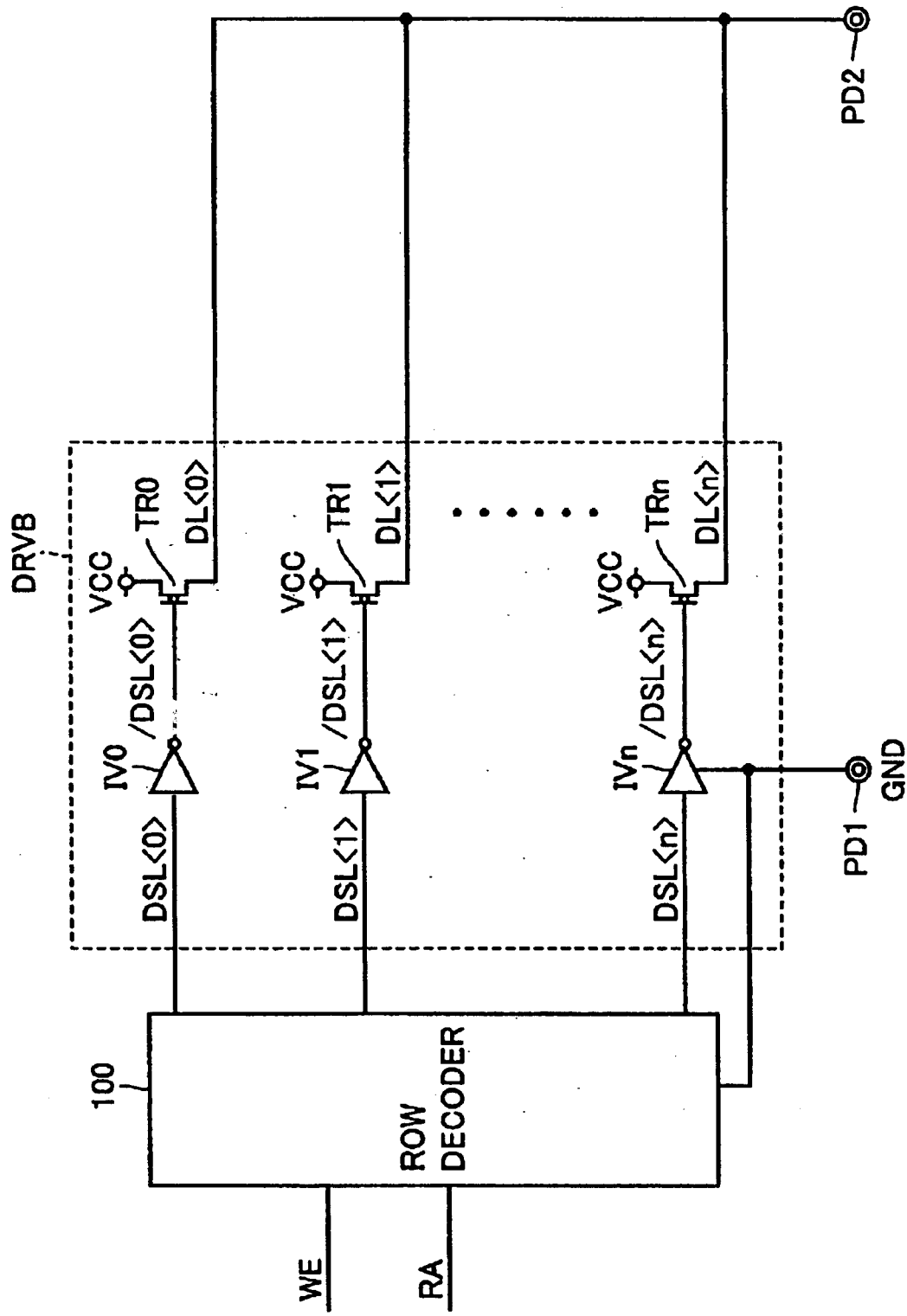
FIG. 32 is a conceptual diagram of row selection circuitry according to a ninth embodiment of the present invention.

Referring to FIG. 32, row selection circuitry of the ninth embodiment includes a row decoder 100, a driver band DRVB, and external pads PD1, PD2. In the row selection circuitry of the ninth embodiment, driver band DRB0 in FIG. 20 is replaced with driver band DRVB. Note that, driver band DRBn, a terminal circuit shown in FIG. 20, is eliminated in the row selection circuitry of the ninth embodiment. Driver bands DRB1 to DRBn–1 for driving a word line have the same structure as that described in FIG. 21, but are not shown in the present embodiment.

Row decoder 100 receives a row address RA and a write enable WE, and outputs a row selection signal DSL indicating the row selection result to driver band DRVB. Driver band DRVB supplies a data write current by selectively electrically coupling a digit line DL<0> to DL<n> to power supply voltage VCC according to the row selection result from row decoder 100.

Driver band DRVB includes inverters IV0 to IVn and transistors TR0 to TRn. Transistors TR0 to TRn are provided between digit lines DL<0> to DL<n> and power supply voltage VCC, respectively. The gates of transistors TR0 to TRn receive inverted signals of row selection signals DSL<0> to DSL<n> through inverters IV0 to IVn, respectively.

The circuits and the like provided in row decoder 100 and driver band DRVB are electrically coupled to common external pad PD1 for receiving ground voltage GND. The other end of each digit line DL, which is electrically coupled to ground voltage GND, is electrically coupled to external pad PD2. In other words, ground voltage GND electrically coupled to the other end of each digit line DL and ground voltage GND used in the other circuits are independently supplied using two external pads.

Figure 33:
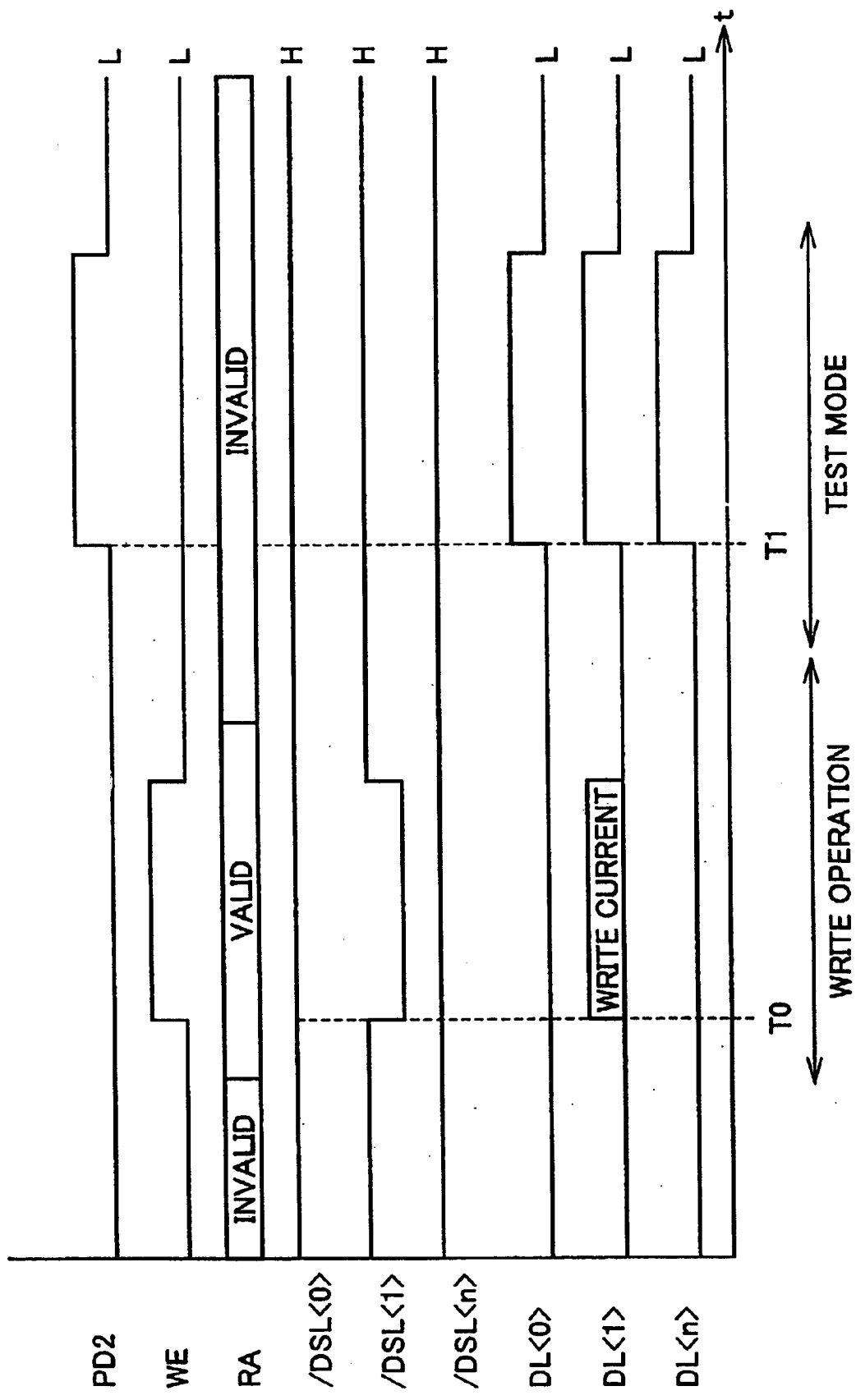
FIG. 33 is a timing chart illustration operation of the row selection circuitry according to the ninth embodiment of the present invention.

Hereinafter, operation of the row selection circuitry according to the ninth embodiment will be described with reference to the timing chart of FIG. 33.

First, data write operation will be described. It is herein assumed that digit line DL<1> is selected.

In data write operation, row decoder 100 sets a row selection signal DSL<1> indicating the row selection result to "H" level at time T0 according to a valid row address RA and write enable WE at "H" level. An inverted signal /DSL<1> of row selection signal DSL<1> applied through inverter IV1 is set to "L" level. In response to this, transistor TR1 electrically couples power supply voltage VCC to digit line DL<1>. Normally, external pad PD2 is electrically coupled to ground voltage GND. Accordingly, a data write current is supplied to selected digit line DL<1>.

Hereinafter, a test mode will be described. In test operation, a high external power supply voltage is supplied to external pad PD2 instead of ground voltage GND at time T1. No valid address RA is applied to row decoder 100, and driver band DRVB is inactive. Since the other end of each digit line DL is electrically coupled to common external pad PD2, a high voltage is applied from external pad PD2 to each digit line DL. In this way, a high voltage can be applied to digit lines DL in parallel, whereby a defect acceleration test (so-called burn-in test) of the digit lines can be conducted. Moreover, since a high voltage can be applied to digit lines DL in parallel, the defect acceleration test can be efficiently conducted with reduced time.

Note that the burn-in test according to a basic example of the ninth embodiment is also applicable to the structure of first and second modifications of the ninth embodiment described below.

(First Modification of Ninth Embodiment)

Figure 34:
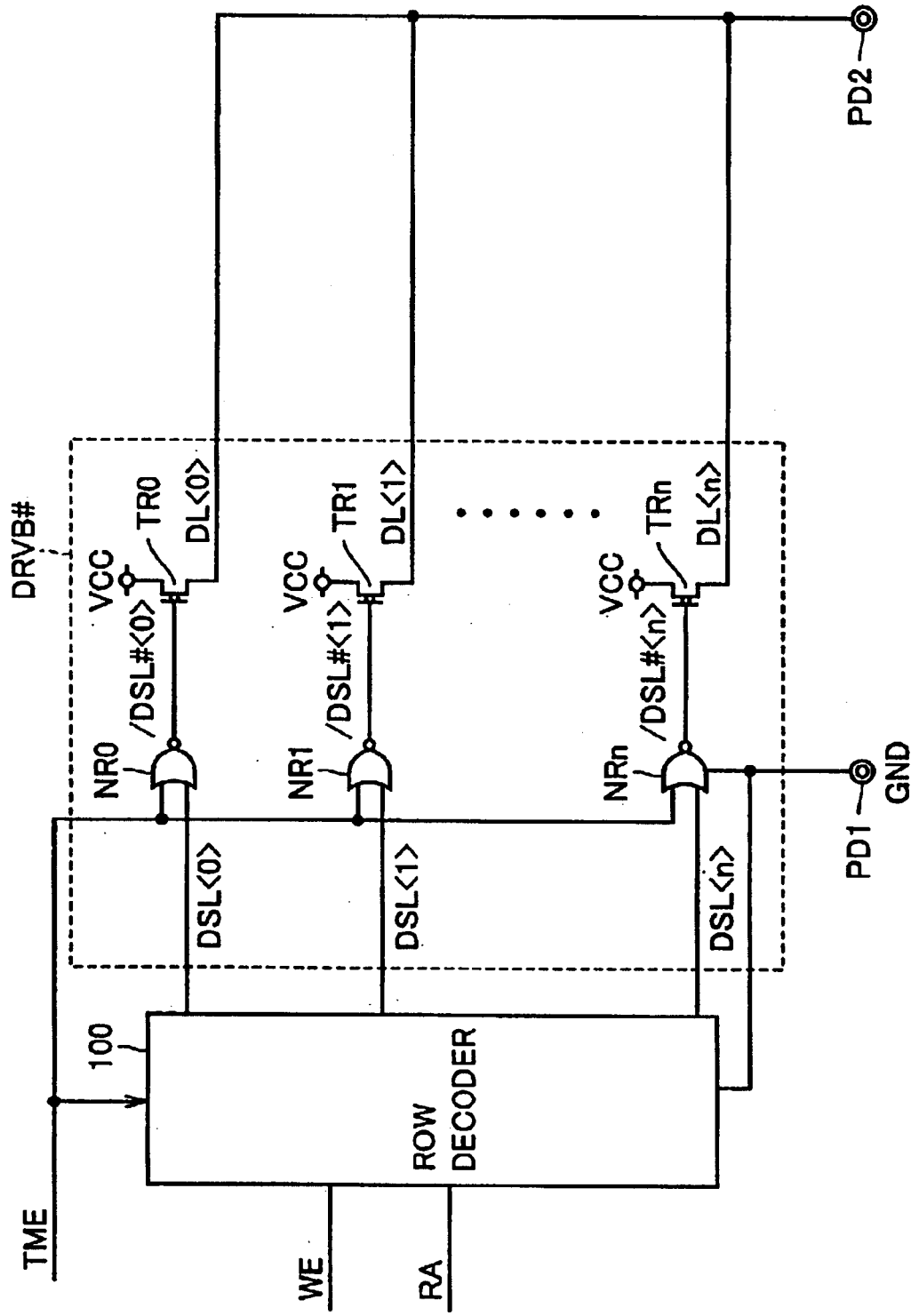
FIG. 34 is a conceptual diagram of row selection circuitry according to a first modification of the ninth embodiment of the present invention.

Referring to FIG. 34, row selection circuitry according to the first modification of the ninth embodiment is different from the row selection circuitry of FIG. 32 in that driver band DRVB is replaced with a driver band DRVB#.

Driver band DRVB# includes NOR circuits NR0 to NRn and transistors TR0 to TRn.

Transistors TR0 to TRn receive the output signals of NOR circuits NR0 to NRn at their gates, respectively.

NOR circuit NRx receives a corresponding row selection signal DSL<x> and a test mode enable TME, and outputs the NOR operation result of the received signals to a corresponding transistor TRx as a control signal /DSL#. Transistor TRx electrically couples power supply voltage VCC to a corresponding digit line DL<x> according to control signal /DSL#. Since the same applies to the other NOR circuits, description thereof will not be repeated.

Hereinafter, operation of the row selection circuitry according to the first modification of the ninth embodiment will be described with reference to the timing chart of FIG. 35.

In normal operation, test mode enable TME is set to "L" level. Accordingly, each NOR circuit functions as an inverter for inverting row selection signal DSL. Since data write operation is conducted in the same manner as that described in connection with the timing chart of FIG. 33, description thereof will not be repeated.

In the test mode, test mode enable TME is set to "H" level at time T1. In response to this, every control signal /DSL#<0> to /DSL#<n> is set to "L" level. In response to this, transistors TR0 to TRn are turned ON in parallel, whereby each digit line DL<0> to DL<n> is electrically coupled to power supply voltage VCC. In this case, pad PD2 is in the open state.

The above structure enables the test to be conducted easily even if the structure for supplying an external power supply voltage to an external pad PD2 cannot easily be implemented due to the limitations of a test apparatus and test environments. Moreover, since the burn-in test of each digit line can be conducted in parallel, the time required for the test can be reduced.

Note that the burn-in test according to the first modification of the ninth embodiment is also applicable to the structure of the ninth embodiment.

(Second Modification of Ninth Embodiment)

Figure 36:
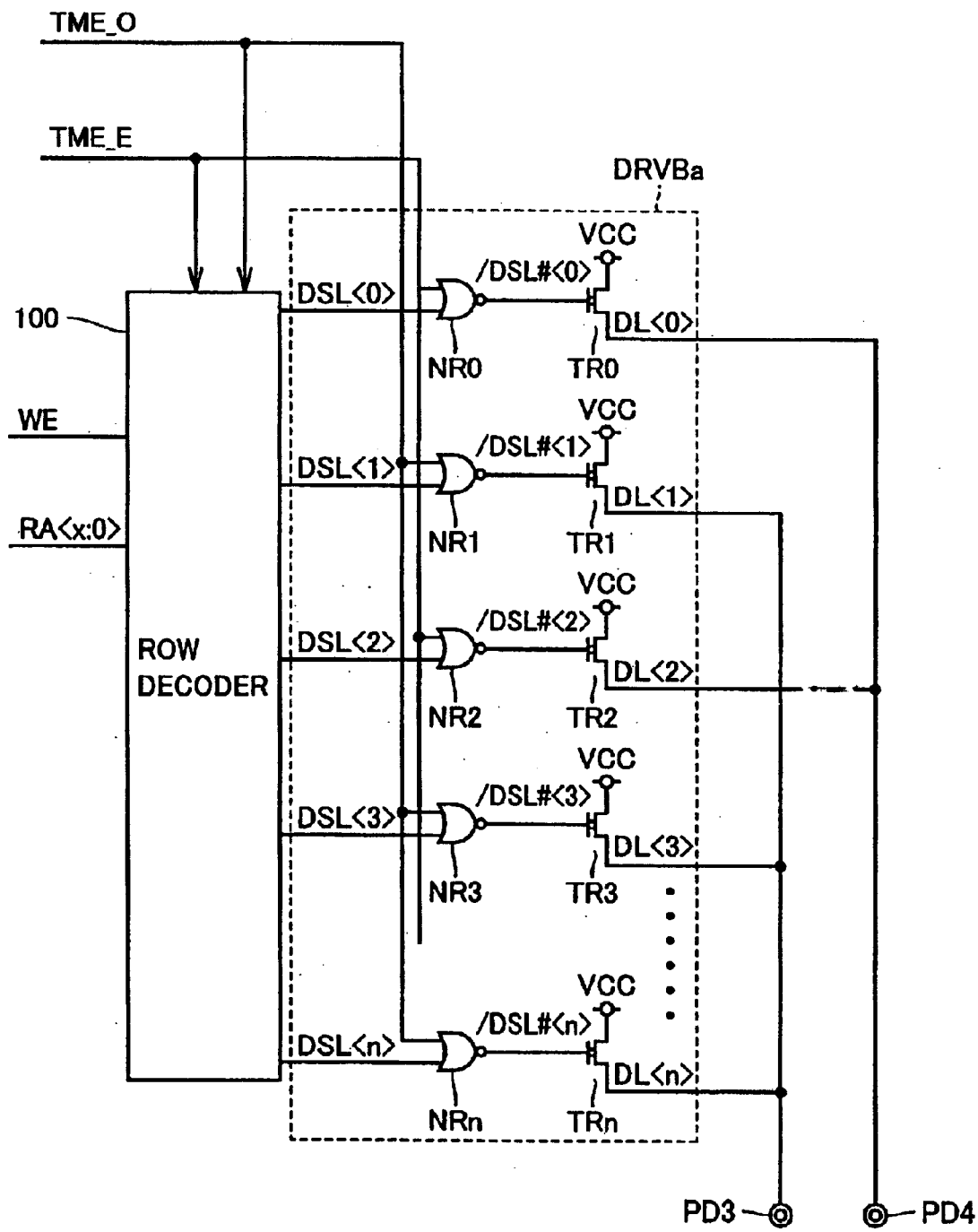
FIG. 36 is a conceptual diagram of row selection circuitry according to a second modification of the ninth embodiment of the present invention.

Referring to FIG. 36, row selection circuitry according to the second modification of the ninth embodiment is different from the row selection circuitry of FIG. 34 in that driver band DRVB# is replaced with a driver band DRVBa, and external pads PD3, PD4 are additionally provided.

The second modification of the ninth embodiment is intended to independently control digit lines of even rows and digit lines of odd rows in test operation. Driver band DRVBa is different from driver band DRVB# in that a test mode enable which is applied to NOR circuits NR0, NR2 . . . of even rows is independent of a test mode enable which is applied to NOR circuits NR1, NR3 . . . of odd rows. More specifically, NOR circuits NR0, NR2 . . . of even rows receive a test mode enable TME_E. On the other hand, NOR circuits NR1, NR3 . . . of odd rows receive a test mode enable TME_O.

The other ends of digit lines DL<0>, DL<2> . . . of even rows are electrically coupled to external pad PD4. On the other hand, the other ends of digit lines DL<1>, DL<3> . . . of odd rows are electrically coupled to external pad PD3.

Figure 37:
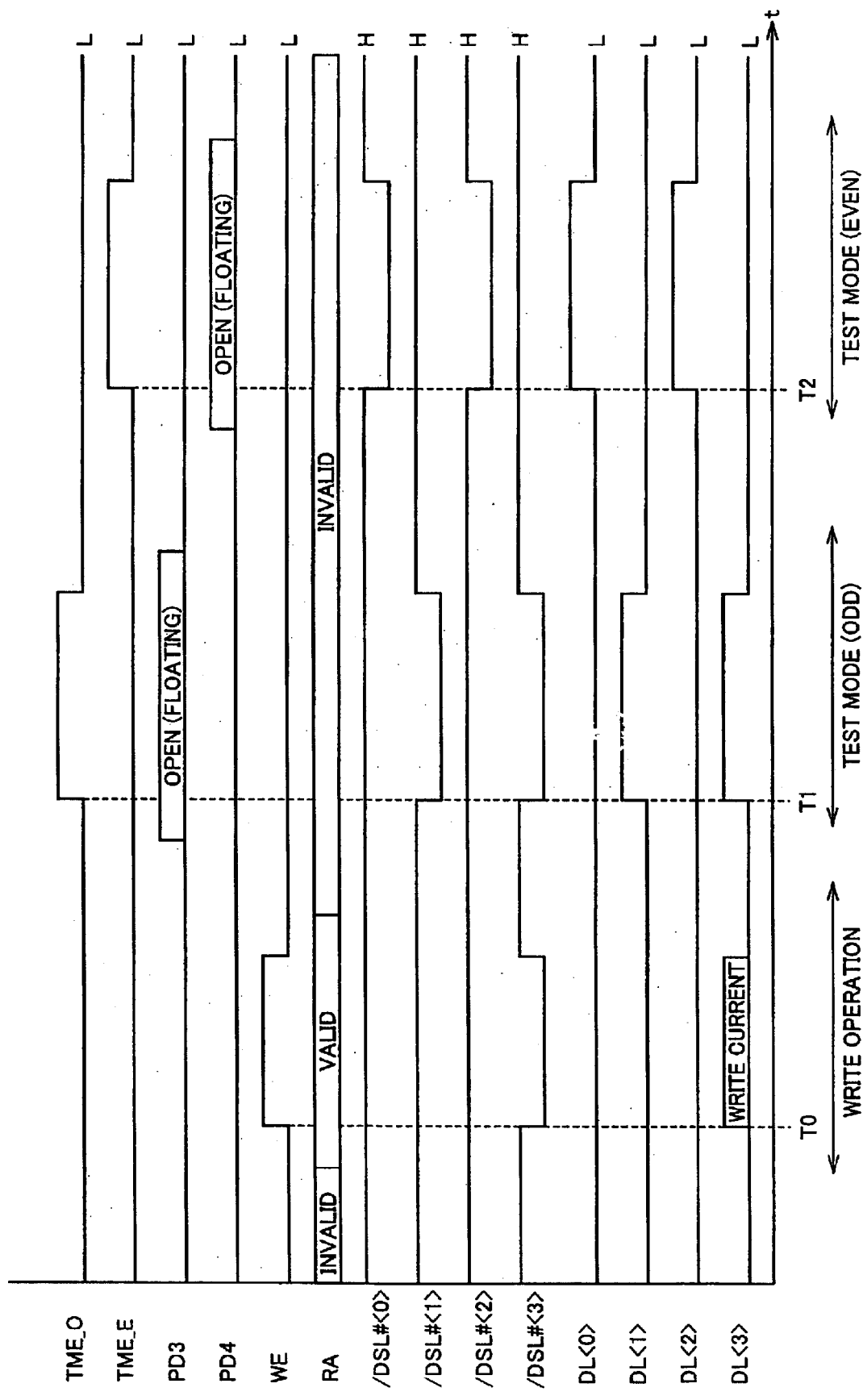
FIG. 37 is a timing chart illustration operation of the row selection circuitry according to the second modification of the ninth embodiment of the present invention.

Hereinafter, operation of the row selection circuitry according to the second modification of the ninth embodiment will be described with reference to the timing chart of FIG. 37.

Figure 35:
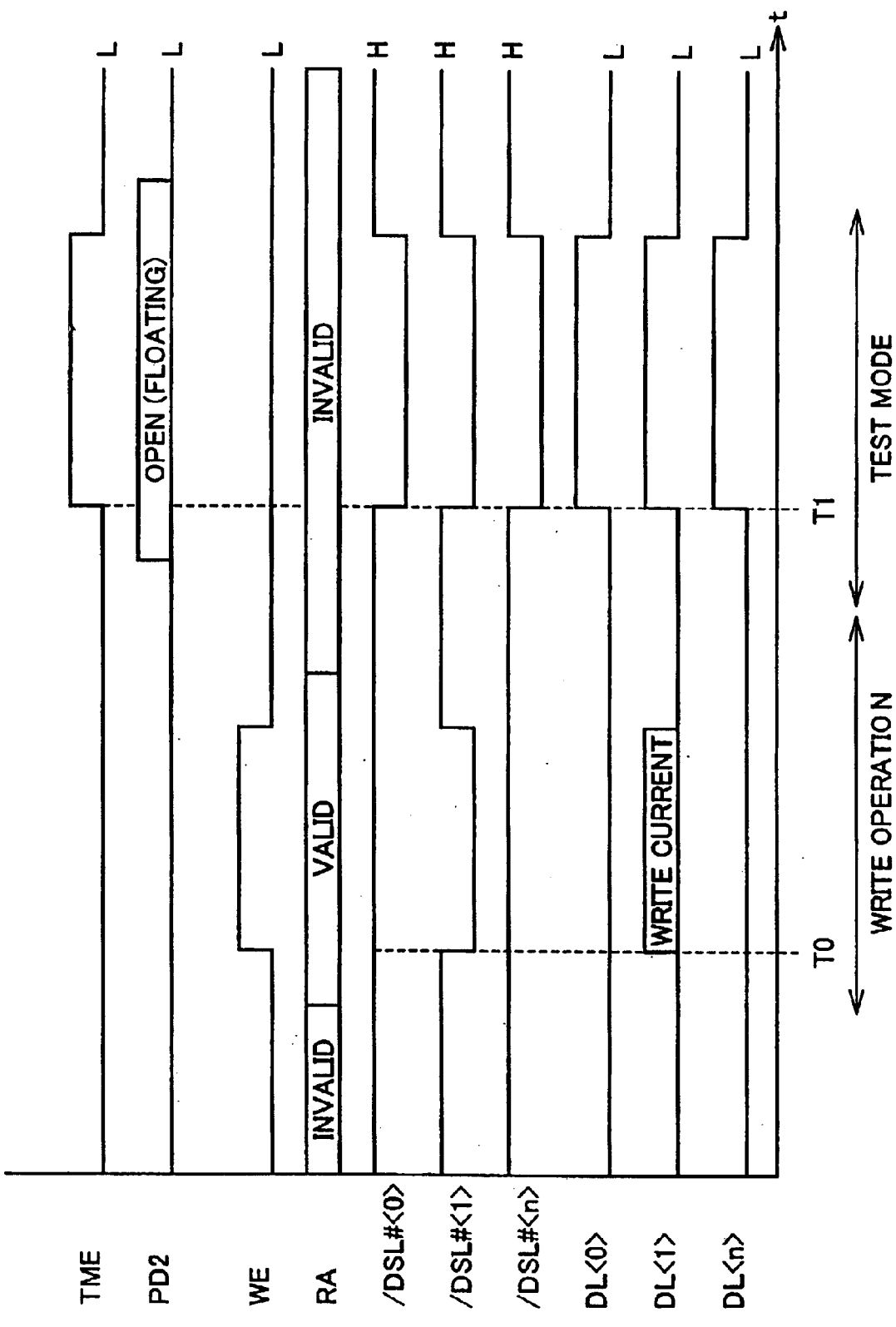
FIG. 35 is a timing chart illustration operation of the row selection circuitry according to the first modification of the ninth embodiment of the present invention.

Since data write operation is conducted in the same manner as that of the first modification of the ninth embodiment described in FIG. 35, description thereof will not be repeated.

Test operation will now be described. At time T1, test mode enable TME_O is set to "H" level. In response to this, the output signals of NOR circuits NR1, NR3 . . . of odd rows in driver band DRVBa are set to "L" level. Accordingly, transistors TR1, TR3 . . . of odd rows are turned ON, whereby digit lines DL<1>, DL<3> . . . of odd rows are electrically coupled to power supply voltage VCC. External pad PD3 is set to the open state. As a result, a voltage difference is produced between odd rows and even rows, whereby defects between digit lines DL can be detected.

Similarly, test mode enable TME_E is set to "H" level at time T2. As a result, digit lines DL<0>, DL<2> . . . of even rows are electrically coupled to power supply voltage VCC. As a result, a voltage difference is produced between odd rows and even rows, whereby process defects between digit lines DL can be detected.

(Third Modification of Ninth Embodiment)

Figure 38:
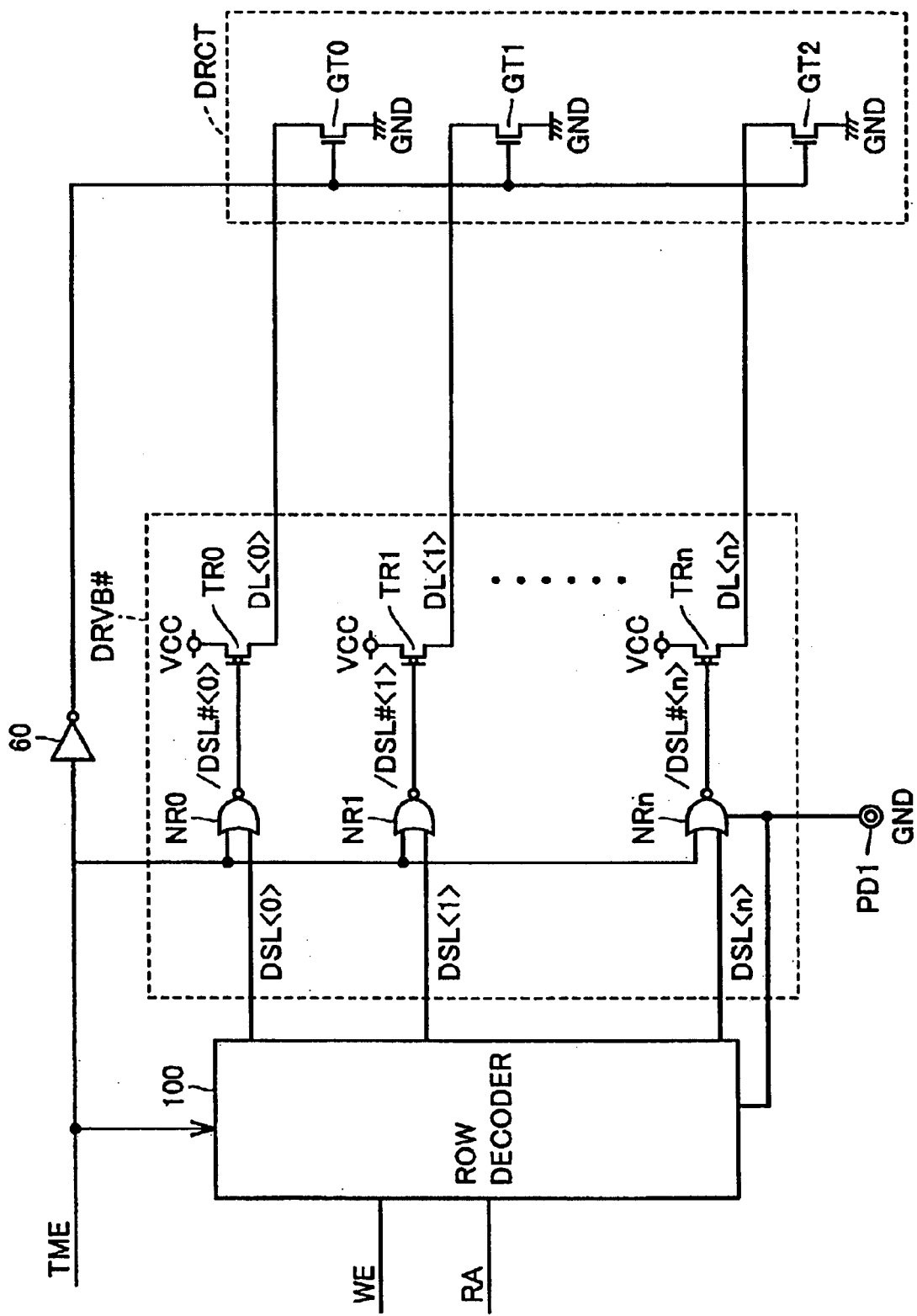
FIG. 38 is a conceptual diagram of row selection circuitry according to a third modification of the ninth embodiment of the present invention.

Referring to FIG. 38, row selection circuitry according to the third modification of the ninth embodiment is different from the row selection circuit according to the first modification of the ninth embodiment in FIG. 34 in that a connection control circuit DRCT is provided instead of external pad PD2. Connection control circuit DRCT includes transistors GT0 to GTn. Transistors GT0 to GTn are provided corresponding to digit lines DL<0> to DL<n>, and control electric connection between digit lines DL<0> to DL<n> and ground voltage GND, respectively. N-channel MOS transistors are herein exemplarily used as transistors GT0 to GTn.

Each transistor GT0 to GTn has its gate receiving an inverted signal /TME of test mode enable TME through an inverter 60.

Figure 39:
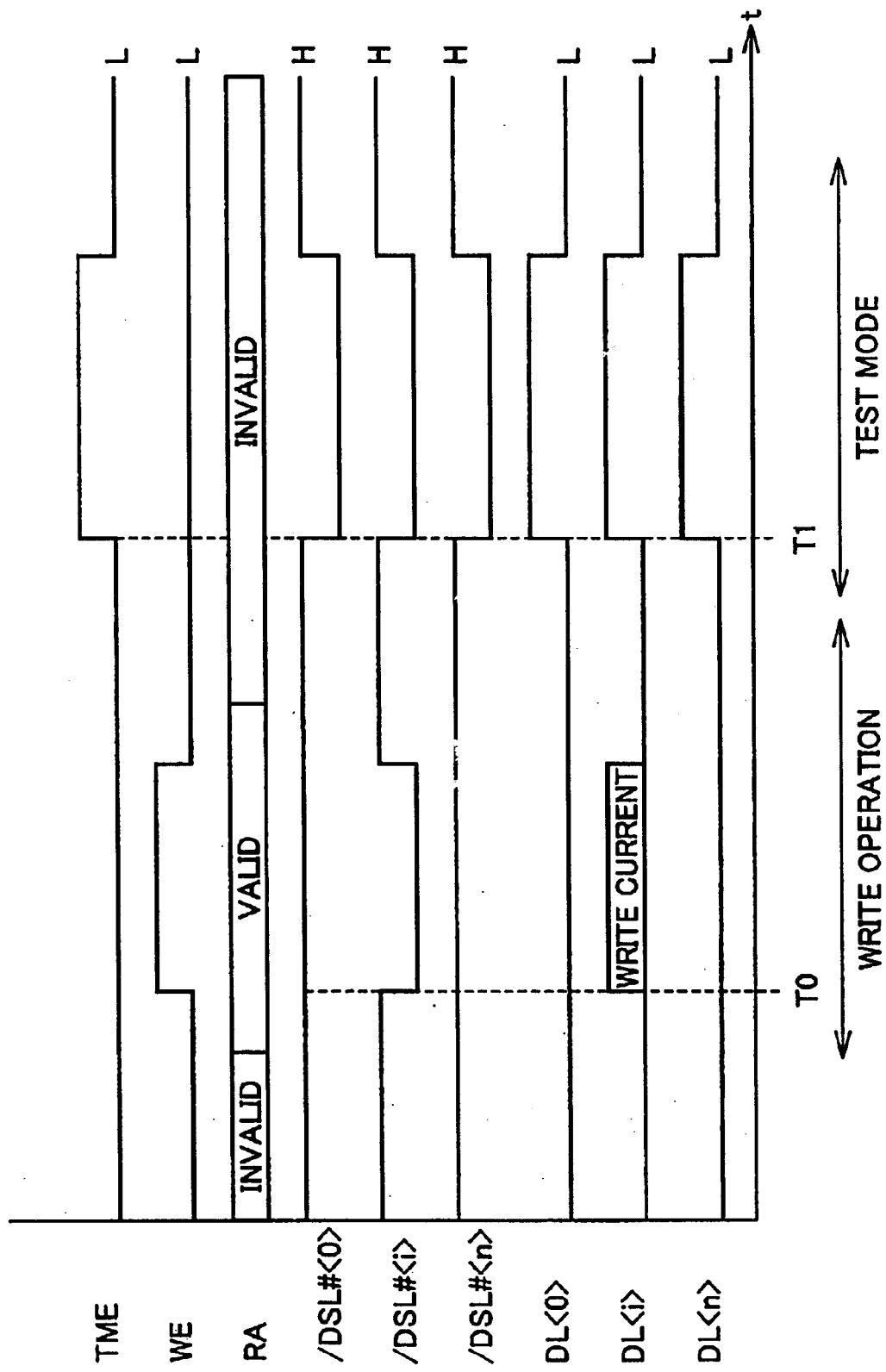
FIG. 39 is a timing chart illustration operation of the row selection circuitry according to the third modification of the ninth embodiment of the present invention.

Hereinafter, operation of the row selection circuitry according to the third modification of the ninth embodiment will be described with reference to the timing chart of FIG. 39.

Since data write operation is conducted in the same manner as described in the first modification of the ninth embodiment, description thereof will not be repeated.

In the test mode, test mode enable TME is set to "H" level at time T1. In response to this, each transistor included in driver band DRVB# is turned ON and electrically couples a corresponding digit line DL to power supply voltage VCC. On the other hand, since test mode enable TME is at "H" level, connection control circuit DRCT electrically disconnects each digit line DL from ground voltage GND in response to an inverted signal of test mode enable TME.

In this way, the burn-in test can be conducted with each digit line DL being electrically coupled to power supply voltage VCC in parallel. This enable reduction in time required for the test.

The row selection circuitry of the third modification of the ninth embodiment enables a so-called burn-in test to be conducted without using any external pad. Accordingly, the row selection circuitry of the third modification of the ninth embodiment can also be used in a device having a limitation on the number of external pads.

(Fourth Modification of Ninth Embodiment)

Figure 40:
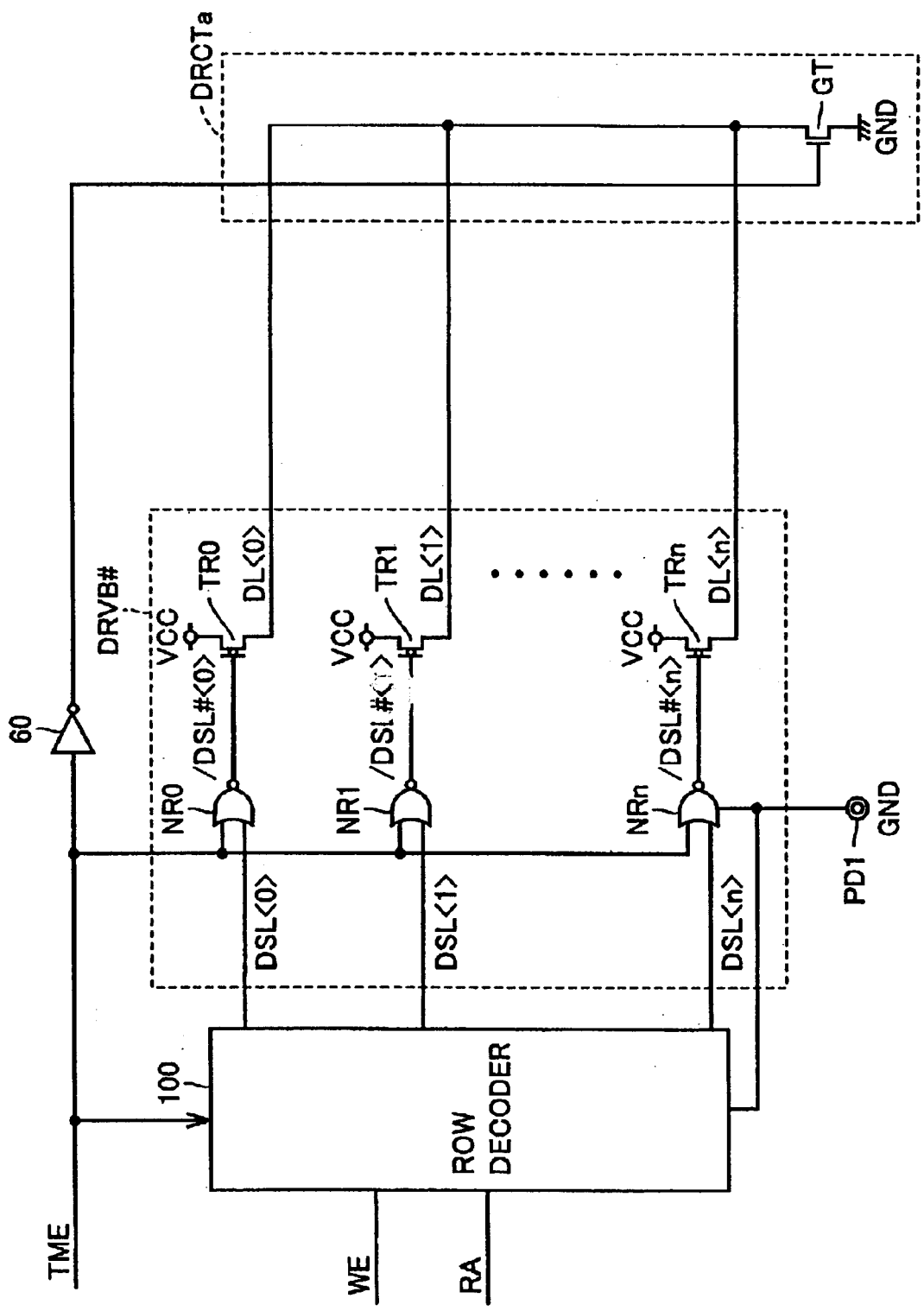
FIG. 40 is a conceptual diagram of row selection circuitry according to a fourth modification of the ninth embodiment of the present invention.

Referring to FIG. 40, row selection circuitry according to the fourth modification of the ninth embodiment is different from the row selection result of FIG. 38 in that connection control circuit DRCT is replaced with a connection control circuit DRCTa.

Connection control circuit DRCTa includes a transistor GT. Transistor GT controls electric connection between each digit line DL and ground voltage GND, and receives an inverted signal /TME of a test mode enable TME through inverter 60.

Since data write operation and test operation are conducted in the same manner as that described above, description thereof will not be repeated.

The above structure uses only one transistor for controlling connection between ground voltage GND and each digit line DL. This enables reduction in the number of elements in the circuitry.

(Fifth Modification of Ninth Embodiment)

Figure 41:
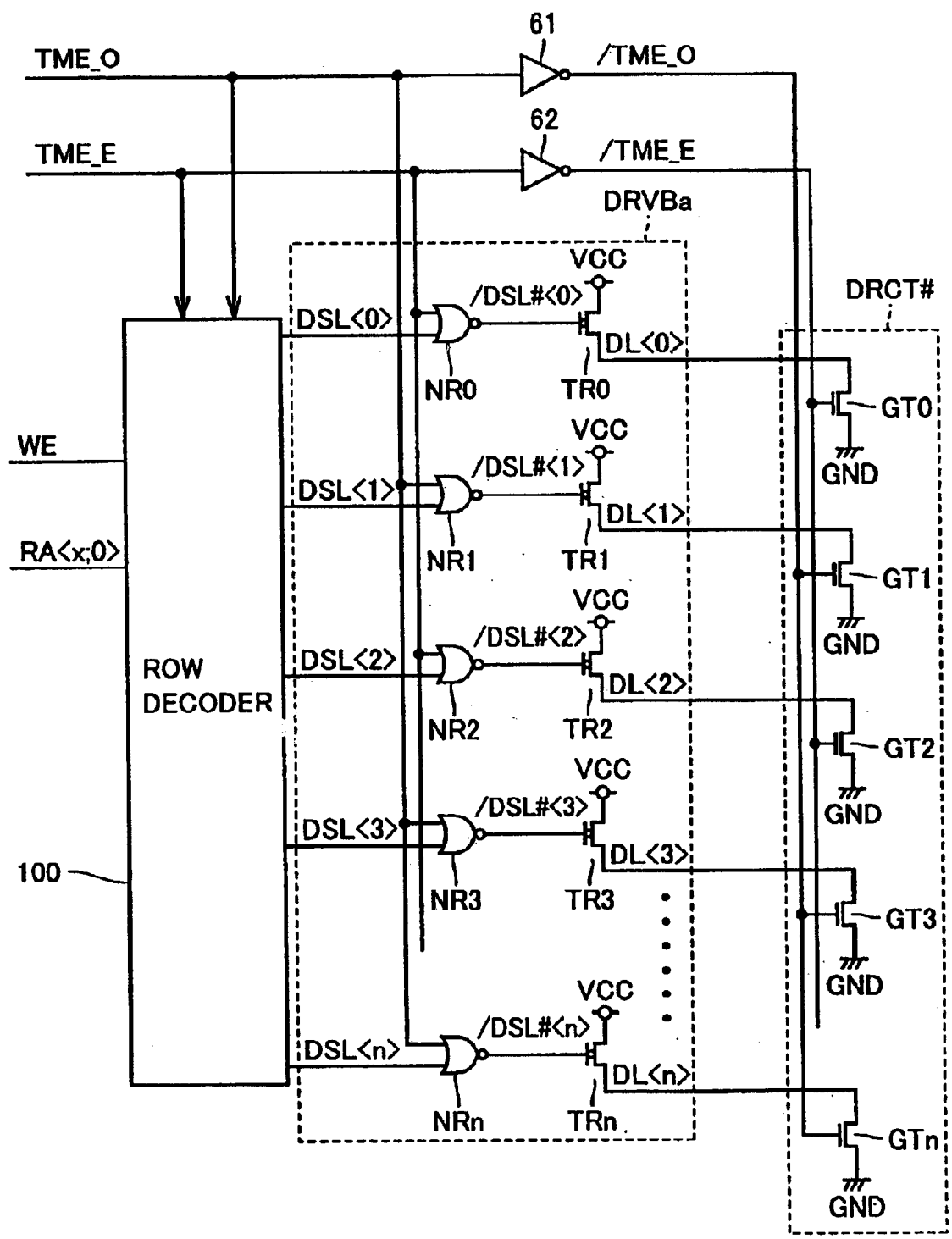
FIG. 41 is a conceptual diagram of row selection circuitry according to a fifth modification of the ninth embodiment of the present invention.

Referring to FIG. 41, row selection circuitry according to the fifth modification of the ninth embodiment is different from the row selection circuitry of FIG. 36 in that a connection control circuit DRCT# is provided instead of external pads PD3, PD4.

Connection control circuit DRCT# includes transistors GT0 to GTn. Transistors GT0 to GTn are provided corresponding to digit lines DL<0> to DL<n>. Each transistor GT0 to GTn controls connection between a corresponding digit line and ground voltage GND.

The gates of transistors GT0, GT2 . . . corresponding to digit lines DL<0>, DL<2> . . . of even rows receive an inverted signal /TME_E of a test mode enable TME_E through an inverter 62. On the other hand, the gates of transistors GT1, GT3 . . . corresponding to digit lines DL<1>, DL<3> . . . of odd rows receive an inverted signal /TME_O of a test mode enable TME_O through an inverter 61.

Figure 42:
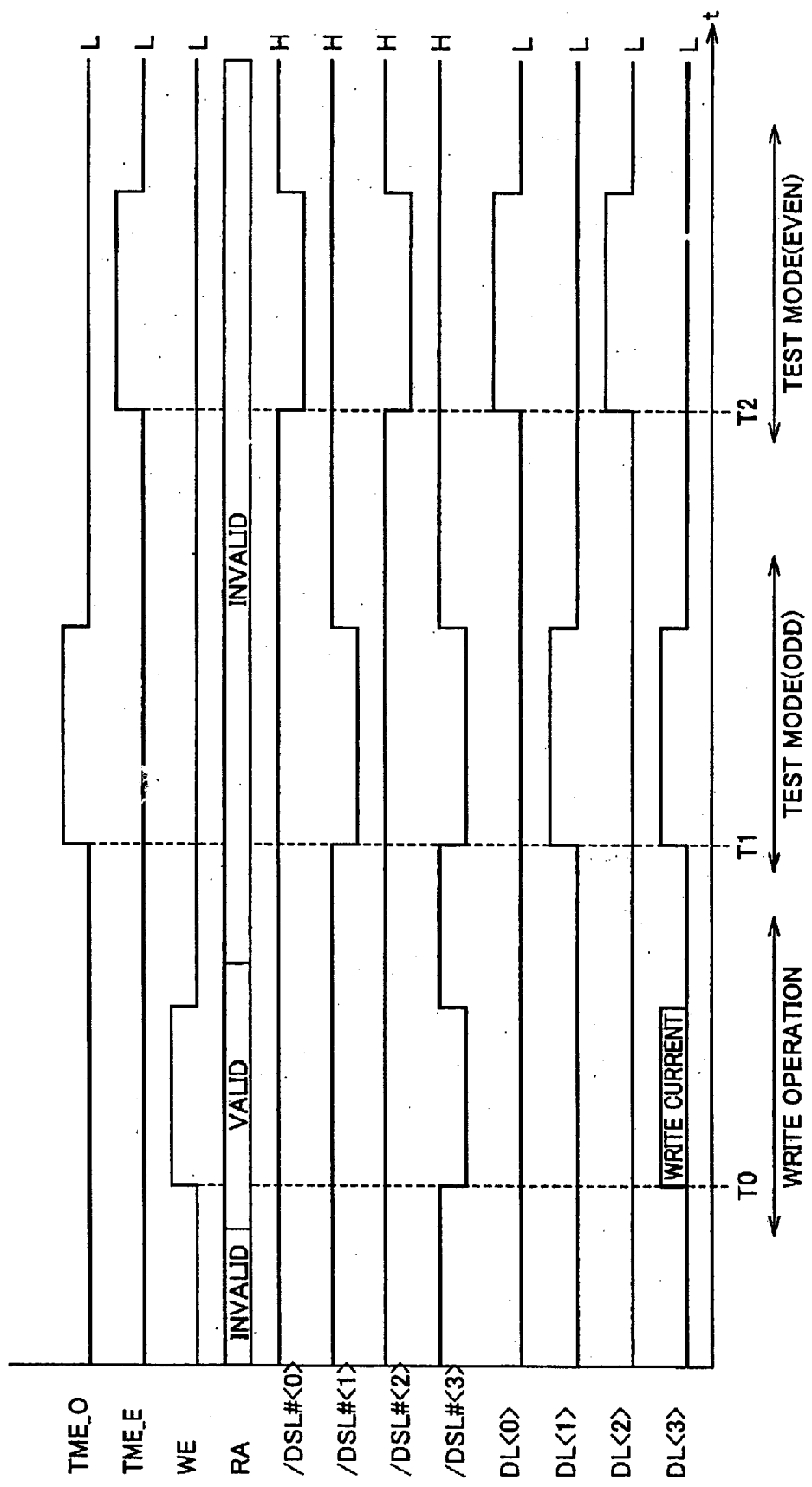
FIG. 42 is a timing chart illustration operation of the row selection circuitry according to the fifth modification of the ninth embodiment of the present invention.

Hereinafter, operation of the row selection circuitry according the fifth embodiment of the ninth embodiment will be described with reference to the timing chart of FIG. 42.

Since data write operation is conducted in the same manner as that described in the first modification of the ninth embodiment, description thereof will not be repeated.

Test operation will now be described. At time T1, test mode enable TME_O is set to "H" level. In response to this, digit lines DL of odd rows are electrically coupled to power supply voltage VCC. As a result, a voltage difference is produced between digit lines of even rows and digit lines of odd rows, whereby defects between digit lines can be detected.

At time T2, test mode enable TME_E is set to "H" level. In response to this, digit lines DL of even rows are electrically coupled to power supply voltage VCC. As a result, a voltage difference is produced between digit lines of even rows and digit lines of odd rows, whereby defects between digit lines can be detected.

The row selection circuitry of the fifth modification of the ninth embodiment enables a so-called burn-in test to be conducted without using any external pad. Therefore, the row selection circuitry of the fifth modification of the ninth embodiment can also be used in a device having a limitation on the number of external pads.

(Sixth Modification of Ninth Embodiment)

Figure 43:
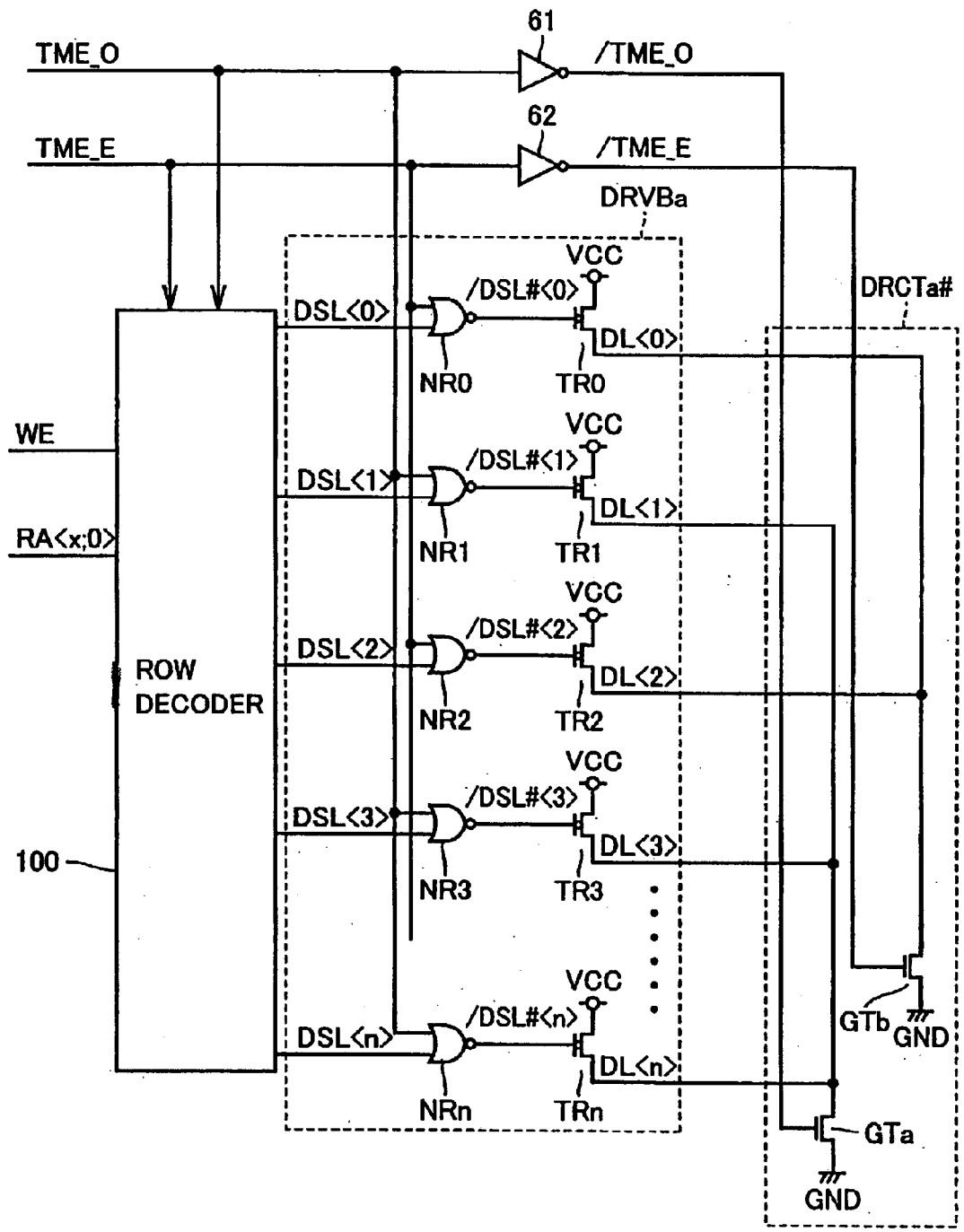
FIG. 43 is a conceptual diagram of row selection circuitry according to a sixth modification of the ninth embodiment of the present invention.
Figure 44:
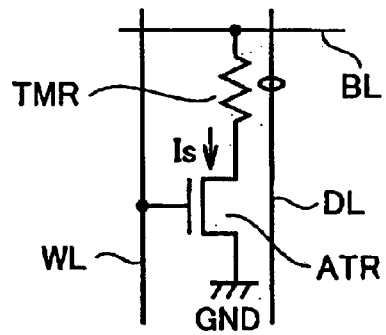
FIG. 44 schematically shows the structure of a memory cell having a magnetic tunnel junction.
Figure 45:
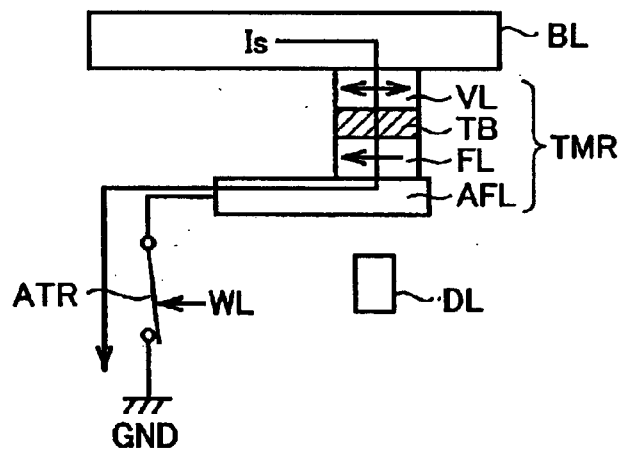
FIG. 45 is a conceptual diagram illustrating data read operation from an MTJ memory cell.
Figure 46:
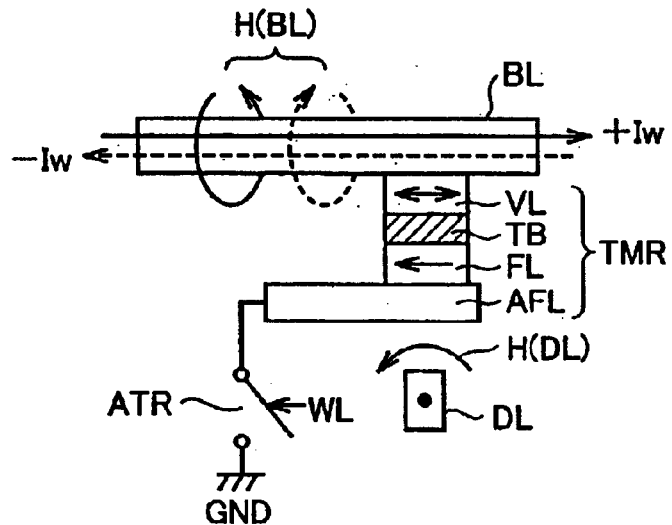
FIG. 46 is a conceptual diagram illustrating data write operation to an MTJ memory cell.

Referring to FIG. 43, row selection circuitry according to the sixth modification of the ninth embodiment is different from the row selection circuitry of FIG. 41 in that connection control circuit DRCT# is replaced with a connection control circuit DRCTa#. Connection control circuit DRCTa# includes transistors GTa, GTb.

Transistor GTa controls electric connection between the other ends of digit lines of odd rows and ground voltage GND. Transistor GTb controls electric connection between the other ends of digit lines of even rows and ground voltage GND.

Transistor GTa receives an inverted signal of a test mode enable TME_O through inverter 61, and controls connection between digit lines of odd rows and ground voltage GND. Transistor GTb receives an inverted signal of a test mode enable TME_E through inverter 62, and controls connection between digit lines of even rows and ground voltage GND.

Since normal data write operation and test operation are conducted in the same manner as that described above, description thereof will not be repeated.

The row selection circuitry according to the sixth modification of the ninth embodiment enables further reduction in the number of elements as compared to the fifth modification of the ninth embodiment.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
    a plurality of magnetic memory cells arranged in a matrix, wherein
        said plurality of magnetic memory cells being divided into N memory blocks of first to $N^{th}$ stages along a row direction so that said N memory blocks share memory cell rows (where N is a natural number), said thin film magnetic memory device further comprising in each of said memory blocks:
    a plurality of digit lines provided corresponding to the memory cell rows, respectively, for selectively supplying a data write current for generating a data write magnetic field to the magnetic memory cell selected for data write operation;
    a plurality of first driver units provided corresponding to said plurality of digit lines, respectively, and each controlling connection between one end of the corresponding digit line and a first voltage; and
    a plurality of second driver units provided corresponding to said plurality of digit lines, respectively, and each controlling connection between another end of said corresponding digit line and a second voltage, wherein
        in said data write operation, each of said first driver units corresponding to the memory block of the first stage connects said one end of the corresponding digit line to said first voltage according to a row selection result,
        in said data write operation, each of said second driver units corresponding to the memory block of the $I^{th}$ stage including the selected magnetic memory cell (where I is a natural number satisfying I≦N) connects said another end of the corresponding digit line to said second voltage according to a selection result of said N memory blocks,
        when I≧2 in said data write operation, each of said first driver units corresponding to each of the memory blocks of the second to $I^{th}$ stages connects said one end of the corresponding digit line to said first voltage according to a voltage level on the digit line of the same memory cell row in the memory block of a previous stage, and
        when I≧2 in said data write operation, each of said second driver units corresponding to each of the memory blocks of the first to $(I-1)^{th}$ stages disconnects said another end of the corresponding digit line from said second voltage according to said selection result of said N memory blocks.

2. The thin film magnetic memory device according to claim 1, wherein in said data write operation, each of said second driver units corresponding to each of said memory blocks of $(I+1)^{th}$ to $N^{th}$ stages connects said another end of the corresponding digit line to said second voltage.

3. The thin film magnetic memory device according to claim 1, wherein
    said first voltage is higher than said second voltage, and in each of said memory blocks,
    each of said first driver units includes a P-channel field effect transistor which is electrically coupled between said first voltage and said one end of said corresponding digit line, and
    each of said second driver units includes an N-channel field effect transistor which is electrically coupled between said second voltage and said another end of said corresponding digit line.

4. The thin film magnetic memory device according to claim 1, wherein
    said second voltage is higher than said first voltage, and in each of said memory blocks,
    each of said first driver units includes an N-channel field effect transistor which is electrically coupled between said first voltage and said one end of said corresponding digit line, and
    each of said second driver units includes a P-channel field effect transistor which is electrically coupled between said second voltage and said another end of said corresponding digit line.

5. The thin film magnetic memory device according to claim 1, further comprising in each of said memory blocks:
    a plurality of word lines provided corresponding to said memory cell rows, respectively, for conducting row selection in data read operation; and
    a plurality of word line drivers provided corresponding to said plurality of word lines, respectively, and each activating the corresponding word line, wherein
        when said memory block of the $I^{th}$ stage includes the magnetic memory cell selected for said data read operation (where I is a natural number satisfying I≦N), each of said first driver units corresponding to said memory block of first stage connects said one end of the corresponding digit line to said first voltage according to said row selection result, and each of said first driver units corresponding to each of said memory blocks of second to $I^{th}$ stages connects said one end of the corresponding digit line to said first voltage according to a voltage level on the digit line of the same memory cell row in the memory block of a previous stage, and
        in said data read operation, each of said word line drivers corresponding to said memory block of first stage activates the corresponding word line according to said row selection result, and each of said word line drivers corresponding to each of said memory blocks of second to $I^{th}$ stages activates the corresponding word line according to a voltage level on the digit line of the same memory cell row in the memory block of a previous stage.

6. The thin film magnetic memory device according to claim 5, wherein
    each of said first driver units corresponding to each of said memory blocks further includes first and second driver transistors provided in parallel for connecting the corresponding digit line to said first voltage,
    in said data write operation, said first voltage is connected to said digit line by said first driver transistor,
    in said data read operation, said first voltage is connected to said digit line by said second driver transistor, and
    said first driver transistor has higher current driving capability than that of said second driver transistor.

7. The thin film magnetic memory device according to claim 5, wherein
    each of said word lines further has a plurality of divided word lines of the corresponding word line,
    said thin film magnetic memory device further comprising in each of said memory blocks:
        a plurality of divided-word-line drivers provided corresponding said plurality of divided word lines, respectively, in each of said memory blocks, and each activating the corresponding divided word line, wherein
            in said data read operation, each of said divided-word-line drivers activates said corresponding divided word line based on a voltage level of the digit line of the same row.

8. The thin film magnetic memory device according to claim 1, further comprising in each of said memory blocks:
    a plurality of word lines provided corresponding to said memory cell rows, respectively, for conducting row selection in data read operation; and a plurality of word line drivers provided corresponding to said plurality of word lines, respectively, and each activating the corresponding word line, wherein when said memory block of first stage includes the magnetic memory cell selected for said data read operation, each of said word line drivers corresponding to said memory block of first stage activates the corresponding word line according to said row selection result and said memory block selection result, when said memory block of $I^{th}$ stage includes the magnetic memory cell selected for said data read operation (where I is a natural number satisfying $2 \leq I \leq N$), each of said first driver units corresponding to said memory block of first stage connects said one end of the corresponding digit line to said first voltage according to said row selection result, and each of said first driver units corresponding to each of said memory blocks of second to $(I-1)^{th}$ stages connects said one end of the corresponding digit line to said first voltage according to a voltage level on the digit line of the same memory cell row in the memory block of a previous stage, and each of said word line drivers corresponding to said memory block of $I^{th}$ stage activates the corresponding word line according to a voltage level on the digit line of said same memory cell row in the memory block of a previous stage and said block selection signal.

9. The thin film magnetic memory device according to claim 1, wherein in test operation, each of said first driver units in each of said N memory blocks electrically connect said corresponding digit line to said first voltage higher than said second voltage.

10. The thin film magnetic memory device according to claim 1, wherein in test operation, said plurality of first driver units in each of said N memory blocks are divided into a first group corresponding to even rows and a second group corresponding to odd rows, respectively, each of said first driver units in said first group electrically connects said corresponding digit line to said first voltage higher than said second voltage in response to a first test signal, and each of said first driver units in said second group electrically connects said corresponding digit line to said first voltage higher than said second voltage in response to a second test signal.

11. A thin film magnetic memory device, comprising:

a plurality of magnetic memory cells arranged in a matrix;

a plurality of digit lines provided corresponding to the memory cell rows, respectively, for selectively supplying a data write current for generating a data write magnetic field to the magnetic memory cell selected for data write operation;

a plurality of first driver units provided corresponding to said plurality of digit lines, respectively, and each controlling connection between one end of the corresponding digit line and a first voltage;

a plurality of second driver units provided corresponding to said plurality of digit lines, respectively, and each controlling connection between another end of said corresponding digit line and a second voltage;

a plurality of word lines provided corresponding to said memory cell rows; and a plurality of driving sections provided corresponding to said plurality of word lines, respectively, and each activating the corresponding word line according to a voltage level of the digit line of the same row, wherein in said data write operation, each of said first driver units connects said one end of said corresponding digit line to said first voltage according to a row selection result, and each of said second driver units connects said another end of said corresponding digit line to said second voltage, and in said data read operation, each of said first driver units connects said one end of said corresponding digit line to said first voltage according to a row selection result, and each of said second driver units disconnects said another end of said corresponding digit line from said second voltage.

12. The thin film magnetic memory device according to claim 11, wherein each of said driving sections has a wiring for electrically coupling said corresponding digit line to said corresponding word line.

13. The thin film magnetic memory device according to claim 11, wherein each of said driving sections has a logic gate for activating said corresponding word line in response to a voltage level on said corresponding digit line and a signal which is activated in said data read operation.

14. The thin film magnetic memory device according to claim 11, wherein driving capability of each of said first driver units to drive said corresponding digit line to said first voltage is different between said data read operation and said data write operation.

15. The thin film magnetic memory device according to claim 14, wherein each of said first driver units includes first and second driver transistors connected in parallel between said one end of said corresponding digit line and said first voltage, in said data write operation, said first driver transistor connects said first voltage to said corresponding digit line according to said row selection result, and said second driver transistor connects said first voltage to said corresponding digit line according to said row selection result and a write activation signal which is activated in said data write operation, and in said data read operation, said first driver transistor connects said first voltage to said corresponding digit line according to said row selection result, and said second driver transistor disconnects said first voltage from said corresponding digit line according to said write activation signal which is inactivated in said data read operation.

16. The thin film magnetic memory device according to claim 14, wherein each of said first driver units includes first and second driver transistors connected in parallel between said one end of said corresponding digit line and said first voltage, in said data write operation, said first driver transistor connects said first voltage to said corresponding digit line according to said row selection result, and in said data read operation, said second driver transistor connects said first voltage to said corresponding digit line according to said row selection result in a manner complementary to that of said first driver transistor.

17. A thin film magnetic memory device, comprising:

a plurality of magnetic memory cells arranged in a matrix;

a plurality of digit lines provided corresponding to the memory cell rows, respectively, for selectively supplying a first data write current to the magnetic memory cell selected for data write operation;

a plurality of bit lines provided corresponding to the memory cell columns, respectively, for selectively supplying a second data write current to said magnetic memory cell selected for said data write operation; and a plurality of current supply circuits provided corresponding to said plurality of digit lines, respectively, and each controlling supply of said first data write current to the corresponding digit line, wherein in said data write operation, each of said current supply circuits supplies said first data write current to said corresponding digit line according to a row selection result, in test operation, each of said current supply circuits supplies said first data write current which is smaller than that supplied in said data write operation, and in said test operation, at least one of said plurality of bit lines receives said second data write current.

18. The thin film magnetic memory device according to claim 17, wherein each of said current supply circuits includes a first driver transistor for controlling connection between a first voltage and one end of said corresponding digit line, a second driver transistor provided in parallel with said first driver transistor, for controlling connection between said first voltage and said one end of said corresponding digit line, and a third driver transistor for connecting a second voltage to another end of said corresponding digit line in said data write operation and said test operation, in said data write operation, said first driver transistor connects said first voltage to said one end of said corresponding digit line according to said row selection result, in said test operation, said second driver transistor connects said first voltage to said one end of said corresponding digit line according to a test signal, and said second driver transistor has lower current driving capability than that of said first driver transistor.

19. The thin film magnetic memory device according to claim 17, wherein each of said current supply circuits includes a first driver transistor for controlling connection between a first voltage and said one end of said corresponding digit line, a second driver transistor provided in parallel with said first driver transistor, for controlling connection between a third voltage and said one end of said corresponding digit line, and a third driver transistor for connecting a second voltage to said another end of said corresponding digit line in said data write operation and said test operation, in said data write operation, said first driver transistor connects said first voltage to said corresponding digit line according to said row selection result, and in said test operation, said second driver transistor connects said third voltage to said corresponding digit line according to a test signal.

20. The thin film magnetic memory device according to claim 19, further comprising:

an external pad for applying a voltage which is adjustable from outside, wherein said third voltage corresponds to said voltage applied to said external pad.

* * * * *

UNITED STATES PATENT AND TRADEMARK OFFICE
CERTIFICATE OF CORRECTION

PATENT NO.        : 6,747,910 B2
APPLICATION NO. : 10/334713
DATED             : June 8, 2004
INVENTOR(S)       : Takaharu Tsuji It is certified that error appears in the above-identified patent and that said Letters Patent is hereby corrected as shown below:

Column 6, Line 54, change "in data write current" to -- in data write operation --

Column 13, Line 45, change "DWR0" to -- DWDRO --

Column 14, Line 35, change " NDK " to -- NADk --

Column 14, Line 36, change "PTk " to -- PTTk --

Column 22, Line 40, change " DL <x> to DL <x> " to -- DL<0> to DL<0> --

Column 27, Line 33, change " result " to -- circuitry --

Column 28, Line 2, change both " embodiment " to -- modification --

Signed and Sealed this

Fifteenth Day of May, 2007

JON W. DUDAS
*Director of the United States Patent and Trademark Office*